(12) United States Patent
You et al.

(10) Patent No.: US 7,675,065 B2
(45) Date of Patent: Mar. 9, 2010

(54) THIN FILM TRANSISTOR PANEL AND MANUFACTURING METHOD THEREOF

(75) Inventors: Chun-Gi You, Hwaseong-si (KR); Bong-Ju Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 151 days.

(21) Appl. No.: 11/671,727

(22) Filed: Feb. 6, 2007

(65) Prior Publication Data
US 2007/0184587 A1 Aug. 9, 2007

(30) Foreign Application Priority Data

| Feb. 7, 2006 | (KR) | 10-2006-0011459 |
| Feb. 27, 2006 | (KR) | 10-2006-0018853 |
| Jun. 15, 2006 | (KR) | 10-2006-0053883 |

(51) Int. Cl.
*H01L 31/00* (2006.01)
(52) U.S. Cl. ............ 257/59; 257/72; 257/E33.001
(58) Field of Classification Search ............ 257/59, 257/66, 72, E33.001
See application file for complete search history.

(56) References Cited

U.S. PATENT DOCUMENTS 7,560,316 B2 * 7/2009 Heo et al. ............ 438/149

* cited by examiner

*Primary Examiner*—Jack Chen
(74) *Attorney, Agent, or Firm*—F. Chau & Associates, LLC

(57) ABSTRACT

A thin film transistor (TFT) array panel includes a substrate, a first signal line formed on the substrate, a gate insulating layer formed on the first signal line and having a first contact hole exposing a portion of the first signal line, a first semiconductor formed on the gate insulating layer, a second signal line formed on the first semiconductor and the gate insulating layer and a drain electrode formed on the first semiconductor and separated from the second signal line. The TFT array panel further includes a conductor formed on the gate insulating layer and connected to the first signal line through the first contact hole, a passivation layer formed on the second signal line, the drain electrode, and the conductor, and having a second contact hole exposing the drain electrode and a pixel electrode formed on the passivation layer and connected to the drain electrode through the second contact hole.

17 Claims, 59 Drawing Sheets

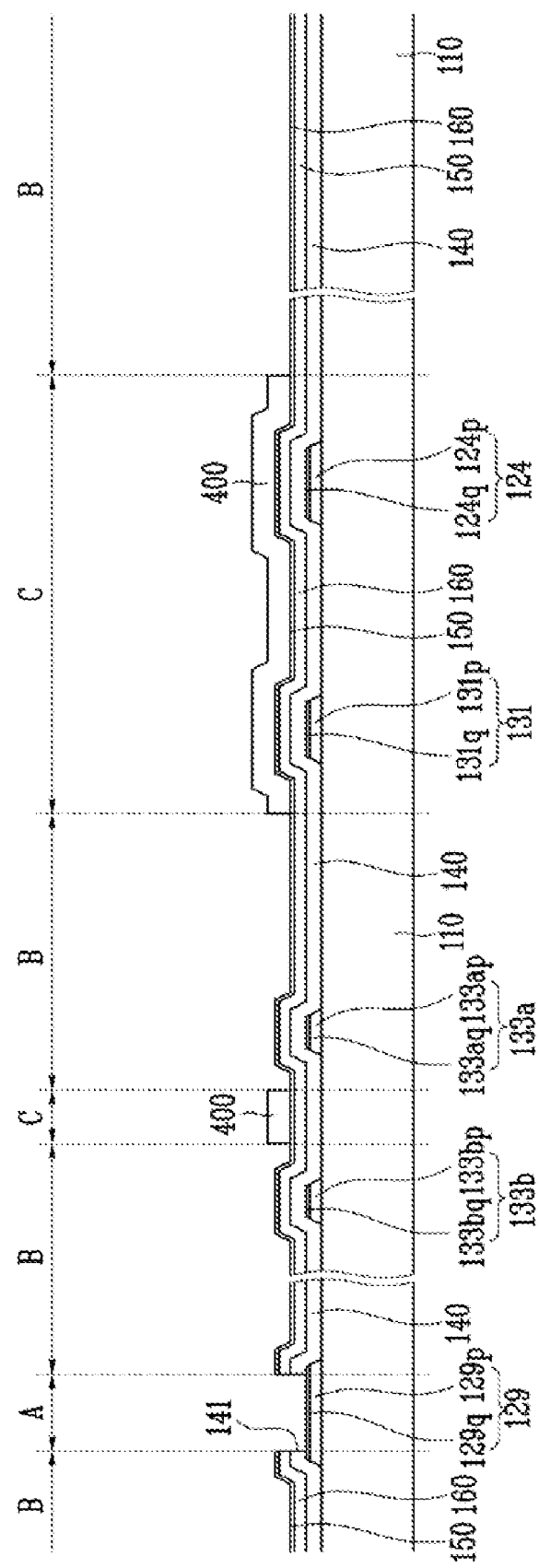

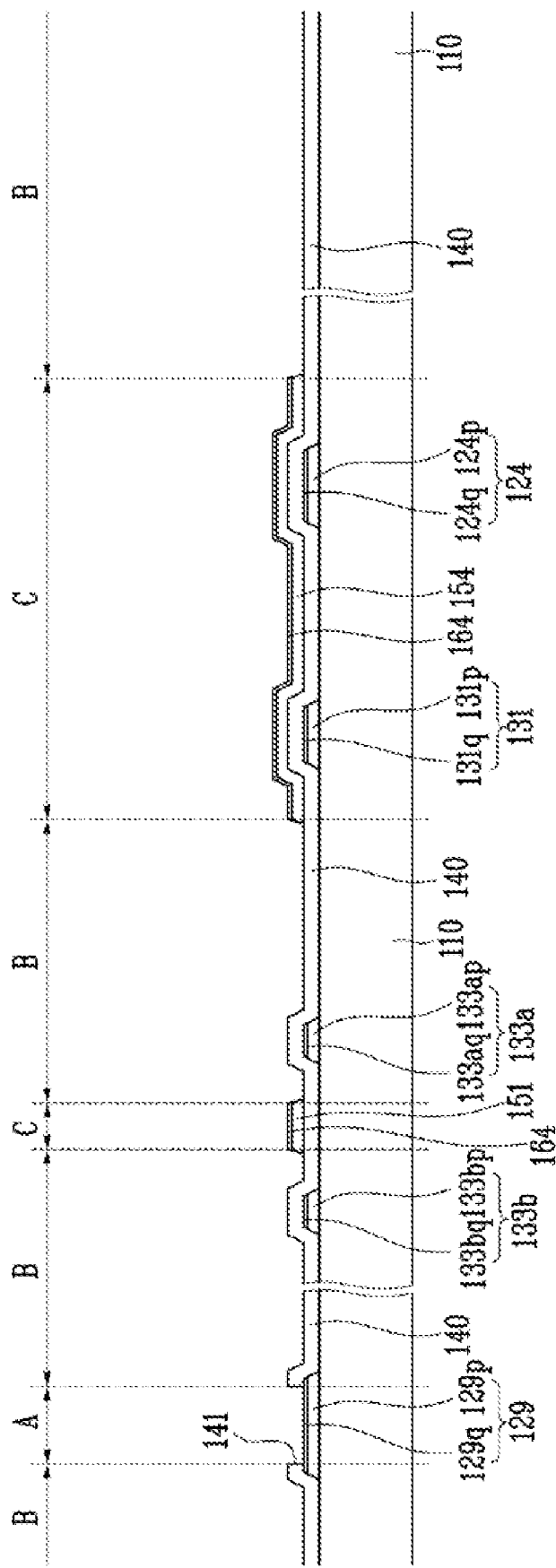

THIN FILM TRANSISTOR PANEL AND MANUFACTURING METHOD THEREOF

CROSS-REFERENCE TO RELATED APPLICATION

This application claims priority to Korean Patent Application No. 10-2006-0011459, filed on Feb. 7, 2006, Korean Patent Application No. 10-2006-0018853 filed on Feb. 27, 2006, and Korean Patent Application No. 10-2006-0053883 filed on Jun. 15, 2006, the entire contents of which are hereby incorporated by reference herein.

BACKGROUND OF THE INVENTION (a) Technical Field

The present disclosure relates to a thin film transistor array panel for a liquid crystal display and to a manufacturing method thereof.

(b) Description of the Related Art

A liquid crystal display (LCD) typically includes a pair of display panels having field generating electrodes, polarizers and a liquid crystal layer interposed between the two display panels. A field-generating electrode generates an electric field on the liquid crystal layer. Furthermore, as the intensity of the electric field changes, the arrangement of liquid crystal molecules varies as well. For example, when an electric field is generated, liquid crystal molecules of a liquid crystal layer change their arrangement to thereby also change the polarization of light passing through the liquid crystal layer. In addition, the polarizer of the LCD blocks or transmits the polarized light appropriately to make bright and dark regions, thereby causing desired images to be displayed.

The LCD includes, for example, a display panel which includes a plurality of pixels having switching elements, a plurality of display signal lines, and a gate driver having a plurality of stages transmitting gate signals to gate lines of the display signal lines to turn on/off the switching elements of the pixels.

Each stage of the gate driver is connected to one of the signal lines. The stages receive gate on/off voltages clock signals and transmit the inputted gate on/off voltages and clock signals to the signal line connected thereto.

The gate driver may be integrated with the substrate, and then the gate lines may extend to be connected to the gate driver directly. In this situation to connect the gate wires of the gate driver and the data wires of the gate driver, a contact hole exposing the gate wire is formed, and then the data wire is contacted to the data wire through the contact hole using a connecting member made of, for example, indium tin oxide (ITO).

Alternatively, if the gate driver is formed outside of the substrate, pad portions, which connect the gate on/off signal lines to the stages of the gate driver, are used for transmitting the gate on/off voltage to the stages of the gate driver. In this case, to connect the pad portions to the signal lines, contact holes exposing the signal lines are formed, and then the signal lines are contacted to the stages of the gate driver through the contact holes using a connecting member made of, for example, ITO.

Furthermore, as the lengths of the signal lines increase along with the size of the LCD, the resistance of the signal lines increases as well. Consequently, a signal delay or a voltage drop occurs due to the increased resistance of the signal lines. Thus, wiring made of a material having low resistivity, such as, for example aluminum (Al), should be utilized for the signal lines.

For example, when aluminum (Al) is used in wiring, signal lines may have a multi-layered structure including an Al layer and another layer.

However, if the signal lines including Al are contacted to ITO used in pixel electrodes or connecting members of an LCD directly, then Al may be oxidized or corroded.

SUMMARY OF THE INVENTION

In accordance with an exemplary embodiment of the present invention, a thin film transistor (TFT) array panel is provided. The TFT array panel includes a substrate, a first signal line formed on the substrate, a gate insulating layer formed on the first signal line and having a first contact hole exposing a portion of the first signal line, a first semiconductor formed on the gate insulating layer, a second signal line formed on the first semiconductor and the gate insulating layer and a drain electrode formed on the first semiconductor and separated from the second signal line. The TFT array panel further includes a conductor formed on the gate insulating layer and connected to the first signal line through the first contact hole, a passivation layer formed on the second signal line, the drain electrode, and the conductor, and having a second contact hole exposing the drain electrode and a pixel electrode formed on the passivation layer and connected to the drain electrode through the second contact hole.

The passivation layer may further include a third contact hole exposing a portion of the conductor, and the TFT array panel may further include contact assistants connected to the conductor through the third contact hole. The first signal line may include a gate electrode located under the first semiconductor.

The TFT array panel may further include a third signal line formed under the gate insulating layer and including a gate electrode located under the first semiconductor, and a gate driving circuit connected to the conductor and the third signal line.

The TFT array panel may further include a second semiconductor formed between the exposed portion of the first signal line and the conductor. The second semiconductor may have a fourth contact hole aligned with the first contact hole, and the conductor may be connected to the first signal line through the first contact hole and the fourth contact hole.

The second semiconductor may have substantially the same planer shape as the conductor except the fourth contact hole.

The first semiconductor may extend toward the second signal line and the drain electrode, and may have substantially the same planer shape as the underlying first semiconductor.

The TFT array panel may further include a storage electrode made of the same layer as the first signal line and overlapping the pixel electrode, and a third semiconductor formed on the storage electrode located on the gate insulating layer.

The first signal line may include a first conductive layer made of aluminum (Al) or an aluminum (Al) alloy.

The first signal line may further include a second conductive layer located under the first conductive layer, which includes chromium (Cr), molybdenum (Mo), a chromium (Cr) alloy, or a molybdenum (Mo) alloy.

The first conductive layer may be eliminated at the exposed portion of the first signal line through the first contact hole.

The first contact hole may expose the boundary of the first signal line.

In accordance with an exemplary embodiment of the present invention, a manufacturing method of a TFT array panel is provided. The method includes forming a first signal line on a substrate, depositing a gate insulating layer on the first signal line, depositing an intrinsic amorphous silicon (a-Si) layer on the gate insulating layer, depositing an extrinsic amorphous silicon (a-Si) layer on the intrinsic amorphous silicon layer, forming a photoresist film having a position-dependent thickness and exposing first portions of the extrinsic a-Si layer, on the extrinsic a-Si layer and forming an extrinsic semiconductor and an intrinsic semiconductor as well as a first contact hole exposing a portion of the first signal line simultaneously by patterning the extrinsic a-Si layer, the intrinsic a-Si layer, and the gate insulating layer using the photoresist film as a mask. The method further includes forming a second signal line and a drain electrode on the extrinsic semiconductor and a conductor connected to the first signal line through the first contact hole, simultaneously, forming a passivation layer having a second contact hole exposing a portion of the drain electrode on the data line, the drain electrode, and the conductor and forming a pixel electrode connected to the drain electrode through the second contact hole on the passivation layer.

The forming of the extrinsic semiconductor, the intrinsic semiconductor, and the first contact hole may include etching the first portion of the extrinsic a-Si layer, the underlying intrinsic a-Si layer, and the underlying gate insulating layer using the photoresist film as a mask, making the photoresist film thin to expose a second portion of the extrinsic a-Si layer, eliminating the second portion of the extrinsic a-Si layer, the underlying intrinsic a-Si layer, and the underlying gate insulating layer and eliminating the remaining photoresist film.

The forming of the photoresist film may include coating a photoresist, and exposing the photoresist to light through a mask having light transmitting transparent areas, translucent areas, and light blocking opaque areas. The light transmitting transparent areas may correspond to the first portion of the extrinsic a-Si layer and the translucent areas may correspond to the second portion of the extrinsic a-Si layer.

The first contact hole may be located under the first portion of the extrinsic a-Si layer.

The first signal line may include a first conductive layer made of aluminum (Al) or an aluminum (As) alloy.

The first signal line may further include a second conductive layer located under the first conductive layer which includes chromium (Cr), molybdenum (Mo), a chromium (Cr) alloy, or a molybdenum (Mo) alloy, and the method may further include eliminating the exposed portion of the first conductive layer after forming the first contact hole.

The passivation layer may further have a third contact hole exposing a portion of the conductor, and the forming the pixel electrode may include forming contact assistants connected to the conductor through the third contact hole.

In accordance with an exemplary embodiment of the present invention, a manufacturing method of a TFT array panel is provided. The method includes forming a first signal line on a substrate, depositing a gate insulating layer on the first signal line, depositing an intrinsic amorphous silicon (a-Si) layer on the gate insulating layer, depositing an extrinsic amorphous silicon (a-Si) layer on the intrinsic amorphous silicon layer, forming a first contact hole exposing a portion of the first signal line by etching the extrinsic a-Si layer, the intrinsic a-Si layer, and the gate insulating layer, depositing a conductive layer on the extrinsic a-Si layer and forming a photoresist film having a position-dependent thickness. The method further includes forming a conductor connected to the first signal line through the first contact hole, a second signal line, a drain electrode, and underlying contact assistants and semiconductors by patterning the conductive layer, the extrinsic a-Si layer, and the intrinsic a-Si layer using the photoresist film as a mask, forming a passivation layer having a second contact hole exposing a portion of the drain electrode on the data line, the drain electrode, and the conductor and forming a pixel electrode connected to the drain electrode through the second contact hole on the passivation layer.

The passivation layer may further have a third contact hole exposing a portion of the conductor, and the forming of the pixel electrode may include forming contact assistants connected to the conductor through the third contact hole.

BRIEF DESCRIPTION OF THE DRAWINGS

Exemplary embodiments of the present invention can be understood in more detail from the following description taken in conjunction with the accompanying drawings, in which:

FIG. 9A to FIG. 9F are sectional views of the TFT array panel shown in FIG. 7 and FIG. 8 in intermediate steps of a manufacturing method thereof;

DETAILED DESCRIPTION OF THE EXEMPLARY EMBODIMENTS

Figure 1:
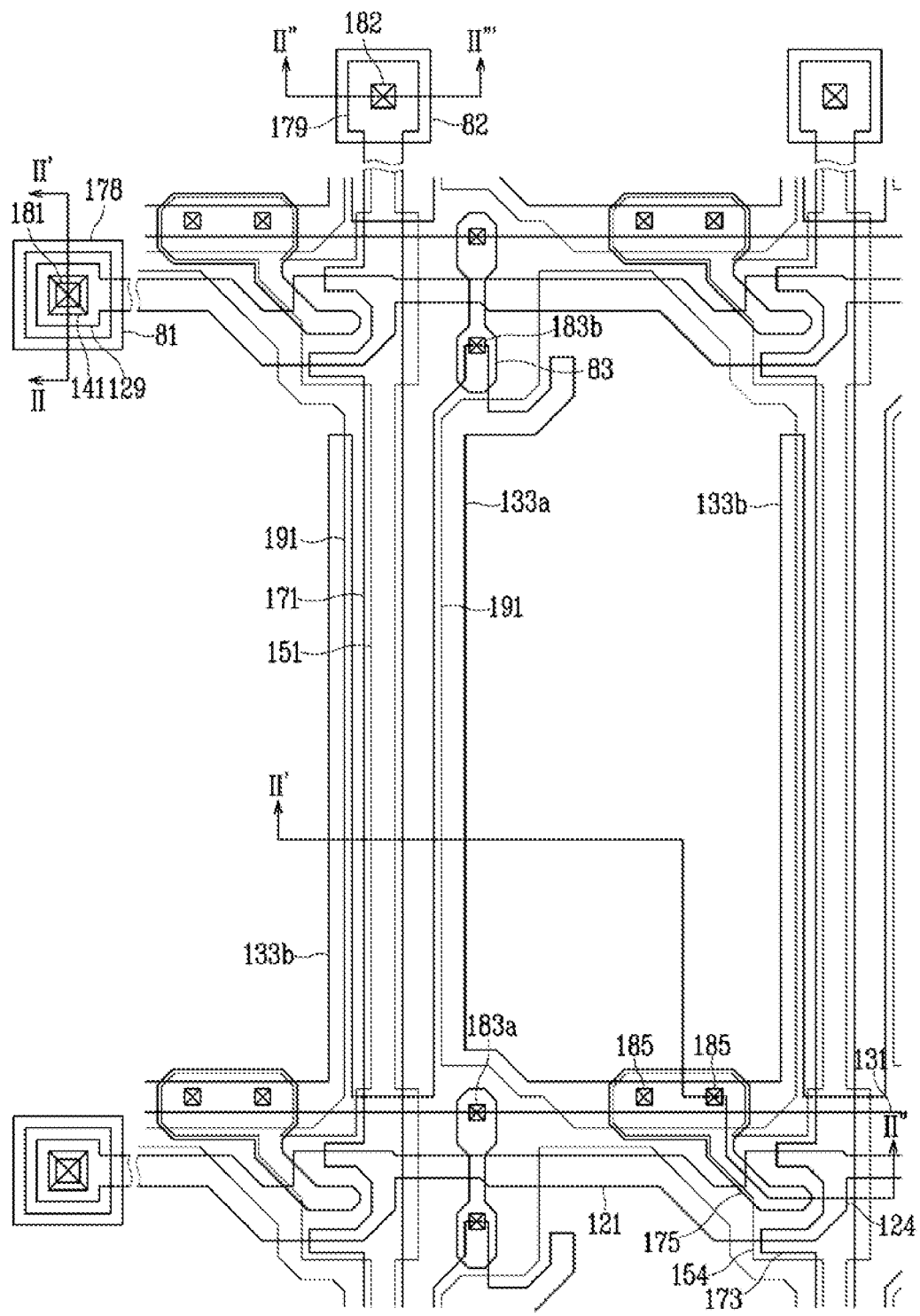
FIG. 1 is a layout view of a TFT array panel according to an exemplary embodiment of the present invention.

Exemplary embodiments of the present invention will hereinafter be described in detail with reference to the accompanying drawings.

As those skilled in the art would realize, the described exemplary embodiments may be modified in various different ways, all without departing from the spirit or scope of the present invention.

In the drawings, the thickness of layers, films, panels, regions etc., are exaggerated for clarity. Like reference numerals designate like elements throughout the specification. It will be understood that when an element such as a layer film, region, or substrate is referred to as being "on" another element, it can be directly on the other element or intervening elements may also be present. In contrast, when an element is referred to as being "directly on" another element, there are no intervening elements present.

First, a thin film transistor (TFT) array panel according to an exemplary embodiment of the present invention will be described in detail with reference to FIG. 1 and FIG. 2.

Figure 2:
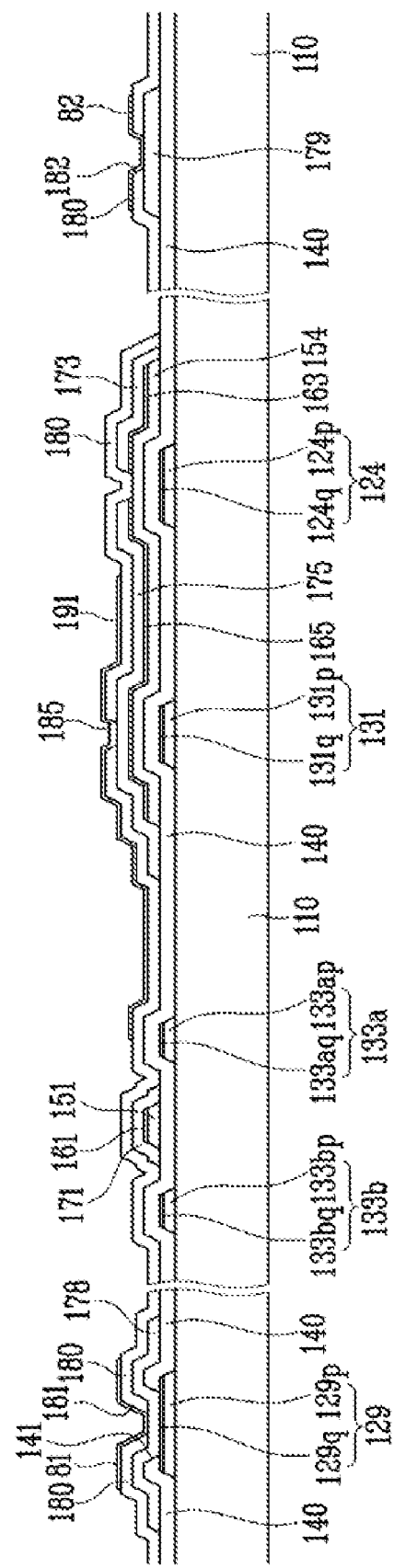
FIG. 2 is a sectional view of the TFT array panel shown in FIG. 1 taken along the line II-II'-II"-II'"

FIG. 1 is a layout view of a TFT array panel according to an exemplary embodiment of the present invention, and FIG. 2 is a sectional view of the TFT array panel shown in FIG. 1 taken along the line II-II'-II"-II'".

A plurality of gate lines 121 and a plurality of storage electrode lines 131 are formed on an insulating substrate 110 made of a material such as, for example, transparent glass or plastic.

The gate lines 121 transmit gate signals and extend substantially in a transverse direction. Each of the gate lines 121 includes a plurality of gate electrodes 124 projecting downward and a gate pad 129 having a large area for contact with another layer or an external driving circuit. A gate driving circuit for generating the gate signals may be mounted on a flexible printed circuit (FPC) film, which may be attached to the substrate 110, directly mounted on the substrate 110, or integrated onto the substrate 110. The gate lines 121 may extend to be connected to a driving circuit that may be integrated on the substrate 110.

The storage electrode lines 131 are supplied with a predetermined voltage, and each of the storage electrode lines 131 includes a stem extending substantially parallel to the gate lines 121 and a plurality of pairs of first and second storage electrodes 133a and 133b branched from the stem. Each of the storage electrode lines 131 is disposed between two adjacent gate lines 121, and the stem is close to one of the two adjacent gate lines 121. Each of the storage electrodes 133a and 133b has a fixed end portion connected to the stem and a free end portion disposed opposite thereto. The fixed end portion of the first storage electrode 133a has a large area and the free end portion thereof is bifurcated into a linear branch and a curved branch. However, the storage electrode lines 131 may have various shapes and arrangements.

The gate lines 121 and storage electrode lines 131 include two conductive films, a lower film and an upper film disposed thereon, which have different physical characteristics. The upper layer may be made of a low resistivity metal including an aluminum (Al)-containing metal such as, for example aluminum (Al) and an aluminum (Al) alloy such as aluminum neodymium (AlNd) for reducing signal delay or voltage drop. For example, the lower layer may be made of a material such as molybdenum (Mo)-containing metal such as molybdenum (Mo) and a molybdenum (Mo) alloy chromium (Cr), tantalum (Ta), or titanium (Ti), which has beneficial physical, chemical, and electrical contact characteristics with other materials such as indium tin oxide (ITO) and indium zinc oxide (IZO). However, the gate line 121 and the storage electrode line 131 may have a single-layered structure including, for example, an Al-containing metal.

In FIG. 2, for the gate electrodes 124, the storage electrode lines 131, and the storage electrodes 133a and 133b, the lower and upper films thereof are denoted by additional characters p and q, respectively.

The lateral sides of the gate lines 121 and the storage electrode lines 131 are inclined relative to a surface of the substrate 110, and the inclination angle thereof is in a range of from about 30 to about 80 degrees.

A gate-insulating layer 140 made of, for example, silicon nitride (SiNx) or silicon oxide (SiOx) is formed on the gate lines 121 and the storage electrode lines 131. The gate-insulating layer 140 has a plurality of contact holes 141 exposing the gate pad 129.

A plurality of semiconductor stripes 151 made of, for example, hydrogenated amorphous silicon (abbreviated to "a-Si") or polysilicon are formed on the gate-insulating layer 140. Each of the semiconductor stripes 151 extends substantially in the longitudinal direction and includes a plurality of projections 154 branched out toward the gate electrodes 124. The semiconductor stripes 151 become wide near the gate lines 121 and the storage electrode lines 131 such that the semiconductor stripes 151 cover large areas of the gate lines 121 and the storage electrode lines 131.

A plurality of ohmic contact stripes and islands 161 and 165 are formed on the semiconductor stripes 151. For example, the ohmic contacts 163 and 165 are preferably made of n+ hydrogenated a-Si heavily doped with an n-type impurity such as phosphorous, or they may be made of silicide. Each of the ohmic contact stripes 161 includes a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to the surface of the substrate 110, and the inclination angles thereof are, for example in a range of about 30 to about 80 degrees.

A plurality of data lines 171, a plurality of drain electrodes 175, and a plurality of interconnection members 178 are formed on the ohmic contacts 161 and 165 and the gate insulating layer 140.

The data lines 171 transmit data signals and extend substantially in the longitudinal direction to intersect the gate lines 121. Each of the data lines 171 also intersects the storage electrode lines 131 and runs between adjacent pairs of storage electrodes 133a and 133b. Each data line 171 includes a plurality of source electrodes 173 projecting toward the gate electrodes 124 and curved like a character J and a data pad 179 for contact with another layer or an external driving circuit. A data driving circuit for generating the data signals may be mounted on an FPC film, which may be attached to the substrate 110, directly mounted on the substrate 110 or integrated onto the substrate 110. The data lines 171 may extend to be connected to a driving circuit that may be integrated on the substrate 110.

The drain electrodes 175 are separated from the data lines 171 and disposed opposite the source electrodes 173 with respect to the gate electrodes 124. Each of the drain electrodes 175 includes a wide end portion and a narrow end portion. The wide end portion overlaps a storage electrode line 131 and the narrow end portion is partly enclosed by a source electrode 173.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The interconnection member 178 covers the gate pad 129 exposed through the contact hole 141 of the gate-insulating layer 140 to contact the gate pad 129.

The data lines 171, the drain electrodes 175, and the interconnection members 178 may be made of a refractory metal such as, for example, Cr, Mo, Ta, Ti, or alloys thereof. However, they may have, for example, a multilayered structure including a refractory metal film and a low resistivity film. However, the data lines 171, the drain electrodes 175, and the interconnection members 178 may be made of various metals or conductors.

The data lines 171, the drain electrodes 175, and the interconnection members 178 have inclined edge profiles, and the inclination angles thereof range from about 30 to about 80 degrees.

The ohmic contacts 161 and 165 are interposed only between the underlying semiconductor stripes 151 and the overlying conductors 171 and 175 thereon, and reduce the contact resistance therebetween. Although the semiconductor stripes 151 are narrower than the data lines 171 at most places, the width of the semiconductor stripes 151 becomes large near the gate lines 121 and the storage electrode lines 131 as described above, to smooth the profile of the surface, thereby preventing disconnection of the data lines 171. However, the semiconductor stripes 151 include some exposed portions, which are not covered with the data lines 171 and the drain electrodes 175, such as portions located between the source electrodes 173 and the drain electrodes 175.

A passivation layer 180 is formed on the data lines 171, the drain electrodes 175, the interconnection members 178, and the exposed portions of the semiconductor stripes 151. The passivation layer 180 may be made of for example, an inorganic insulator or an organic insulator, and it may have a flat top surface. Examples of the inorganic insulator include but are not limited to silicon nitride and silicon oxide. The organic insulator may have photosensitivity and a dielectric constant of less than about 4.0. The passivation layer 180 may include a lower film of an inorganic insulator and an upper film of an organic insulator, such that it takes the beneficial insulating characteristics of the organic insulator while preventing the exposed portions of the semiconductor stripes 151 from being damaged by the organic insulator. In addition, the upper layer made of an organic insulator may have a flat surface to induce the passivation layer to have a flat top surface.

The passivation layer 180 has a plurality of contact holes 181, 182, and 185 exposing the interconnection members 178, the data pads 179 of the data lines 171, and the drain electrodes 175, respectively. The passivation layer 180 and the gate insulating layer 140 have a plurality of contact holes 183a exposing portions of the lower films 133ap of the storage electrode lines 131 near the fixed end portions of the first storage electrodes 133a, and a plurality of contact holes 183b exposing the lower film 133bp of the linear branches of the free end portions of the first storage electrodes 133a.

A plurality of pixel electrodes 191, a plurality of overpasses 83, and a plurality of contact assistants 81 and 82 are formed on the passivation layer 180. They are made of, for example, a transparent conductor such as ITO or IZO or a reflective conductor such as silver (Ag), Al, or alloys thereof.

The pixel electrodes 191 are physically and electrically connected to the drain electrodes 175 through the contact holes 185 such that the pixel electrodes 191 receive data voltages from the drain electrodes 175. The pixel electrodes 191 supplied with the data voltages generate electric fields in cooperation with a common electrode of an opposing display panel supplied with a common voltage. The generated electric field in turn determines the orientation of liquid crystal molecules of a liquid crystal layer disposed between the two electrodes. A pixel electrode 191 and the common electrode form a capacitor referred to as a "liquid crystal capacitor," which stores applied voltages after the TFT is turned off.

A pixel electrode 191 and a drain electrode 175 connected thereto overlap a storage electrode line 131 including storage electrodes 133a and 133b. The pixel electrode 191, a drain electrode 175 connected thereto, and the storage electrode line 131 form an additional capacitor referred to as a "storage capacitor," which enhances the voltage storing capacity of the liquid crystal capacitor.

The overpasses 83 cross over the gate lines 121 and are connected to the exposed portions of the storage electrode lines 131 and the exposed linear branches of the free end portions of the storage electrodes 133b through the contact holes 183a and 183b, respectively, which are disposed opposite each other with respect to the gate lines 121. The storage electrode lines 131 including the storage electrodes 133a and 133b along with the overpasses 83 can be used for repairing defects in the gate lines 121, the data lines 171, or the TFTs.

The contact assistants 81 and 82 are connected to the interconnection members 178 and the data pads 179 of the data lines 171 through the contact holes 181 and 182, respectively. The contact assistants 81 and 82 protect the interconnection members 178 and the data pads 179 and enhance the adhesion between the interconnection members 178 and the data pads 179 and external devices.

The interconnection members 178 are interposed between the underlying gate pads 129 made of, for example, an Al-containing metal and the overlying contact assistants 181 made of a transparent conductor such as, for example, ITO thereon to prevent corrosion of Al due to ITO.

Now, a TFT array panel according to another exemplary embodiment of the present invention will be described in detail with reference to FIG. 3 and FIG. 4.

Figure 3:
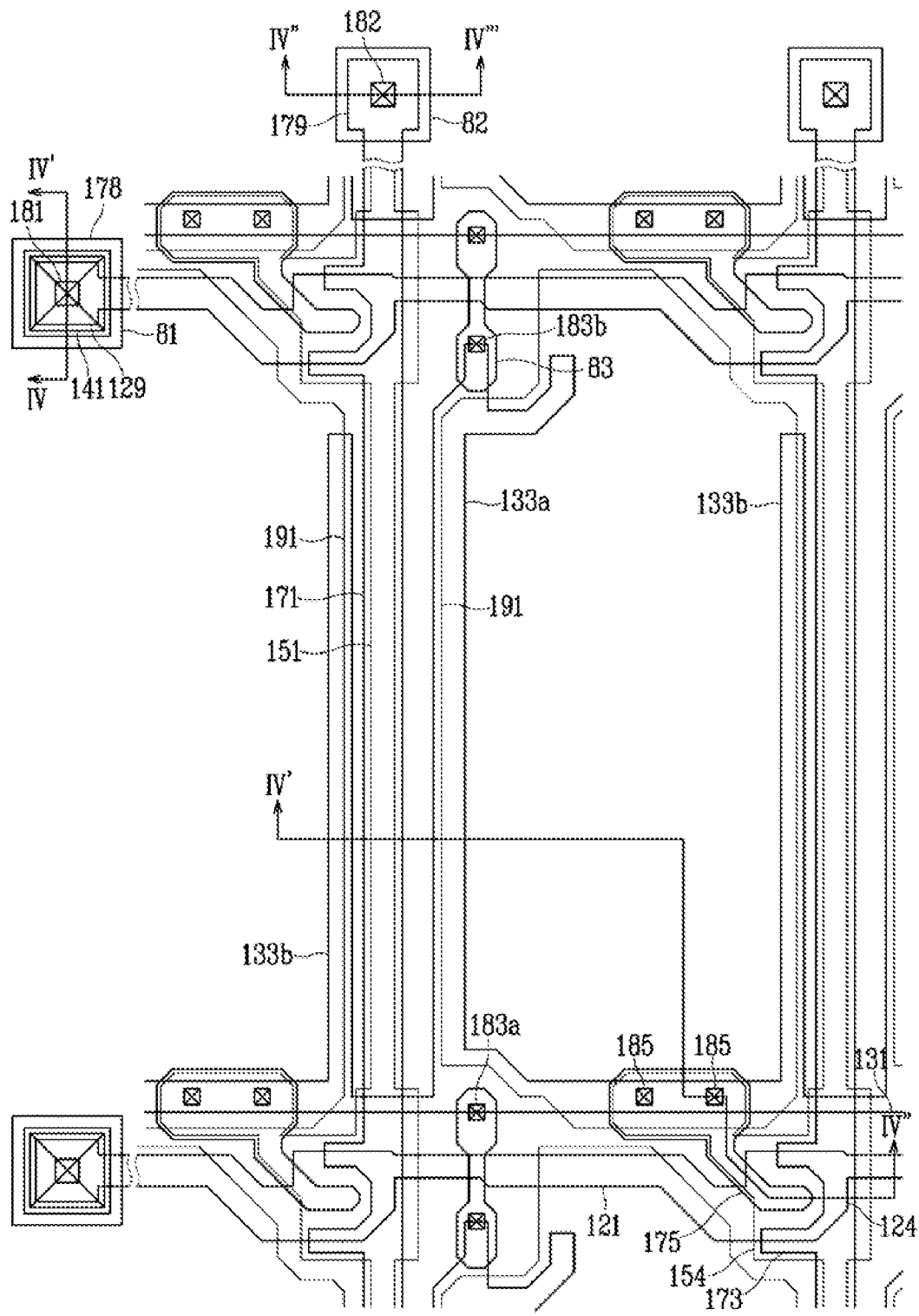
FIG. 3 is a layout view of a TFT array panel according to an exemplary embodiment of the present inventions.
Figure 4:
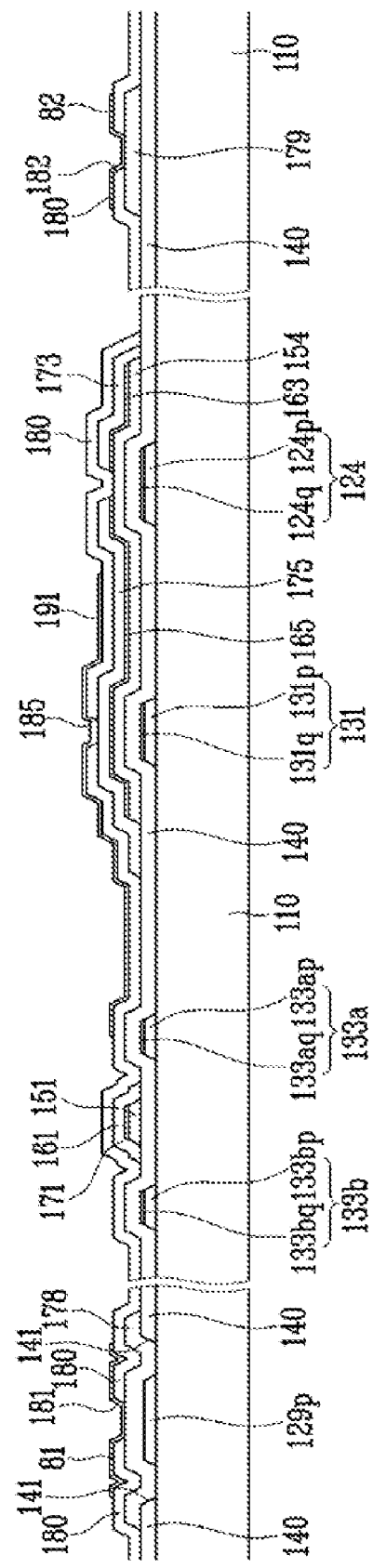
FIG. 4 is a sectional view of the TFT array panel shown in FIG. 3 taken along the line IV-IV'-IV"-IV'"

FIG. 3 is a layout view of a TFT array panel according to another exemplary embodiment of the present invention, and FIG. 4 is a sectional view of the TFT array panel shown in FIG. 3 taken along the line IV-IV'-IV"-IV'".

As shown in FIG. 3 and FIG. 4, a layered structure of a TFT array panel according to the present exemplary embodiment is substantially the same as that shown in FIG. 1 and FIG. 2.

A plurality of gate lines 121 and a plurality of storage electrode lines 131 are formed on a substrate 110. Each gate line 121 includes a gate electrode 124 and a gate pad 129, and each storage electrode line 131 includes storage electrodes 133a and 133b. The gate lines 121 and the storage electrode lines 131 include a lower layer having beneficial contact characteristics and an upper layer made of an Al-containing metal. In FIG. 3 and FIG. 4, the lower layer and the upper layer of the gate lines 121 and the storage electrode lines 131 are denoted by additional characters p and q, respectively. A gate insulating layer 140 having a plurality of contact holes 141, a plurality of semiconductor stripes 151 including projections 154, a plurality of ohmic contact stripes 161 including projections 164, and a plurality of ohmic contact islands 165 are sequentially formed on the gate lines 121 and the storage electrode lines 131.

A plurality of data lines 171 including source electrodes 173 and data pads 179, a plurality of drain electrodes 175, and a plurality of interconnection member 178 are formed on the ohmic contacts 161 and 165 and the gate insulating layer 140, and a passivation layer 180 is formed thereon. The gate insulating layer 140 and the passivation layer 180 have a plurality of contact holes 181, 182, 183a, 183b, and 185. A plurality of pixel electrodes 191, a plurality of contact assistants 81 and 82, and a plurality of overpasses 83 are formed on the passivation layer 180.

However, unlike the TFT array panel shown in FIG. 1 and FIG. 2, the upper layers 129q of the gate pads 129 exposed through the contact holes 141 are eliminated to expose the lower layers 129q through the contact holes 141. Also, the size of each contact hole 141 is larger than that of each gate pad 129 to expose the substrate 110 around the gate pads 129, and the exposed substrate 110 and the lower layers 129q of the gate pads 129 are covered by the interconnection members 178.

In the TFT array panel according to the present exemplary embodiment, the upper layers 129q of the gate pads 129 made of an Al-containing metal are eliminated such that the corrosion of the Al-containing metal caused by contacting ITO may be prevented.

Many characteristics of the TFT array panel shown in FIG. 1 and FIG. 2 can be applied to the TFT array panel shown in FIGS. 3 and 4.

Now, a manufacturing method of the TFT array panel shown in FIG. 1 and FIG. 2 according to the an exemplary embodiment of the present invention will be described in detail with reference to FIG. 5 to FIG. 13 along with FIG. 1 and FIG. 2.

Figure 11:
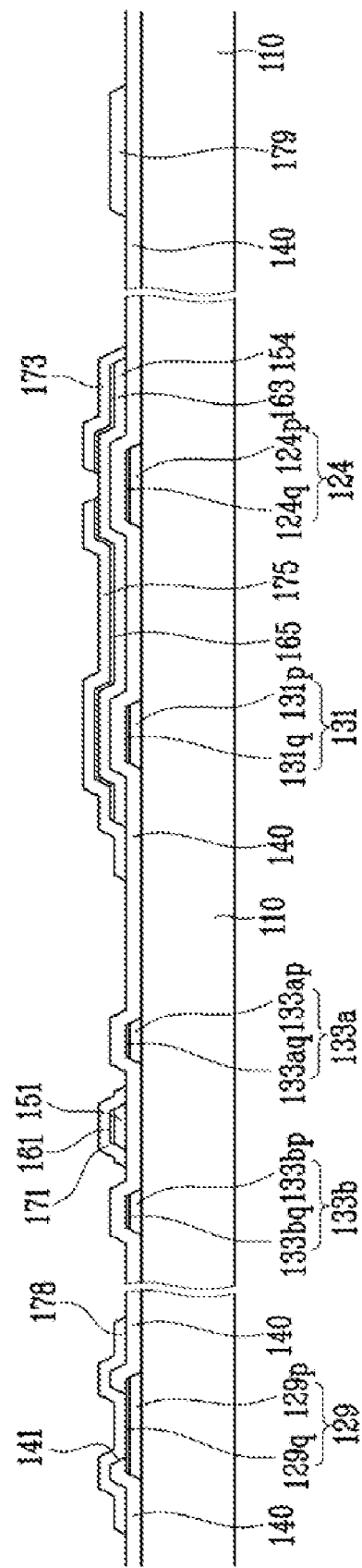
FIG. 11 is a sectional view of the TFT array panel shown in FIG. 10 taken along the line XI-XI'-XI"-XI'"
Figure 12:
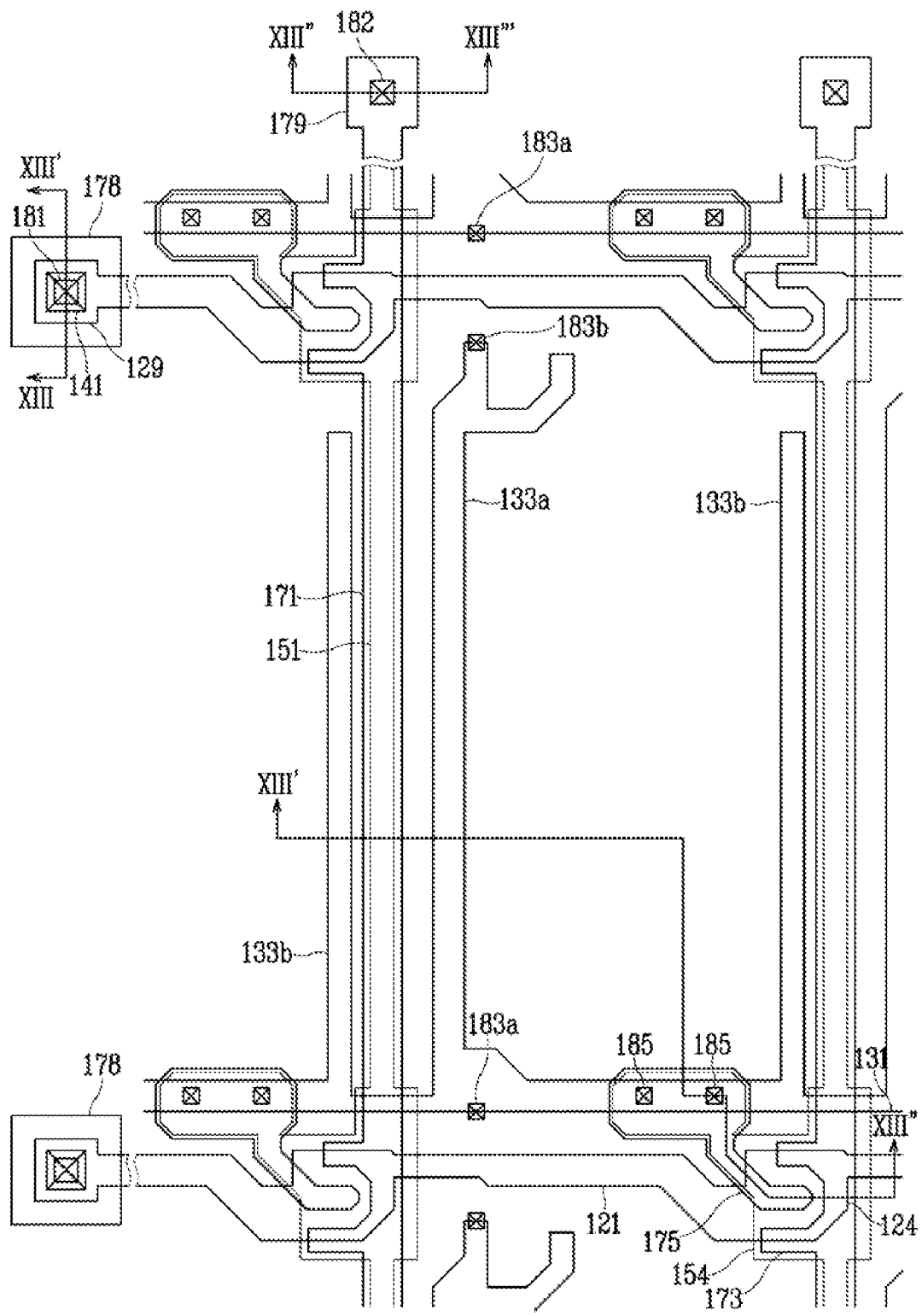
Figure 13:
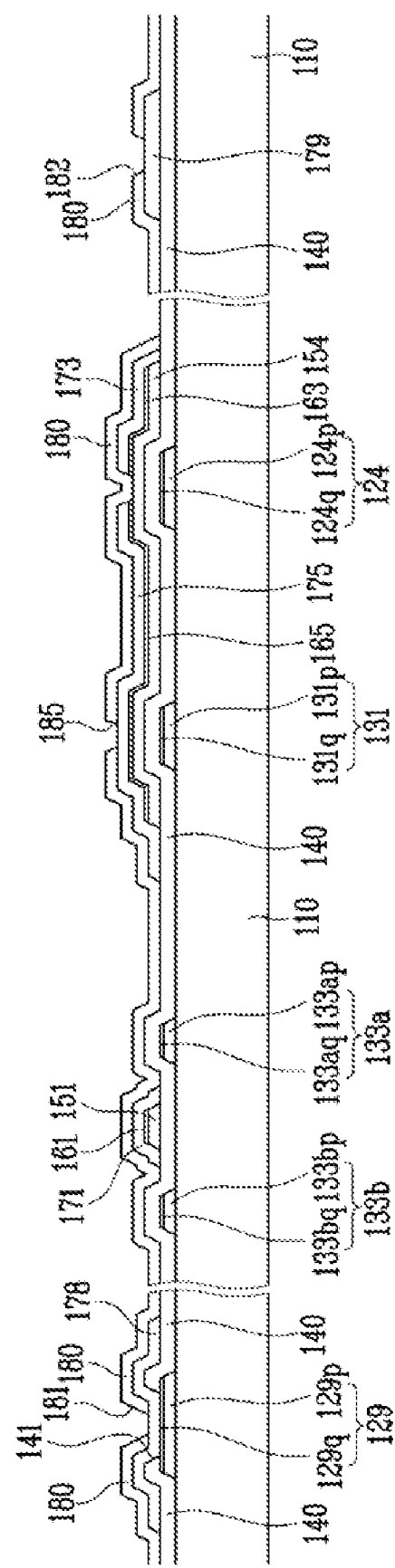
FIG. 13 is a sectional view of the TFT array panel shown in FIG. 12 taken along the line XIII-XIII'-XIII"-XIII'"

FIG. 5, FIG. 7, FIG. 10, and FIG. 12 are layout views of the TFT array panel shown in FIG. 1 and FIG. 2 in intermediate steps of a manufacturing method thereof according to an exemplary embodiment of the present invention. FIG. 6 is a sectional view of the TFT array panel shown in FIG. 5 taken along the line VI-VI'-VI"-VI'", FIG. 8 is a sectional view of the TFT array panel shown in FIG. 7 taken along the line VIII-VIII'-VIII"-VIII'", FIG. 11 is a sectional view of the TFT array panel shown in FIG. 10 taken along the line XI-XI'-XI"-XI'", FIG. 13 is a sectional view of the TFT array panel shown in FIG. 12 taken along the line XIII-XIII'-XIII"-XIII'", and FIG. 9A to FIG. 9F are sectional views of the TFT array panel shown in FIG. 7 and FIG. 8 in intermediate steps of a manufacturing method thereof.

Figure 5:
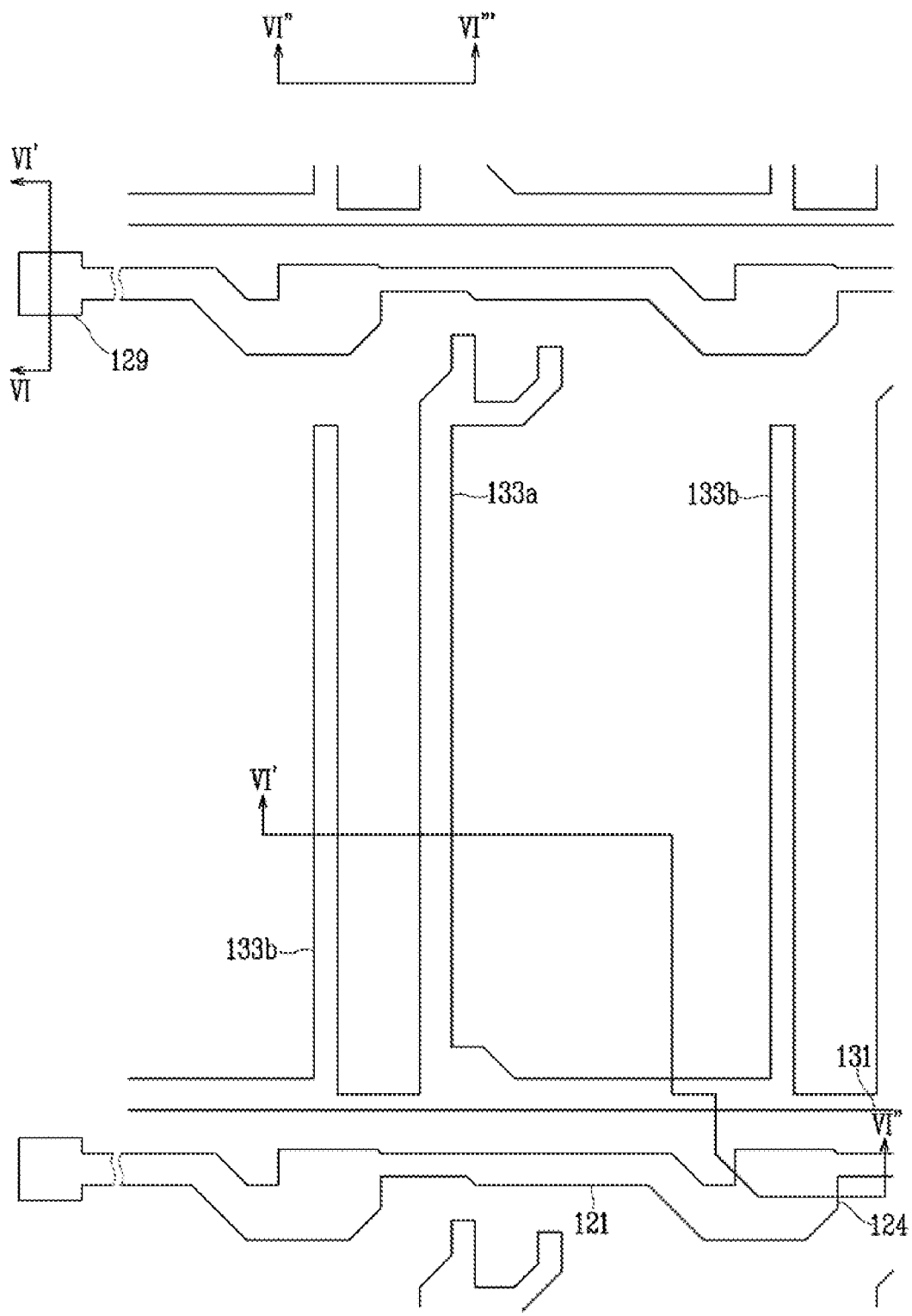
FIG. 5, FIG. 7, FIG. 10, and FIG. 12 are layout views of the TFT array panel shown in FIG. 1 and FIG. 2 in intermediate steps of a manufacturing method thereof according to an exemplary embodiment of the present invention.
Figure 6:
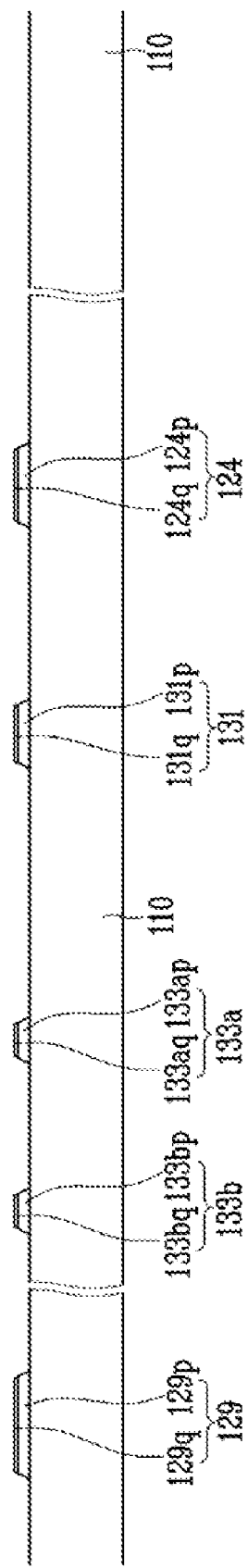
FIG. 6 is a sectional view of the TFT array panel shown in FIG. 5 taken along the line VI-VI'-VI"-VI'"

Referring to FIG. 5 and FIG. 6, a lower conductive layer such as, for example, Cr, a chromium nitride (Cr—N) alloy, or Mo is deposited on an insulation substrate 110 by, for example, sputtering and then an upper conductive layer of an Al-containing metal is deposited thereon. The upper conductive layer and the lower conductive layer are patterned by photolithography and etching to form a plurality of gate lines 121 and a plurality of storage electrode lines 131 having a dual-layered structure. Each gate line 121 includes a gate electrode 124 and a gate pad 129, and each storage electrode line 131 includes storage electrodes 133a and 133b. In the drawings, the lower layer and the upper layer of the gate lines 121 and the storage electrode lines 131 are denoted by additional characters p and q, respectively.

Figure 7:
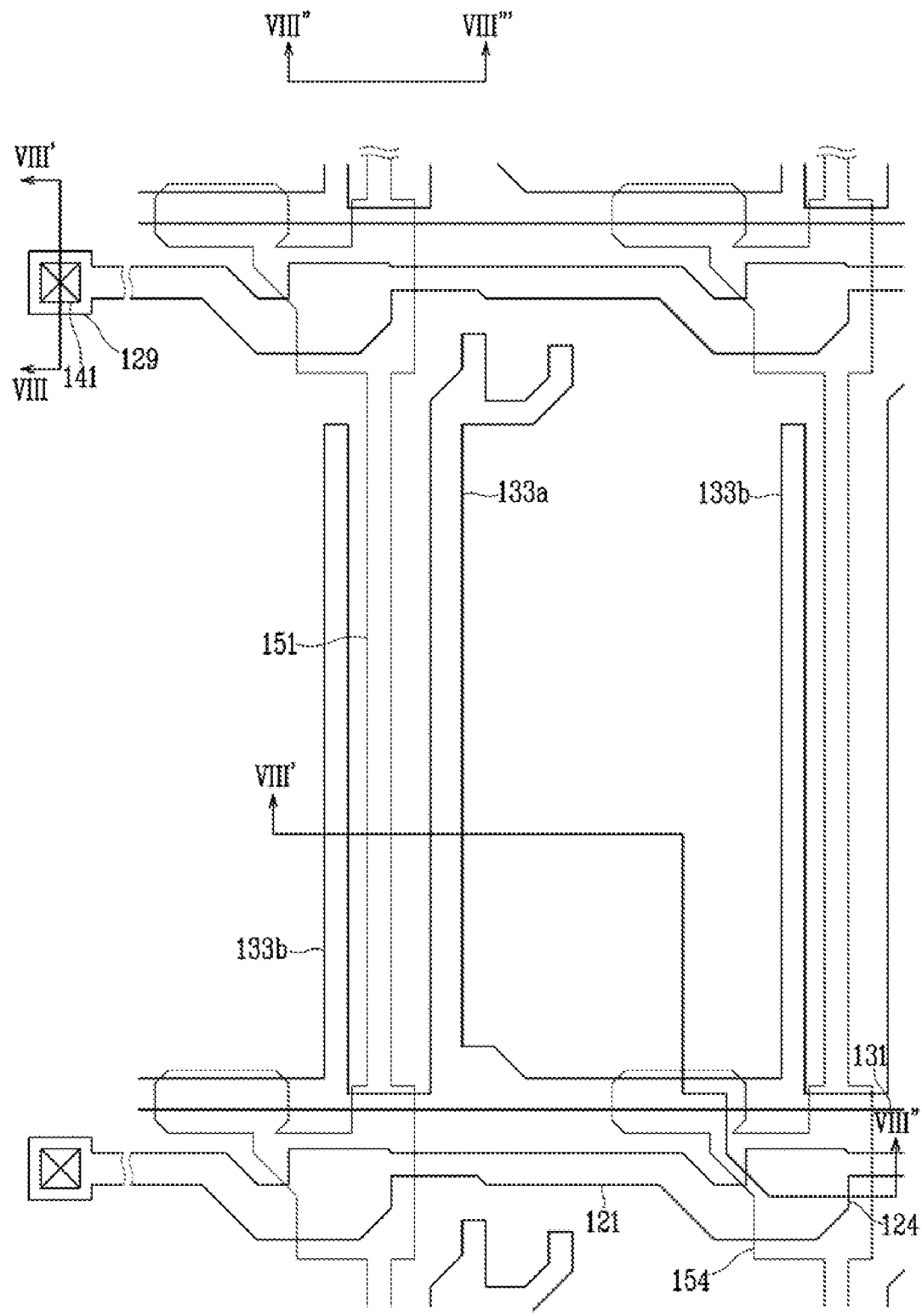
Figure 8:
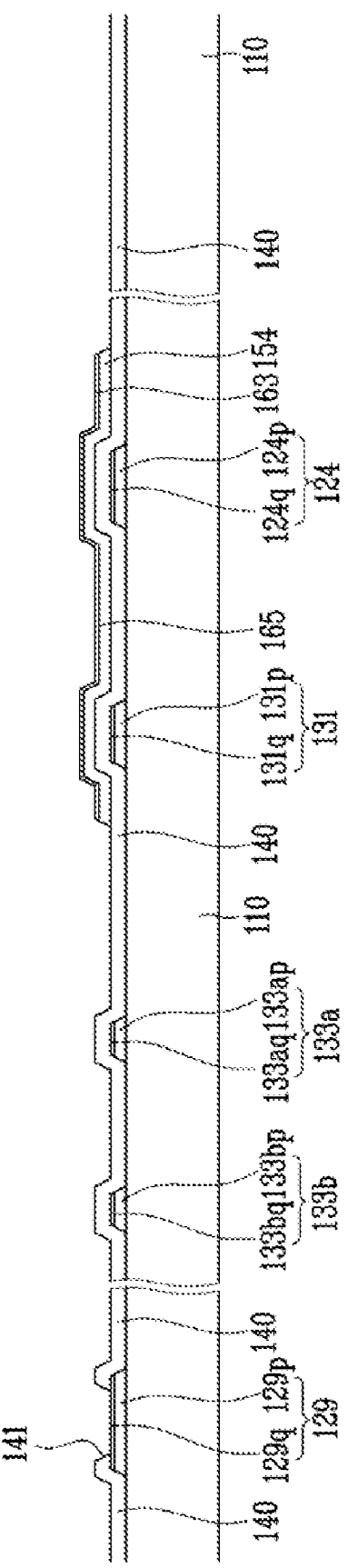
FIG. 8 is a sectional view of the TFT array panel shown in FIG. 7 taken along the line VIII-VIII'-VIII"-VIII'"

Next, a gate insulating layer 140 having a plurality of contact holes 141, a plurality of (intrinsic) semiconductor stripes 151 including projections 154, and a plurality of extrinsic semiconductor stripes 161 including projections 164 are formed on the substrate having the gate lines 121 and the storage electrode lines 131 as shown in FIG. 7 and FIG. 8.

Now, the formation of the gate-insulating layer 140, the extrinsic semiconductor stripes 161, and the (intrinsic) semiconductor stripes 151 will be described in more detail with reference to FIG. 9A to FIG. 9F.

Figure 9A:
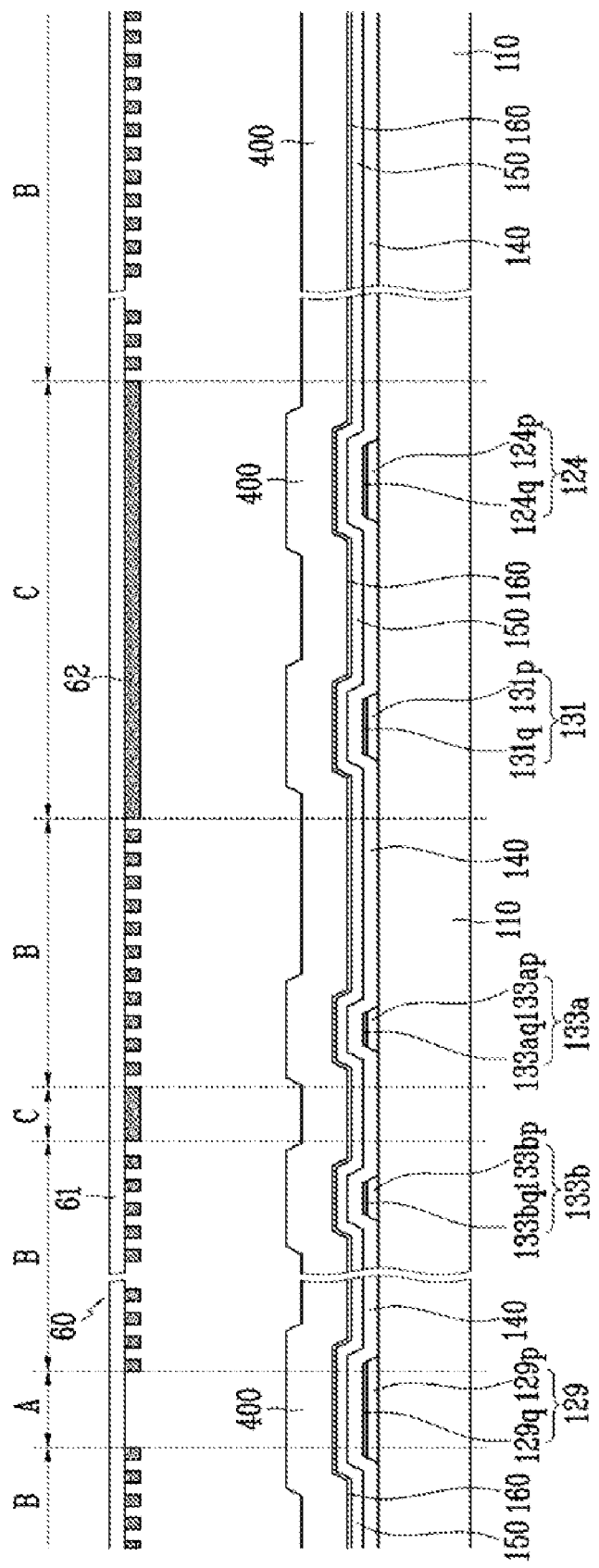

Referring to FIG. 9A, the gate insulating layer 140, an intrinsic a-Si layer 150, and an extrinsic a-Si layer 160 are sequentially deposited on the substrate by, for example, plasma enhanced chemical vapor deposition (PECVD) and then a photoresist film 400 is coated thereon.

Next, the photoresist film 400 is exposed through an exposure mask 60, and an example of the exposure mask 60 is shown in the upper side of FIG. 9A.

The exposure mask 60 includes a substrate 61 and a plurality of opaque members 62 formed thereon. The exposure mask 60 and the substrate 110 are divided into light transmitting transparent areas A, translucent areas B, and light blocking opaque areas C depending on a distribution of the opaque member 62 on the exposure mask 60.

In the translucent areas B, the opaque members 62 are located with a predetermined distance therebetween which is smaller than the resolution of a light exposer used for the photolithography, and is referred to as a slit pattern. There are no opaque members 62 in the light transmitting transparent areas A, and the opaque members 62 are located all over in the light blocking opaque areas C.

The translucent areas B may have a lattice pattern, or may be a thin film(s) with intermediate transmittance or intermediate thickness instead of the slit pattern.

Figure 9B:
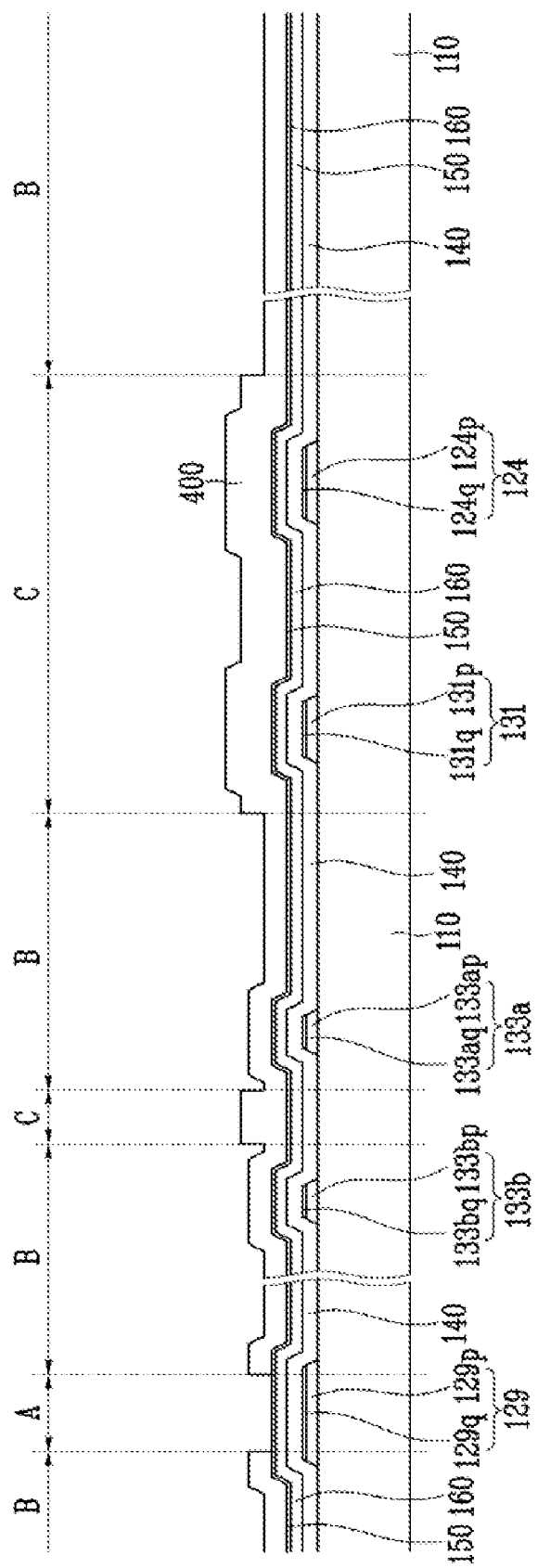

The photoresist film 400 is exposed to light through the exposure mask 60 and then the exposed photoresist film 400 is developed. As shown in FIG. 9B, the developed photoresist film 400 has a position-dependent thickness such that the photoresist film 400 located in the light transmitting transparent area A is eliminated, the photoresist film 400 located in the translucent areas B is reduced, and the photoresist film 400 located in the light blocking opaque areas C is not eliminated.

Here, a thickness ratio of the photoresist film 400 located in light blocking opaque areas C to the photoresist film 400 located in translucent areas B is adjusted depending upon the process conditions in the subsequent process steps. For example, the thickness of the photoresist film 400 located in translucent areas B may be equal to or less than half of the thickness of the photoresist film 400 located in light blocking opaque areas C.

The position-dependent thickness of the photoresist film 400 may be also obtained by using, for example, a reflowable photoresist. In detail, once a photoresist pattern made of a reflowable material is formed by using a normal exposure mask with only transparent areas and opaque areas, it is subjected to a reflow process to flow onto areas without the photoresist, thereby forming thin portions.

Figure 9C:
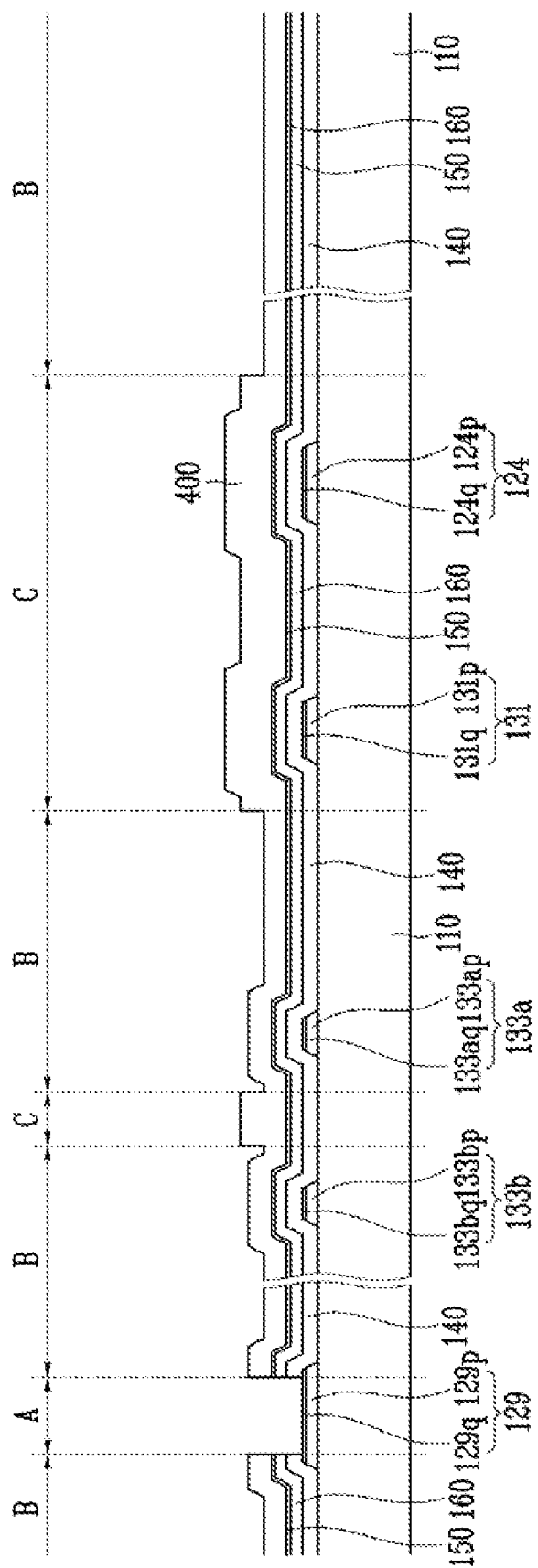

Next, the extrinsic amorphous silicon (a-Si) layer 160, the intrinsic a-Si layer 150, and the gate insulating layer 140 are etched using the remaining photoresist film 400 as a mask to eliminate the extrinsic a-Si layer 160, intrinsic a-Si layer 150 and gate insulating layer 140 located in the light transmitting transparent area A such that the contact holes 141 exposing the gate pads 129 are formed in the gate insulating layer 140 as shown in FIG. 9C.

As shown in FIG. 9D, ashing is performed on the photoresist film 400 such that the photoresist film 400 disposed in the translucent areas B is all eliminated and the thickness of the photoresist film 400 disposed in the light blocking opaque areas C become thin.

Figure 9E:
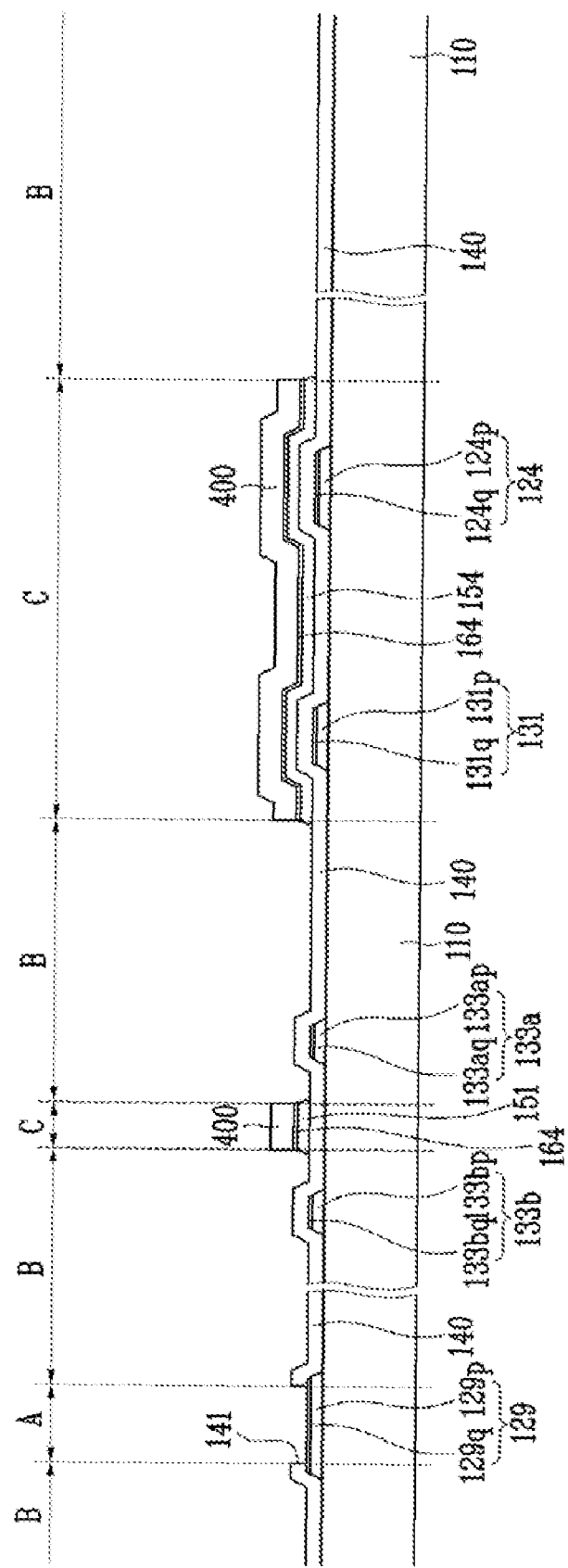
Figure 10:
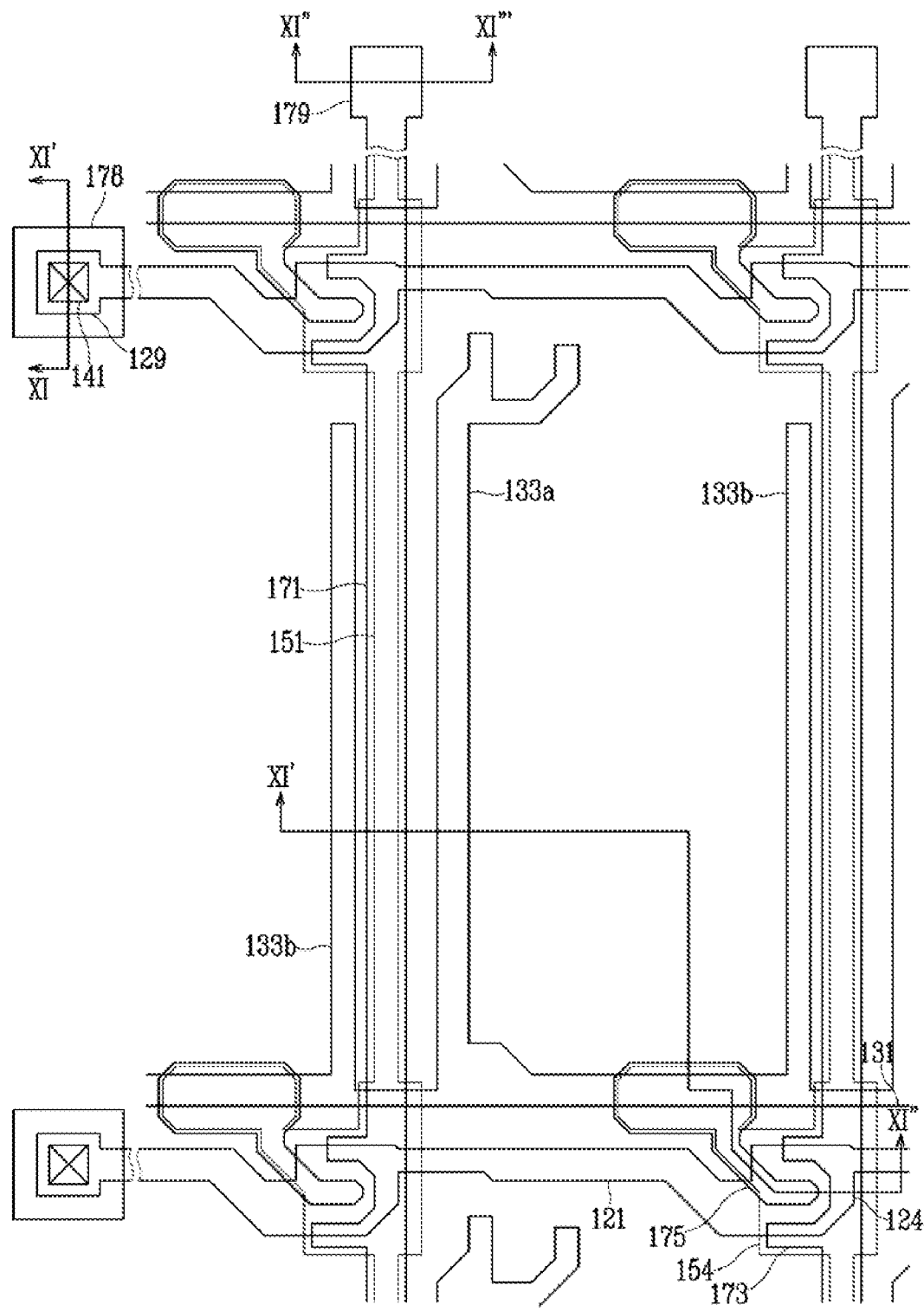

Referring to FIG. 9E, the extrinsic a-Si layer 160 and the intrinsic a-Si layer 150 are etched using the remaining photoresist film 400 located in the light blocking opaque areas C as a mask to form the extrinsic semiconductor stripes 161 and the intrinsic semiconductor stripes 151.

Finally, the remaining photoresist film 400 located in the light blocking opaque areas C is eliminated by, for example, ashing, as shown in FIG. 9F.

As described above, the gate insulating layer 140, the intrinsic a-Si layer 150, and the extrinsic a-Si layer 160 are patterned using one exposure mask to form the contact holes 141 exposing the gate pads 129 in the gate insulating layer 140 and to form the extrinsic semiconductor stripes 161 and the intrinsic semiconductor stripes 151, simultaneously, such that an additional exposure mask is not required. Consequently as a result, production costs are also reduced.

A metal layer is deposited on the extrinsic semiconductor stripes 161 and 164 and the gate insulating layer 140, and then the metal is patterned by photolithography and etching to form a plurality of data lines 171 including source electrodes 173 and data pads 179, a plurality of drain electrodes 175, and a plurality of interconnection members 178.

Thereafter, exposed portions of the extrinsic semiconductor stripes 164, which are not covered with the data lines 171 and the drain electrodes 175, are removed to complete a plurality of ohmic contact stripes 161 including projections 163 and a plurality of ohmic contact islands 165 and to expose portions of the intrinsic semiconductor stripes 151.

Next, a passivation layer 180 is deposited and patterned by photolithography (and etching) along with the gate insulating layer 140 to form a plurality of contact holes 181, 182, 183a, 183b, and 185 exposing the interconnection members 178, the data pads 179 of the data lines 171, portions of the storage electrode lines 131 near the fixed end portions of the first storage electrodes 133a, portions of the linear branches of the free end portions of the first storage electrodes 133a, and the drain electrodes 175, respectively.

Referring to FIG. 1 and FIG. 2, ITO or IZO is deposited on the passivation layer 180 by, for example, sputtering, and patterned by photolithography and etching to form a plurality of pixel electrodes 191, a plurality of contact assistants 81 and 82, and a plurality of overpasses 83.

Now, a manufacturing method of the TFT array panel shown in FIG. 3 and FIG. 4 according to the present exemplary embodiment of the present invention will be described in detail with reference to FIG. 14 to FIG. 18 along with FIG. 3 and FIG. 4.

Figure 14:
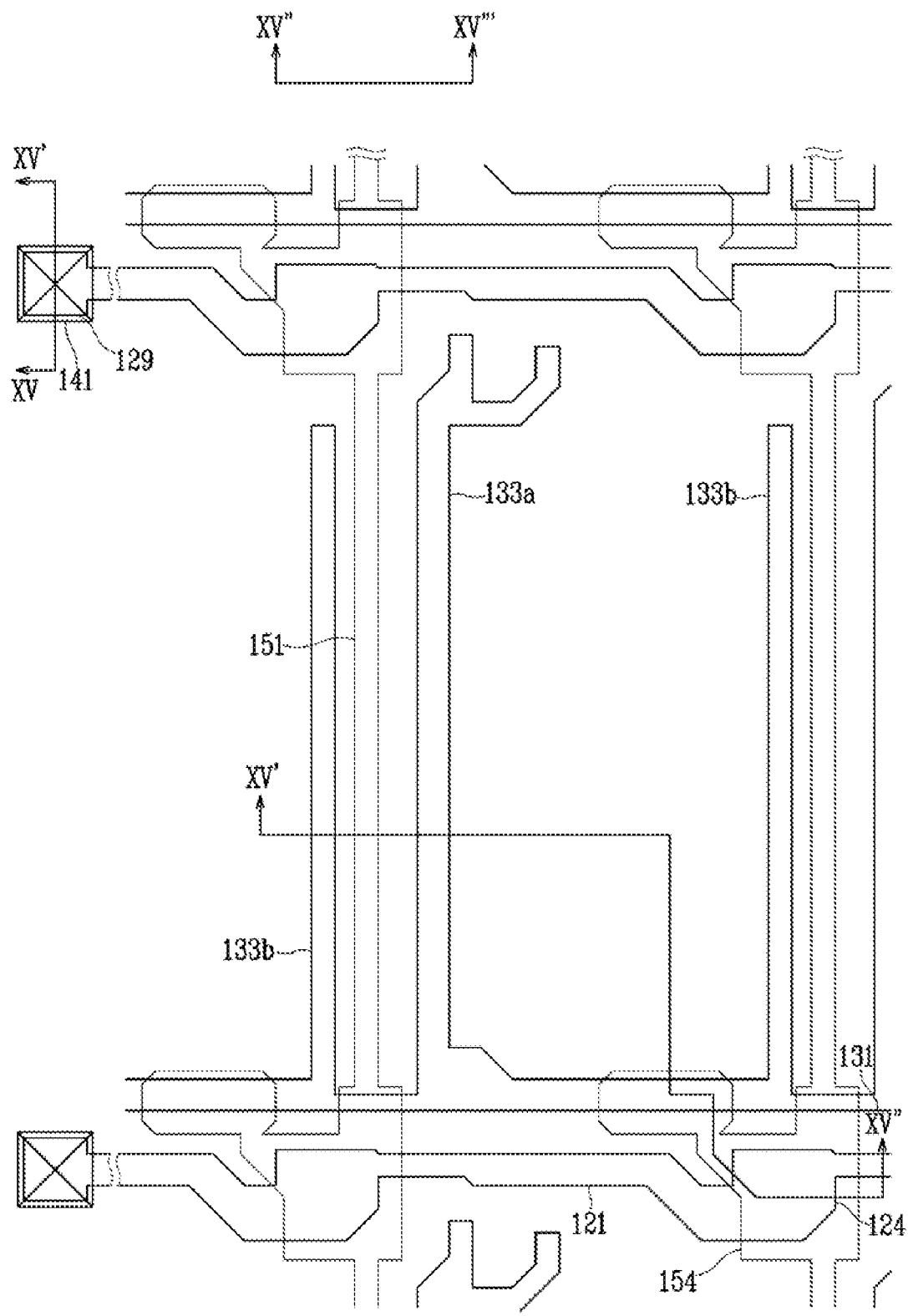
FIG. 14 and FIG. 17 are layout views of the TFT array panel shown in FIG. 3 and FIG. 4 in intermediate steps of a manufacturing method thereof according to an exemplary embodiment of the present invention.
Figure 15:
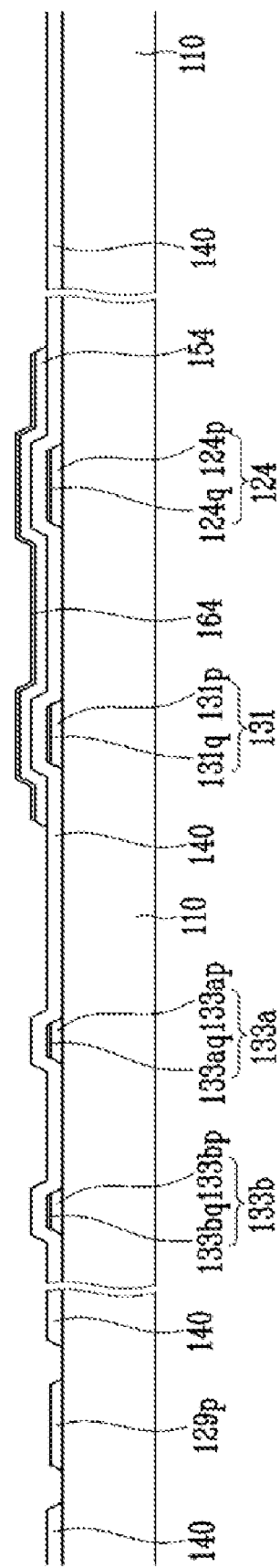
FIG. 15 is a sectional view of the TFT array panel shown in FIG. 14 taken along the line XV-XV'-XV"-XV'"
Figure 16A:
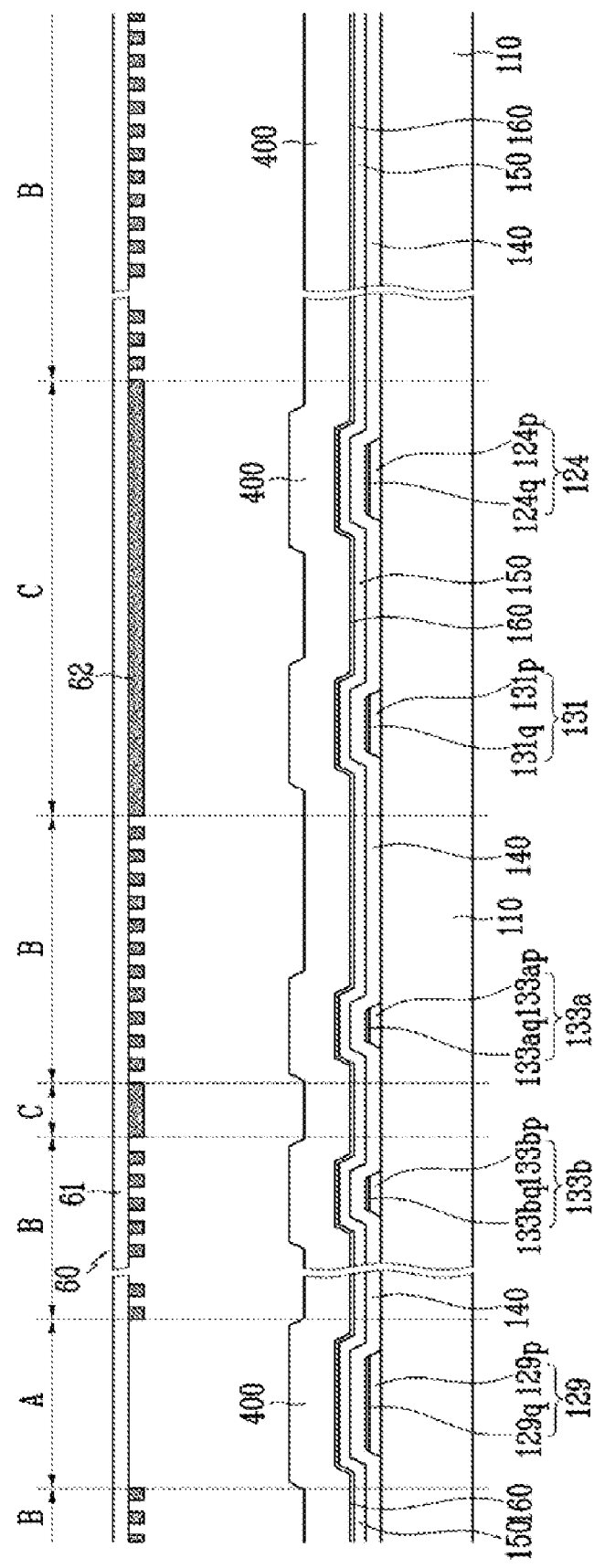
FIG. 16A to FIG. 16F are sectional views of the TFT array panel shown in FIG. 14 and FIG. 15 in intermediate steps of a manufacturing method thereof.
Figure 16B:
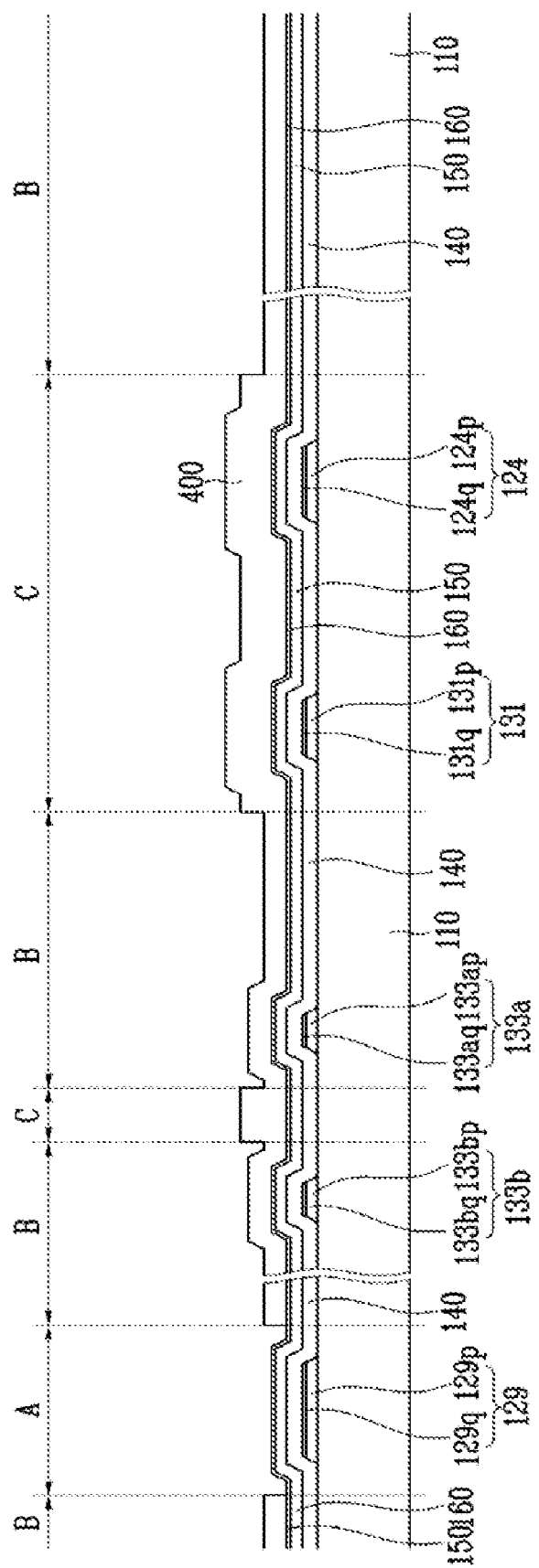
Figure 16C:
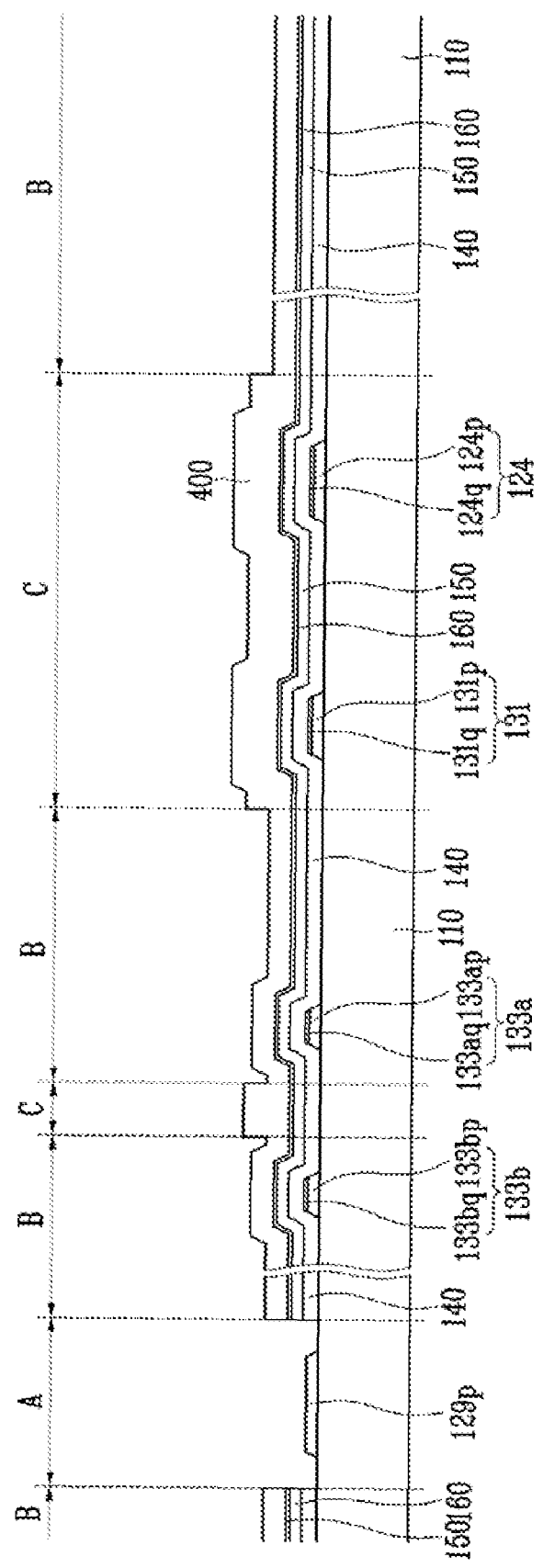
Figure 16D:
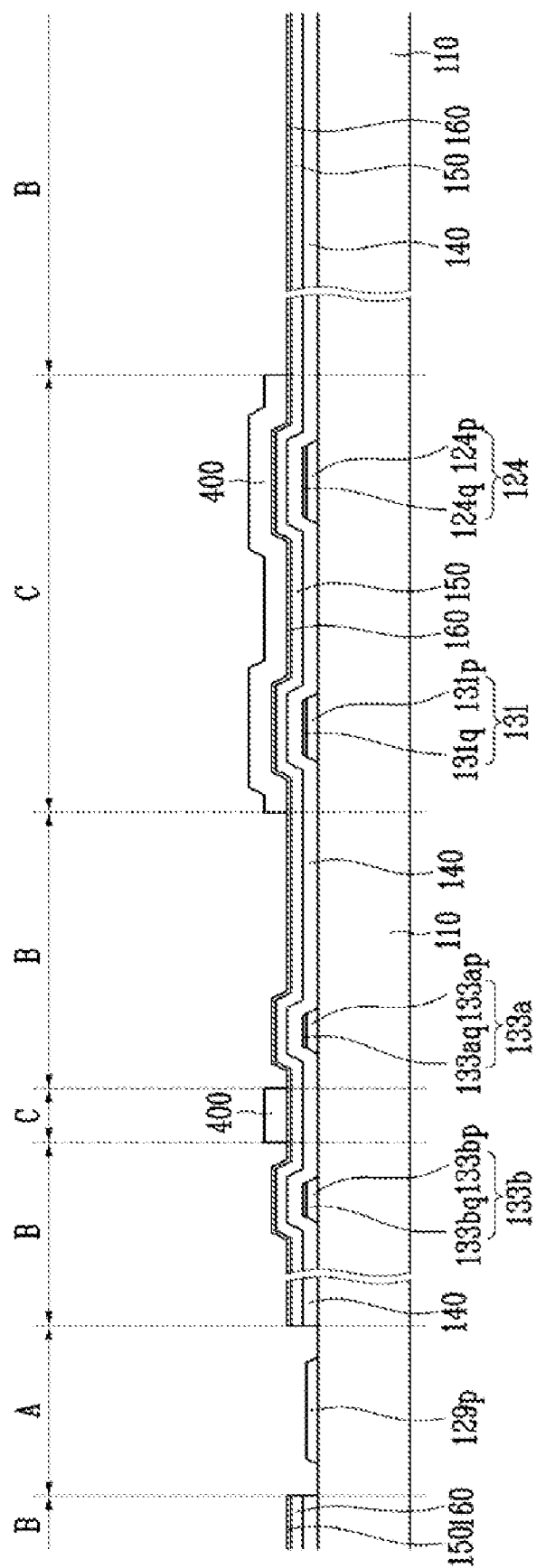
Figure 16E:
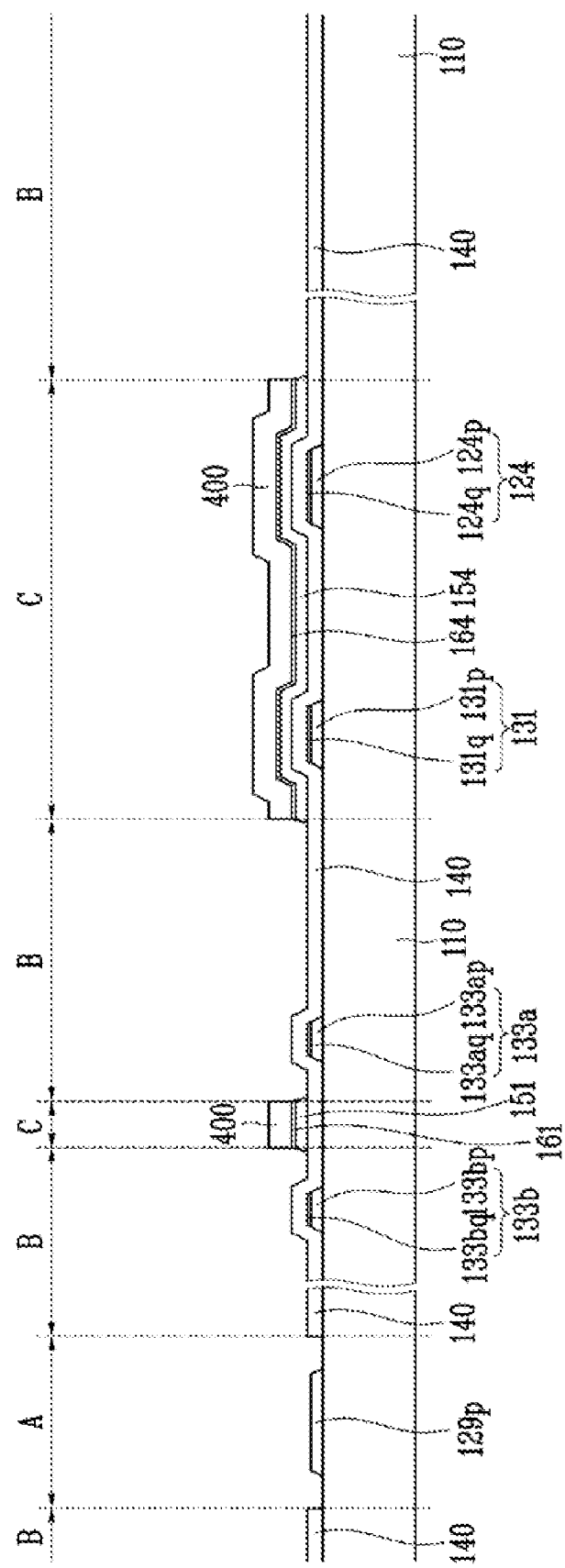
Figure 16F:
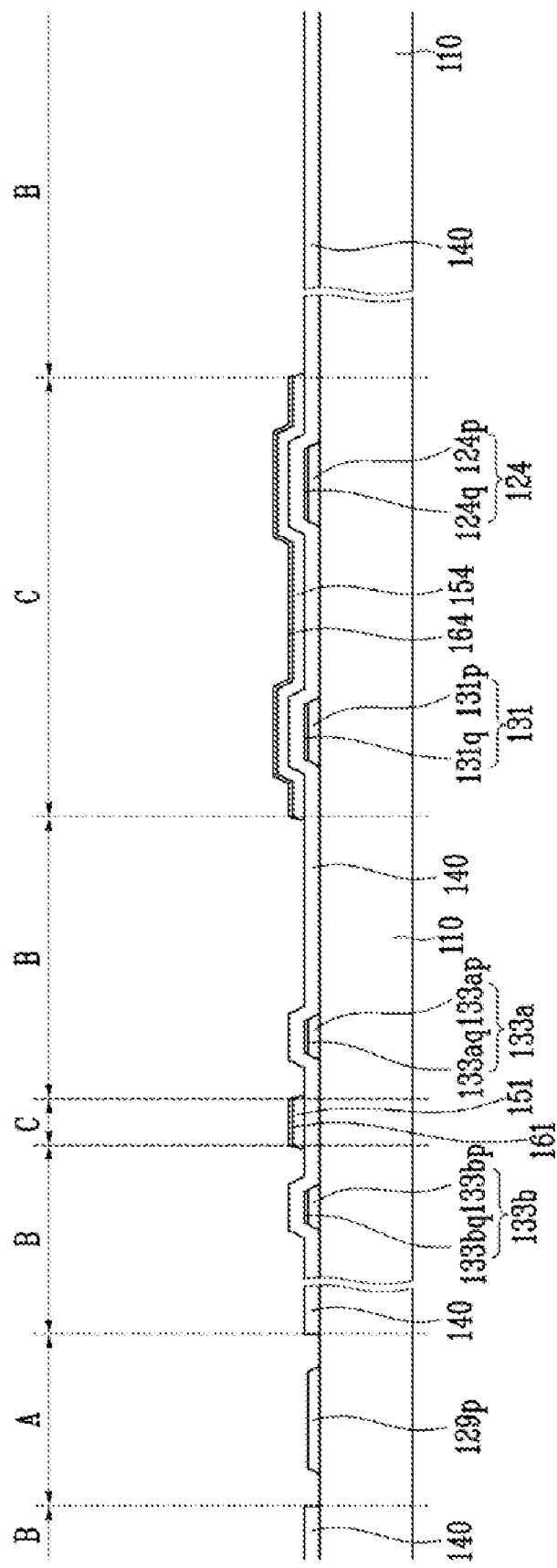
Figure 17:
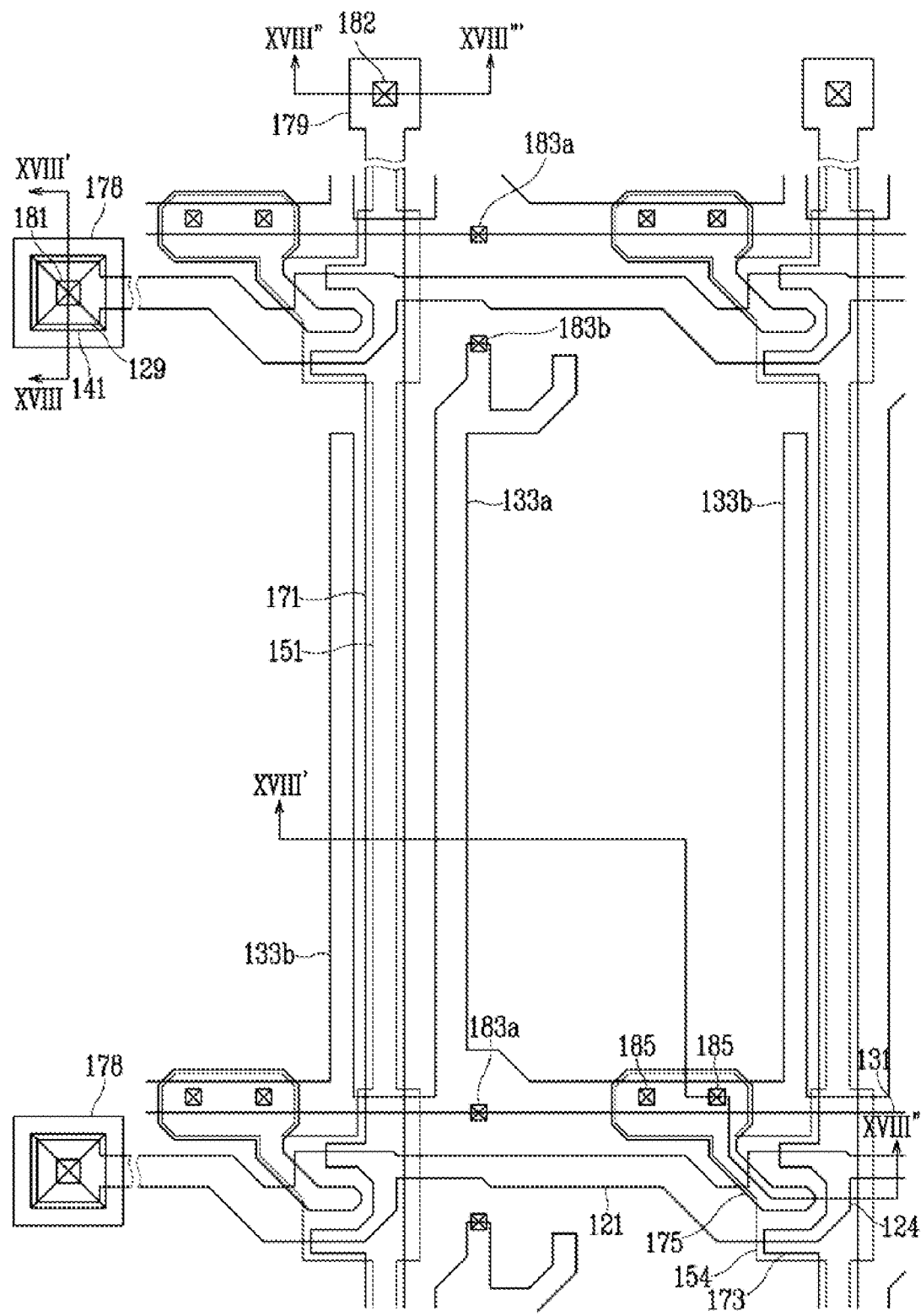
Figure 18:
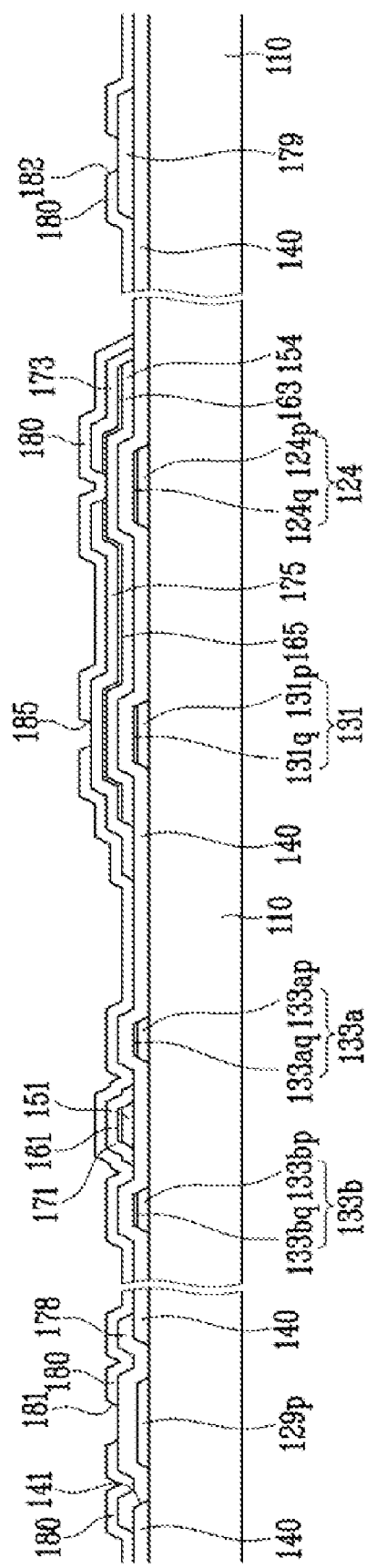
FIG. 18 is a sectional view of the TFT array panel shown in FIG. 17 taken along the line XVIII-XVIII'-XVIII"-XVIII'"

FIG. 14 and FIG. 17 are layout views of the TFT array panel shown in FIG. 3 and FIG. 4 in intermediate steps of a manufacturing method thereof according to another exemplary embodiment of the present invention. FIG. 15 is a sectional view of the TFT array panel shown in FIG. 14 taken along the line XV-XV'-XV''-XV''', FIG. 18 is a sectional view of the TFT array panel shown in FIG. 17 taken along the line XVIII-XVIII'-XVIII''-XVIII''', and FIG. 16A to FIG. 16F are sectional views of the TFT array panel shown in FIG. 14 and FIG. 15 in intermediate steps of a manufacturing method thereof.

Referring to FIG. 14 and FIG. 15, a lower conductive layer and an upper conductive layer are sequentially deposited on an insulation substrate 110 and patterned by photolithography and etching to form a plurality of gate lines 121 and a plurality of storage electrode lines 131 having a double-layered structure. Each gate line 121 includes a plurality of gate electrodes 124 and a gate pad 129, and each storage electrode line 131 includes a plurality of storage electrodes 133a and 133b. In the drawings, the lower layer and the upper layer of the gate lines 121 and the storage electrode lines 131 are denoted by additional characters p and q respectively.

Thereafter, a gate insulating layer 140 having a plurality of contact holes 141, a plurality of (intrinsic) semiconductor stripes 151 including projections 154, and a plurality of extrinsic semiconductor stripes 161 including projections 164 are formed on the substrate having the gate lines 121 and the storage electrode lines 131. Next, the upper layers 129q of the gate pads 129 exposed through the contact holes 141 are eliminated to expose the lower layers 129p thereof.

Now, the formation of the gate insulating layer 140, the extrinsic semiconductor stripes 161, and the (intrinsic) semiconductor stripes 151 shown in FIG. 14 and FIG. 15 will be described in more detail with reference to FIG. 16A to FIG. 16F.

Referring to FIG. 16A, the gate insulating layer 140, an intrinsic a-Si layer 150, and an extrinsic a-Si layer 160 are sequentially deposited on the substrate, and then a photoresist film 400 is coated thereon.

The photoresist film 400 is exposed to light through an exposure mask 60 including a substrate 61 and a plurality of opaque members 62 and then the exposed photoresist film 400 is developed such that the photoresist film 400 located in light transmitting transparent area A is almost eliminated, the photoresist film 400 located in translucent areas B is reduced, and the photoresist film 400 located in light blocking opaque areas C is barely eliminated as shown in FIG. 16B.

Here, unlike the exposure mask shown in FIG. 9A, the width of the light transmitting transparent area A shown in FIG. 16A is rather larger than that of the gate pad 129.

Next, as shown in FIG. 16C, the extrinsic a-Si layer 160, the intrinsic a-Si layer 150 and the gate insulating layer 140 are etched using the remaining photoresist film 400 as a mask to form the contact holes 141 exposing the gate pads 129 in the light transmitting transparent area A. Thereafter, the upper layers 129q of the gate pads 129 exposed through the contact holes 141 are eliminated to expose portions of the lower layers 129p of the gate pad 129.

Ashing is performed on the photoresist film 400 such that the photoresist film 400 disposed in the translucent areas B is all eliminated and the thickness of the photoresist film 400 disposed in light blocking opaque areas C become thin as shown in FIG. 16D.

Next, the extrinsic a-Si layer 160 and the intrinsic a-Si layer 150 are etched using the remaining photoresist film 400 located in the light blocking opaque areas C as a mask to form the extrinsic semiconductor stripes 161 and the intrinsic semiconductor stripes 151 as shown in FIG. 16E.

Finally, the remaining photoresist film 400 located in the light blocking opaque areas C is eliminated by, for example, ashing, as shown in FIG. 16F.

As described above, the gate insulating layer 140, the intrinsic a-Si layer 150, and the extrinsic a-Si layer 160 are patterned using one exposure mask to form the contact holes 141 exposing the gate pads 129 in the gate insulating layer 140 and to form the extrinsic semiconductor stripes 161 and the intrinsic semiconductor stripes 151, simultaneously. Also, the upper layer 129q of the gate pads 129, which includes Al and is readily oxidized or corroded, may be eliminated such that the corrosion of Al may be prevented.

A metal layer is deposited and patterned by photolithography and etching to form a plurality of data lines 171 including source electrodes 173 and data pads 179, a plurality of drain electrodes 175, and a plurality of interconnection members 178. Thereafter, exposed portions of the extrinsic semiconductor stripes 164, which are not covered with the data lines 171 and the drain electrodes 175, are removed to complete a plurality of ohmic contact stripes 161 including projections 163 and a plurality of ohmic contact islands 165 and to expose portions of the intrinsic semiconductor stripes 151.

Next, a passivation layer 180 is deposited and patterned by photolithography (and etching) along with the gate insulating layer 140 to form a plurality of contact holes 181, 182, 183a, 183b, and 185 as shown in FIG. 17 and FIG. 18.

Finally, a plurality of pixel electrodes 191, a plurality of contact assistants 81 and 82, and a plurality of overpasses 83 are formed on the passivation layer 180 as shown in FIG. 3 and FIG. 4.

Now, a TFT array panel according to another exemplary embodiment of the present invention will be described in detail with reference to FIG. 19 and FIG. 20.

Figure 19:
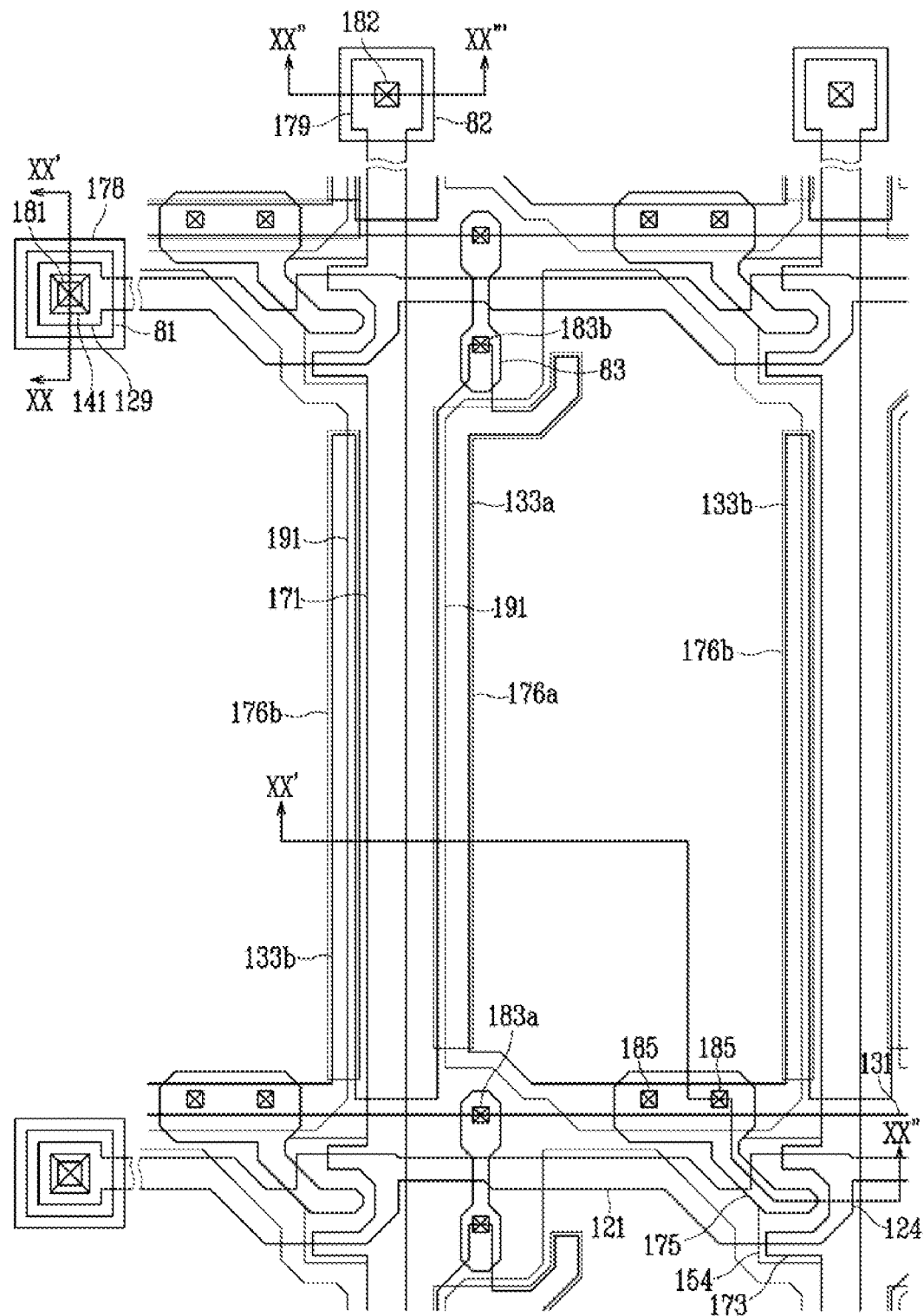
FIG. 19 is a layout view of a TFT array panel according to an exemplary embodiment of the present invention.
Figure 20:
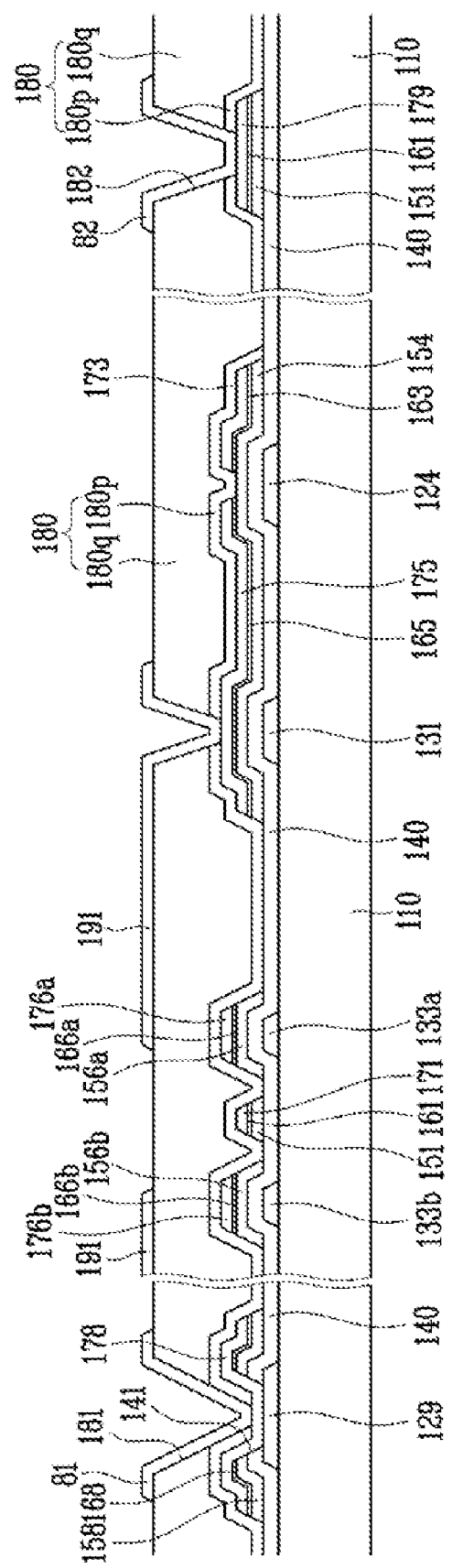
FIG. 20 is a sectional view of the TFT array panel shown in FIG. 19 taken along the line XX-XX'-XX"-XX'"

FIG. 19 is a layout view of a TFT array panel according to another exemplary embodiment of the present invention, and FIG. 20 is a sectional view of the TFT array panel shown in FIG. 19 taken along the line XX-XX'-XX"-XX'".

As shown in FIG. 19 and FIG. 20, a layered structure of a TFT array panel according to the present exemplary embodiment is substantially similar as that shown in FIG. 1 and FIG. 2.

A plurality of gate lines 121 including a plurality of gate electrodes 124 and a plurality of gate pads 129, and a plurality of storage electrode lines 131 including a plurality of storage electrodes 133a and 133b are formed on a substrate 110. The gate lines 121 and the storage electrode lines 131 include an Al-containing metal such, for example, as Al and an Al alloy.

A gate insulating layer 140 having a plurality of contact holes 141, a plurality of semiconductor stripes 151 including projections 154, a plurality of ohmic contact stripes 161 including projections 164, and a plurality of ohmic contact islands 165 are sequentially formed on the gate lines 121 and the storage electrode lines 131.

A plurality of data lines 171 including source electrodes 173 and data pads 179, a plurality of drain electrodes 175, and a plurality of interconnection member 178 are formed on the ohmic contacts 161 and 165 and the gate insulating layer 140, and a passivation layer 180 is formed thereon.

The gate-insulating layer 140 and the passivation layer 180 have a plurality of contact holes 181, 182, 183a, 183b, and 185.

A plurality of pixel electrodes 191, a plurality of contact assistants 81 and 82, and a plurality of overpasses 83 are formed on the passivation layer 180.

However, unlike the TFT array panel shown in FIG. 1 and FIG. 2, the TFT array panel shown in FIG. 19 and FIG. 20 includes a plurality of reinforcement members 1761a and 176b located on the storage electrodes 133a and 133b and made of the same layer as the data lines 171.

Also, a plurality of ohmic contact islands 166a and 166b, and a plurality of semiconductor islands 156a and 156b are disposed under the reinforcement members 176a and 176b and have substantially the same planar shapes as the reinforcement members 176a and 176b.

The reinforcement members 176a and 176b prevent the storage electrodes 133a and 133b including Al from exposing and corroding along with the ohmic contact islands 166a and 166b and the semiconductor islands 156a and 156b. Also, a plurality of ohmic contact islands 168 and a plurality of semiconductor islands 158 are disposed under the interconnection members 178 and have substantially the same planar shapes as the interconnection members 178.

The semiconductor stripes 151 also have substantially the same planar shapes as the data lines 171 and the drain electrodes 175 as well as the ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175.

The contact holes 141 run through the semiconductor islands 158 and the ohmic contact islands 168 with substantially the same planar shapes as each other such that the interconnection member 178 located thereon is connected to the gate pads 129. The gate lines 121 and the storage electrode lines 131 have a single layer including Al. Also, the passivation layer 180 has a double-layered structure including a lower inorganic layer 180p and an upper organic layer 180q. The upper organic layer 180q has a substantially flat surface.

Many characteristics of the TFT array panel shown in FIG. 1 and FIG. 2 can be applied to the TFT array panel shown in FIG. 19 and FIG. 20.

Now, a manufacturing method of the TFT array panel shown in FIG. 19 and FIG. 20 according to the another exemplary embodiment of the present invention will be described in detail with reference to FIG. 21 to FIG. 27, along with FIG. 19 and FIG. 20.

Figure 21:
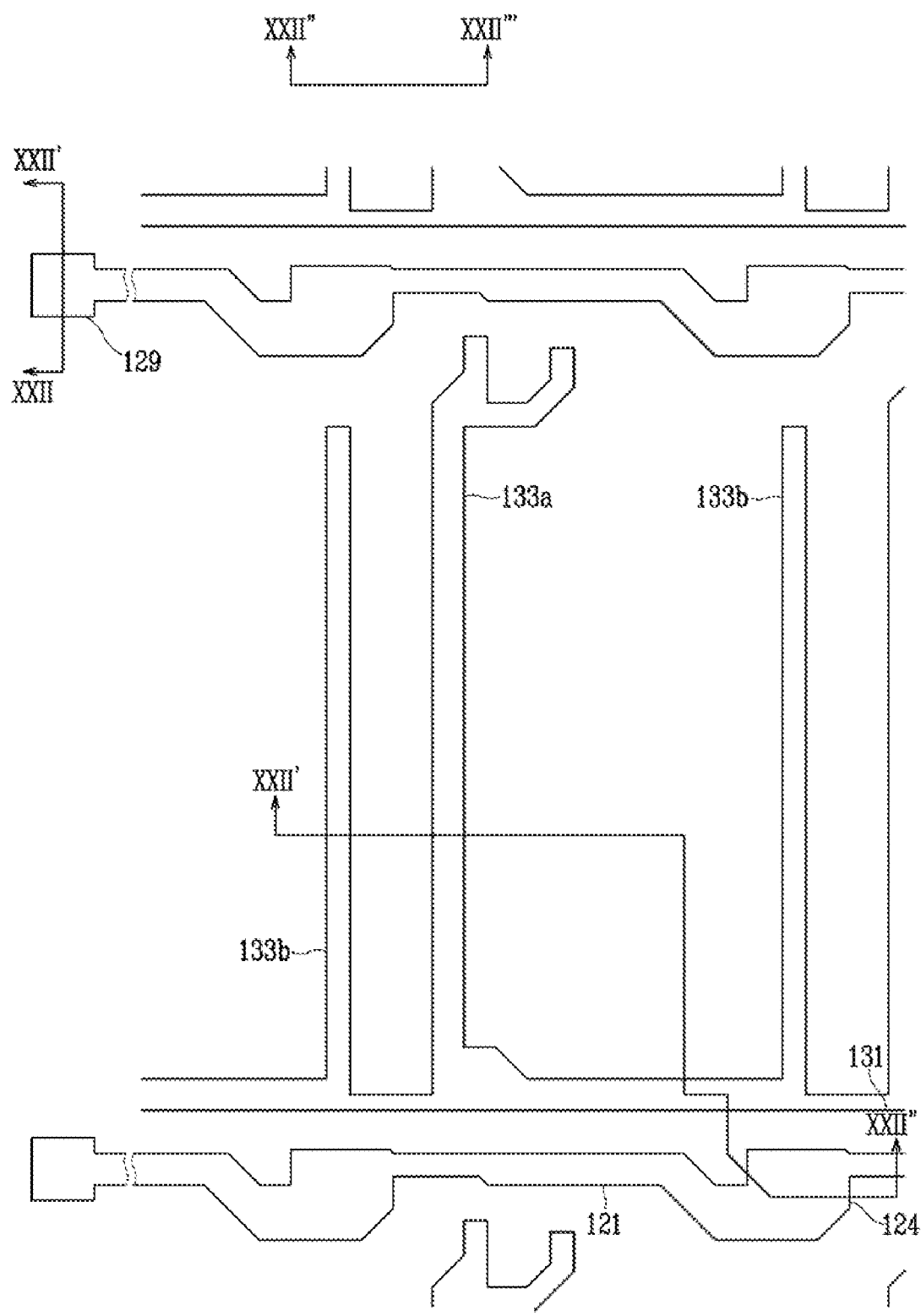
FIG. 21, FIG. 23, and FIG. 26 are layout views of the TFT array panel shown in FIG. 19 and FIG. 20 in intermediate steps of a manufacturing method thereof according to an exemplary embodiment of the present invention.
Figure 22:
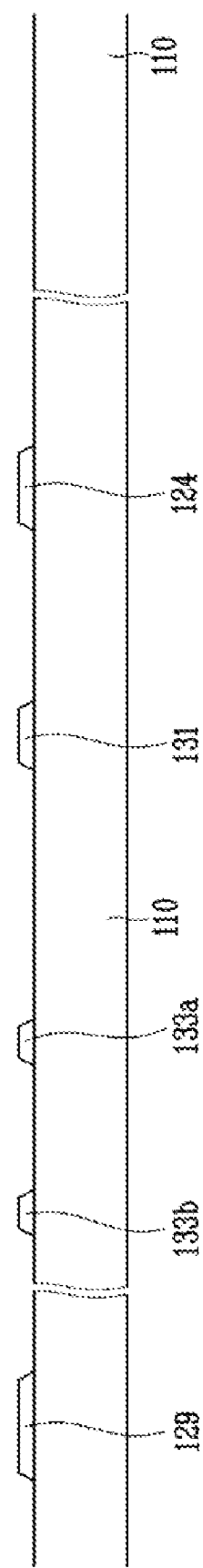
FIG. 22 is a sectional view of the TFT array panel shown in FIG. 21 taken along the line XXII-XXII'-XXII"-XXII'"
Figure 23:
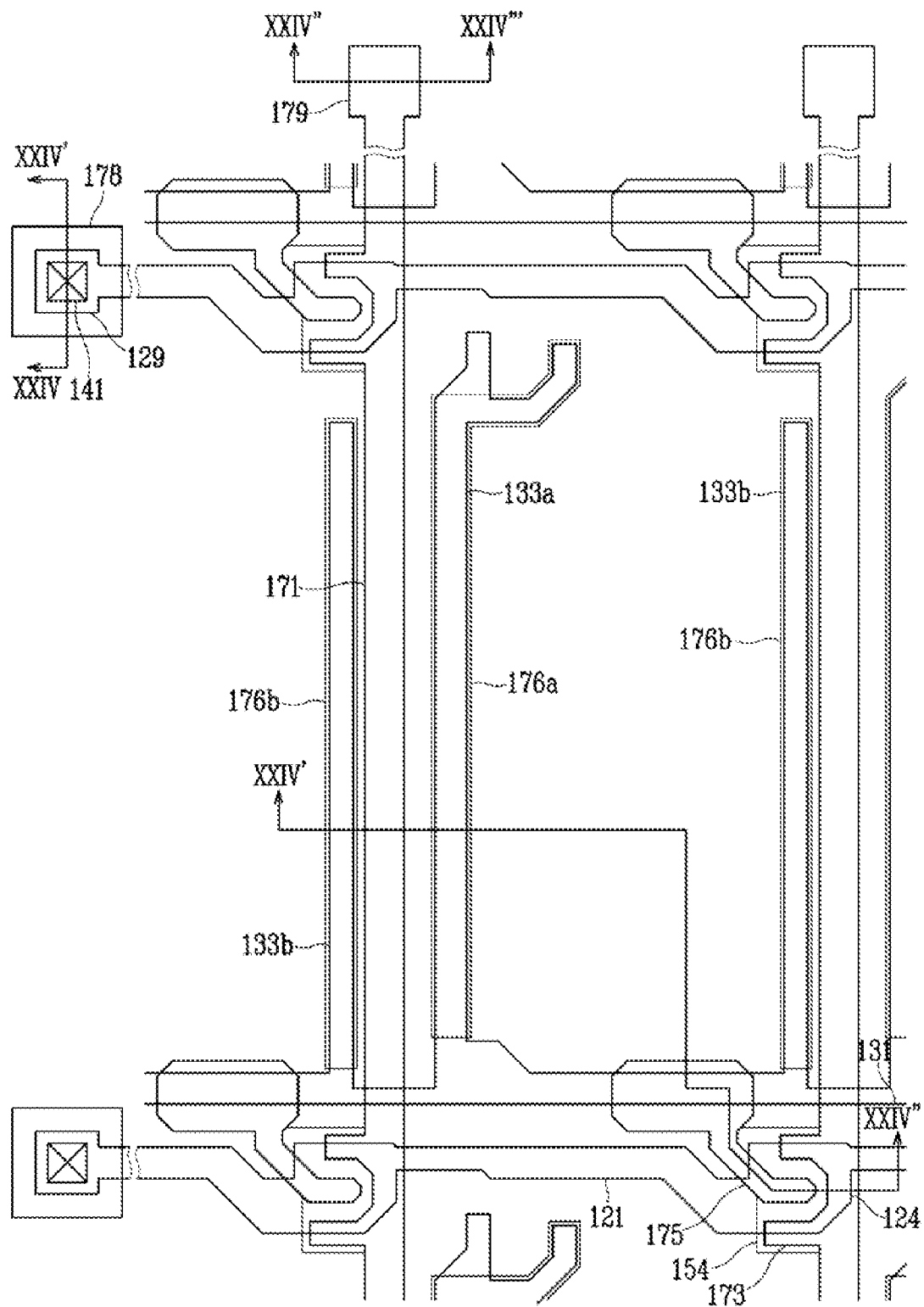
Figure 24:
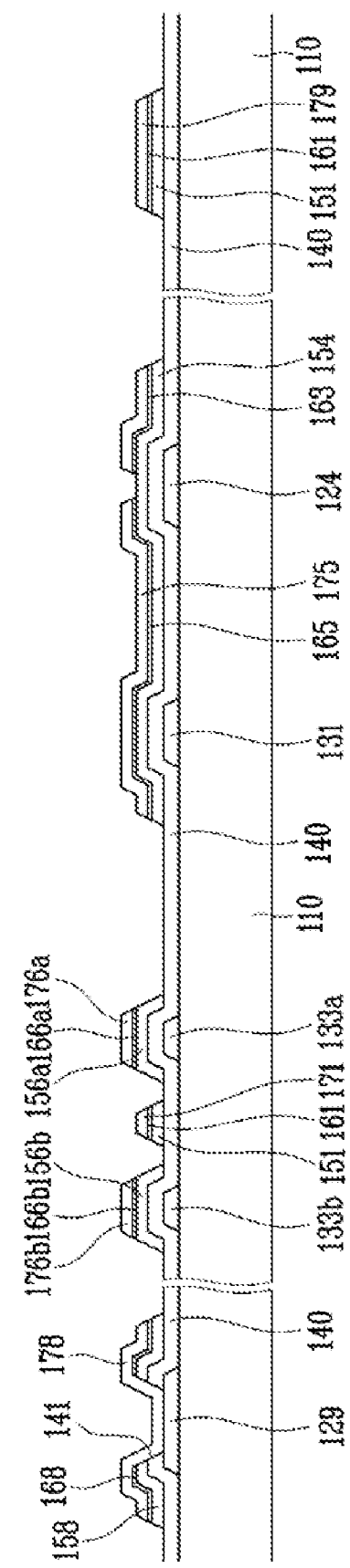
FIG. 24 is a sectional view of the TFT array panel shown in FIG. 23 taken along the line XXIV-XXIV'-XXIV"-XXIV'"
Figure 25A:
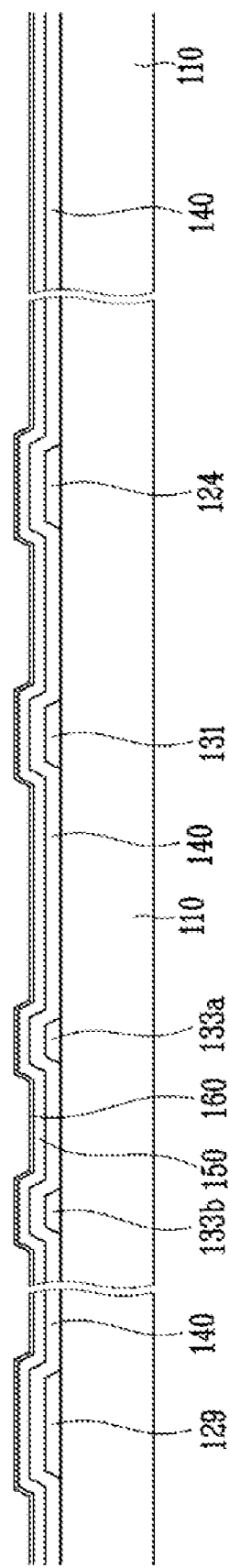
FIG. 25A to FIG. 25F are sectional views of the TFT array panel shown in FIG. 23 and FIG. 24 in intermediate steps of a manufacturing method thereof.
Figure 25B:
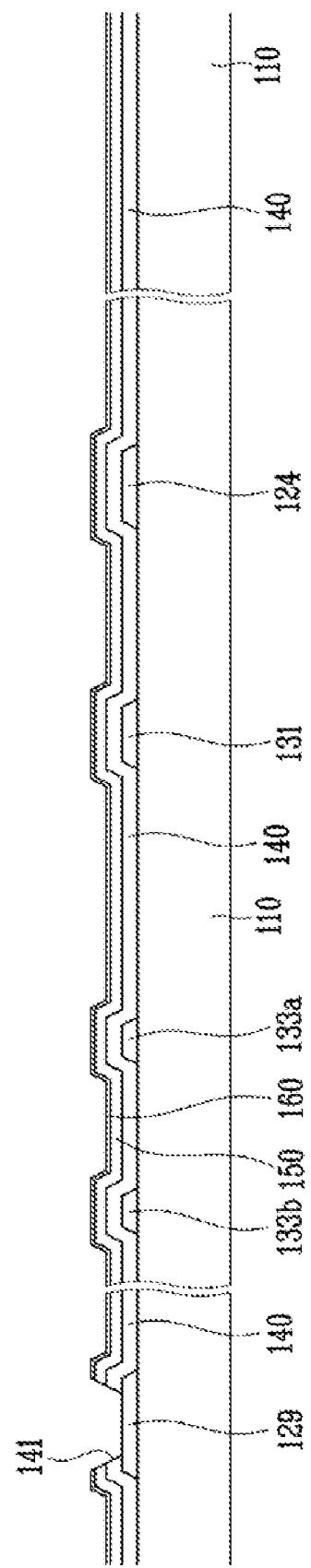
Figure 25C:
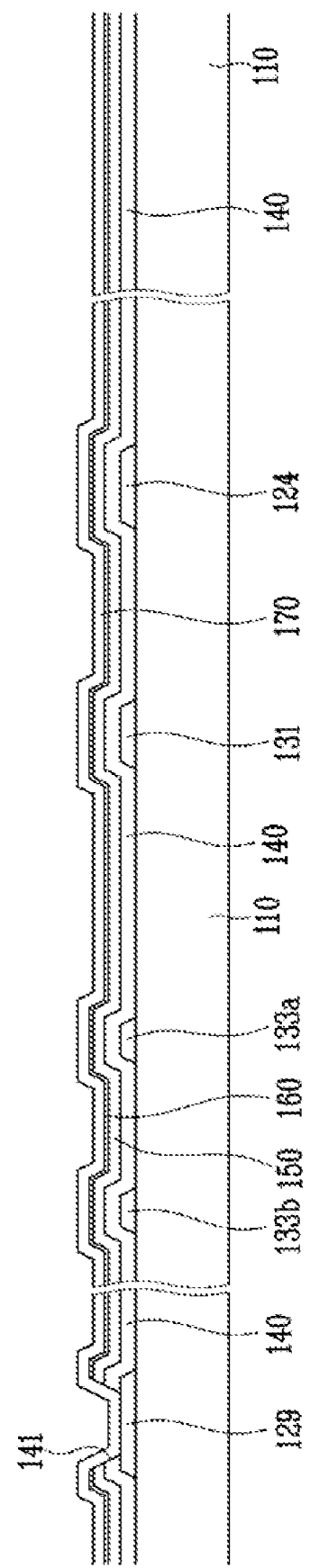
Figure 25D:
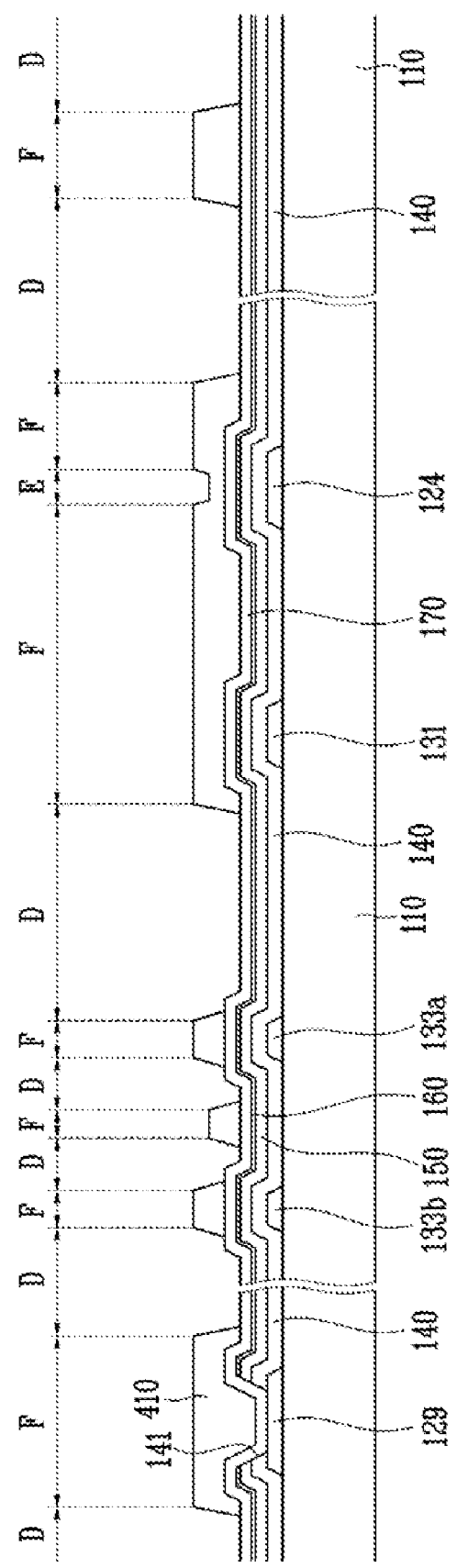
Figure 25E:
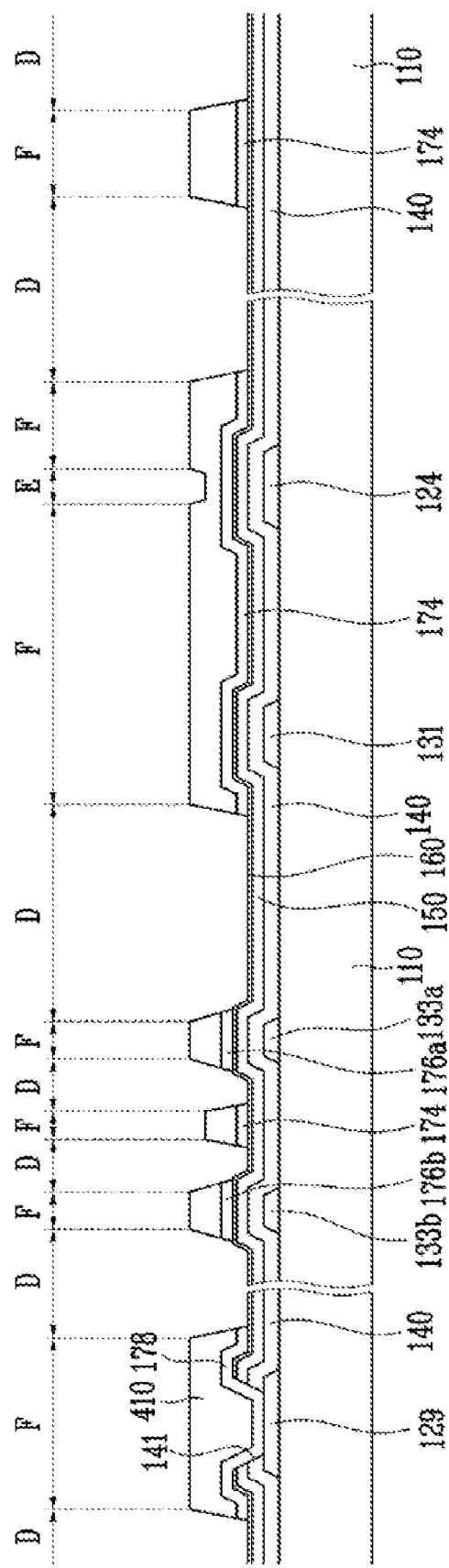
Figure 25F:
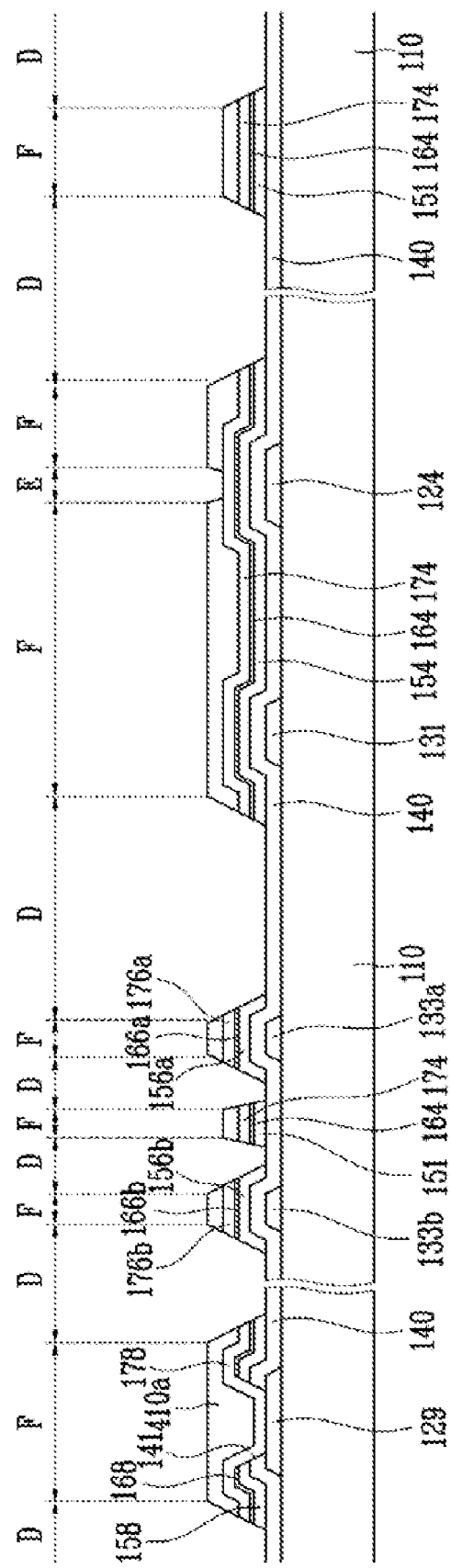
Figure 26:
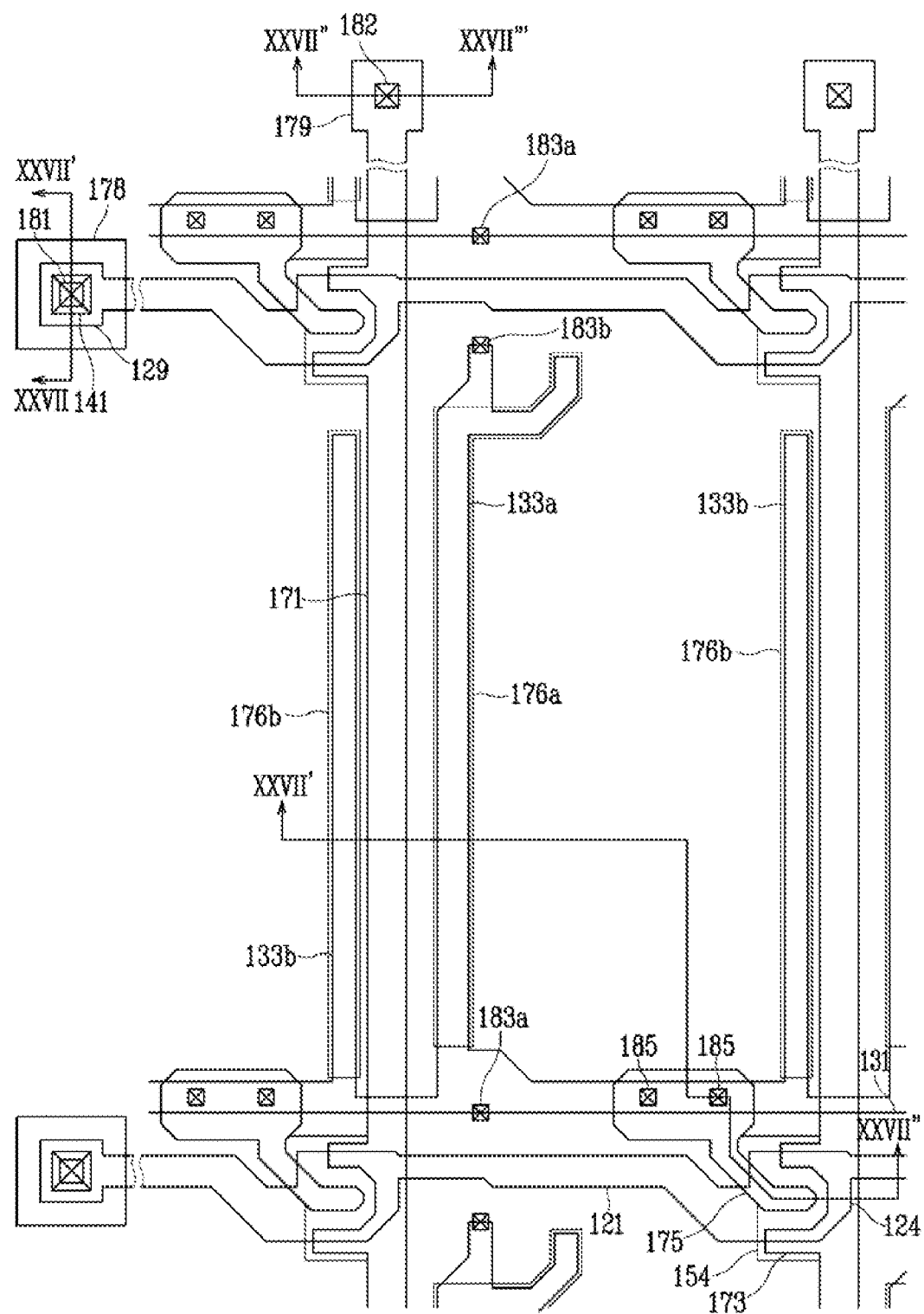
Figure 27:
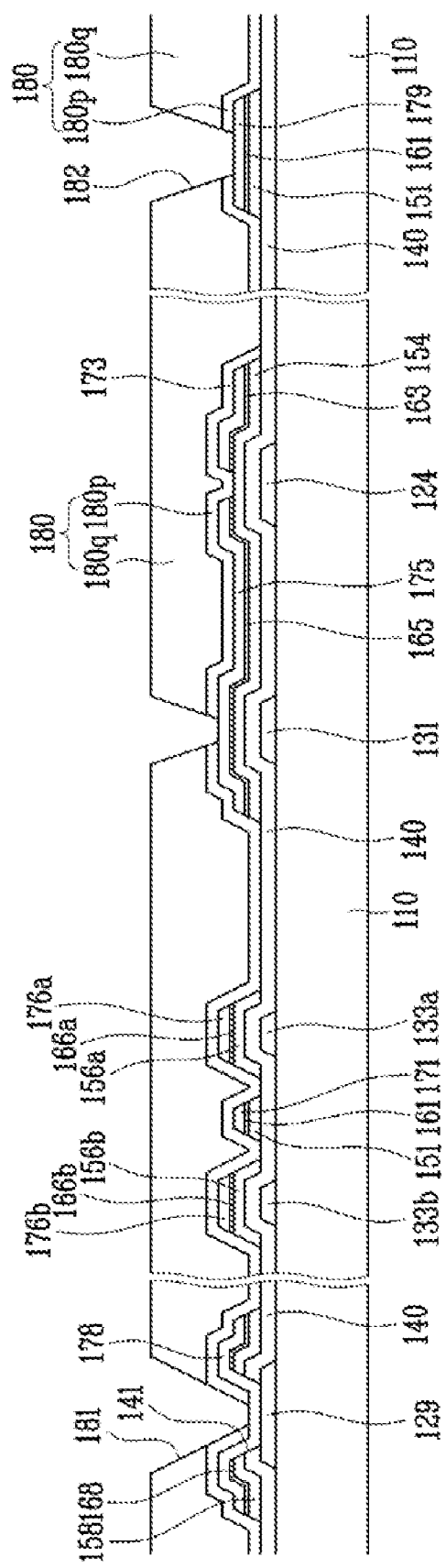
FIG. 27 is a sectional view of the TFT array panel shown in FIG. 26 taken along the line XXVII-XXVII'-XXVII"-XXVII'"

FIG. 21, FIG. 23, and FIG. 26 are layout views of the TFT array panel shown in FIG. 19 and FIG. 20 in intermediate steps of a manufacturing method thereof according to another exemplary embodiment of the present invention. FIG. 22 is a sectional view of the TFT array panel shown in FIG. 21 taken along the line XXII-XXII'-XXII"-XXII'", FIG. 24 is a sectional view of the TFT array panel shown in FIG. 23 taken along the line XXIV-XXIV'-XXIV"-XXIV'", and FIG. 27 is a sectional view of the TFT array panel shown in FIG. 26 taken along the line XXVII-XXVII'-XXVII"-XXVII'". FIG. 25A to FIG. 25F are sectional views of the TFT array panel shown in FIG. 23 and FIG. 24 in intermediate steps of a manufacturing method thereof.

An Al containing metal layer such as such Al and an Al alloy such as AlNd is deposited on a substrate by, for example, sputtering, and then the metal layer is patterned to form a plurality of gate lines 121 including a plurality of gate electrodes 124 and gate pads 129, and a plurality of storage electrode lines 131 including a plurality of storage electrodes 133a and 133b.

Referring to FIG. 23 and FIG. 24, a gate insulating layer 140, a plurality of semiconductor stripes 151 including projections 154, a plurality of semiconductor islands 156a, 156b, and 158, a plurality of ohmic contact stripes 161 including projections 163, and a plurality of extrinsic semiconductor islands 165, 166a, 166b, 168, and 169 are formed, and a plurality of data line 171 including a plurality of source electrodes 173 and data pads 179, a plurality of drain electrodes 175, a plurality of interconnection members 178, and a plurality of reinforcement members 176a and 176b are formed simultaneously by one photolithography step and by several etching steps.

Here, the extrinsic semiconductor islands 168, the semiconductor islands 158, and the gate-insulating layer 140 have a plurality of contact holes 141 exposing portions of the gate pads 129.

Now, the formation of the TFT array panel shown in FIG. 23 and FIG. 24 will be described in more detail with reference to FIG. 25A to FIG. 25F.

Referring to FIG. 25A, a gate-insulating layer 140, an intrinsic a-Si layer 150, and an extrinsic a-Si layer 160 are sequentially deposited on the substrate by, for example, chemical vapor deposition (CVD). Next, the extrinsic a-Si layer 160, the intrinsic a-Si layer 150, and the gate insulating layer 140 are etched to form a plurality of contact holes 141 exposing portions of the gate pads 129 as shown in FIG. 25B.

A data metal layer 170 is deposited as shown in FIG. 25C by, for example, sputtering, and a photoresist film 410 is formed on the data conductive layer 170 as shown in FIG. 25D.

Here, the photoresist film 410 has a position-dependent thickness such that the thickness of the photoresist film 410 located in light blocking opaque areas F is thickest, that of the photoresist film 410 located in translucent areas E is thinner than that of the photoresist film 410 located in light blocking opaque areas F, and that of the photoresist film 410 located in light transmitting transparent areas D is about zero.

Referring to FIG. 25E, the exposed data metal layer 170 in the light transmitting transparent areas D is etched by using the photoresist film 410 as a mask to form a plurality of data conductors 174, a plurality of reinforcement members 176a and 176b, and a plurality of interconnection members 178. Thereafter, the exposed extrinsic a-Si layer 160 and intrinsic a-Si layer 150 in the light transmitting transparent areas D are etched to form a plurality of extrinsic semiconductor stripes 164, a plurality of extrinsic semiconductor islands 166a, 166b, and 168, the intrinsic semiconductor stripes 151 including a plurality of projections 154, and a plurality of intrinsic semiconductor islands 156a, 156b, and 158.

Next, ashing is performed on the photoresist film 410 such that the photoresist film disposed in the translucent areas E is all eliminated and the thickness of the photoresist film disposed in light blocking opaque areas F become thin as shown in FIG. 25F.

Thereafter, the data conductors 174 are etched by using the remaining photoresist films 410 in the light blocking opaque areas F as a mask to form a plurality of data lines 171 including a plurality of source electrodes 173, and a plurality of drain electrodes 175, and to simultaneously expose underlying portions of the extrinsic semiconductor stripes 164 between the source electrodes 173 and the drain electrodes 175.

Finally, the exposed extrinsic semiconductor stripes 164 between the source electrodes 173 and the drain electrodes 175 are etched to form the ohmic contacts 161 and 165 and to expose portions of the intrinsic semiconductor stripes 154.

Next, a passivation layer 180 is deposited and patterned by photolithography (and etching) along with the gate insulating layer 140 to form a plurality of contact holes 181, 182, 183a, 183b, and 185 as shown in FIG. 26 and FIG. 27.

Finally, a plurality of pixel electrodes 191, a plurality of contact assistants 81 and 82, and a plurality of overpasses 83 are formed on the passivation layer as shown in FIG. 19 and FIG. 20.

Now, an LCD according to another exemplary embodiment of the present invention will be described in detail with reference to FIG. 28.

Figure 28:
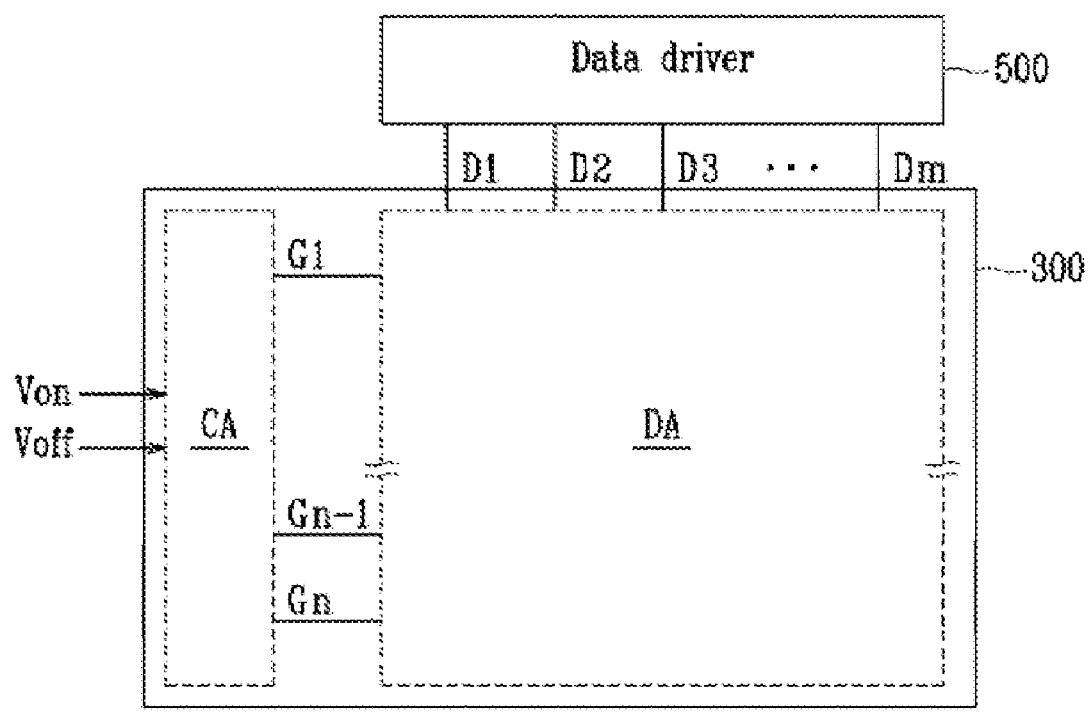
FIG. 28 is a block diagram of an LCD according to an exemplary embodiment of the present invention.

FIG. 28 is a block diagram of an LCD according to an exemplary embodiment of the present invention.

As shown in FIG. 28, the LCD according to an exemplary embodiment of the present invention includes a liquid crystal panel assembly 300, a data driver 500 connected to the assembly 300, a gray voltage generator connected to the data driver 500, and a signal controller controlling the assembly 300 and the data driver 500.

The liquid crystal panel assembly 300 includes a TFT array panel and a common electrode panel facing each other, and an LC layer interposed between the two display panels. The TFT array panel includes a display area DA directly related to an image display and a control region CA related to the gate driver.

In the display area DA, a plurality of gate lines G1-Gn, a plurality of data lines D1-Dm, a plurality of storage electrode lines, a plurality of pixel electrodes, and a plurality of TFTs are formed.

In the control region CA, the gate driver generates gate signals and a plurality of signal transmitting lines transmit all kinds of signals from outside to the gate driver. The gate driver may be a shift register including a plurality of sequentially connected stages.

Now, a TFT array panel of the LCD shown in FIG. 28 will be described in detail with reference to FIG. 29 to FIG. 31.

Figure 29:
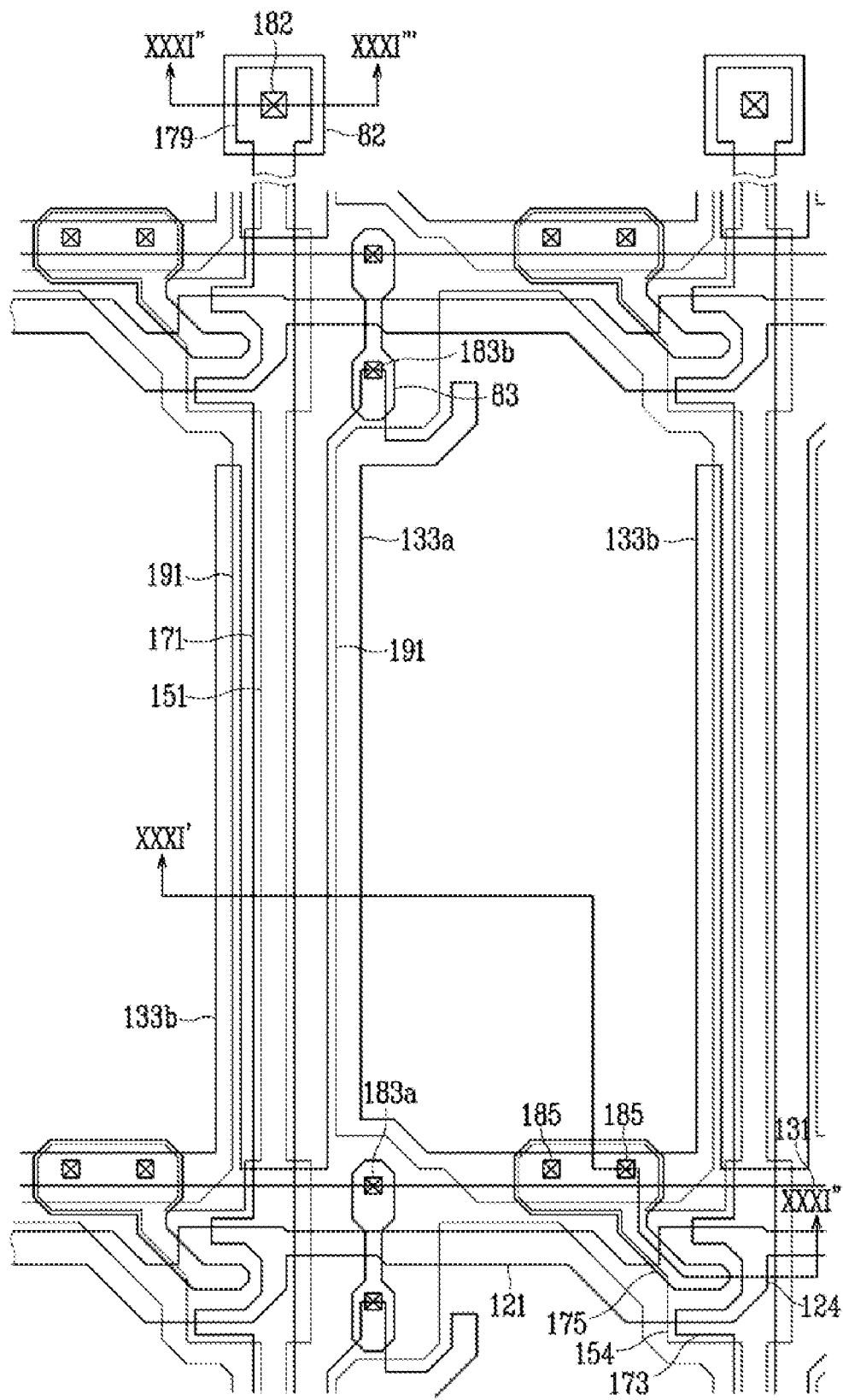
FIG. 29 is a layout view representing a portion of display area of the LCD shown in FIG. 28.
Figure 30:
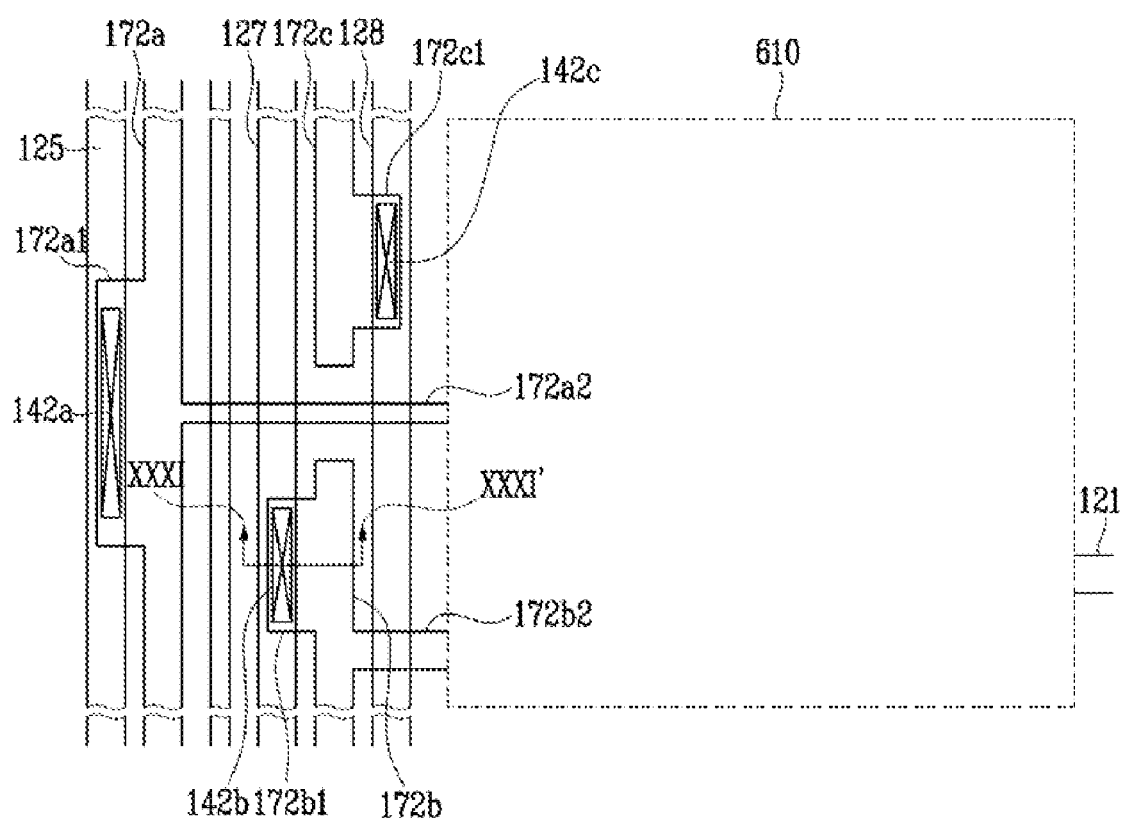
FIG. 30 is a layout view representing a portion of driving area of the LCD shown in FIG. 28.
Figure 31:
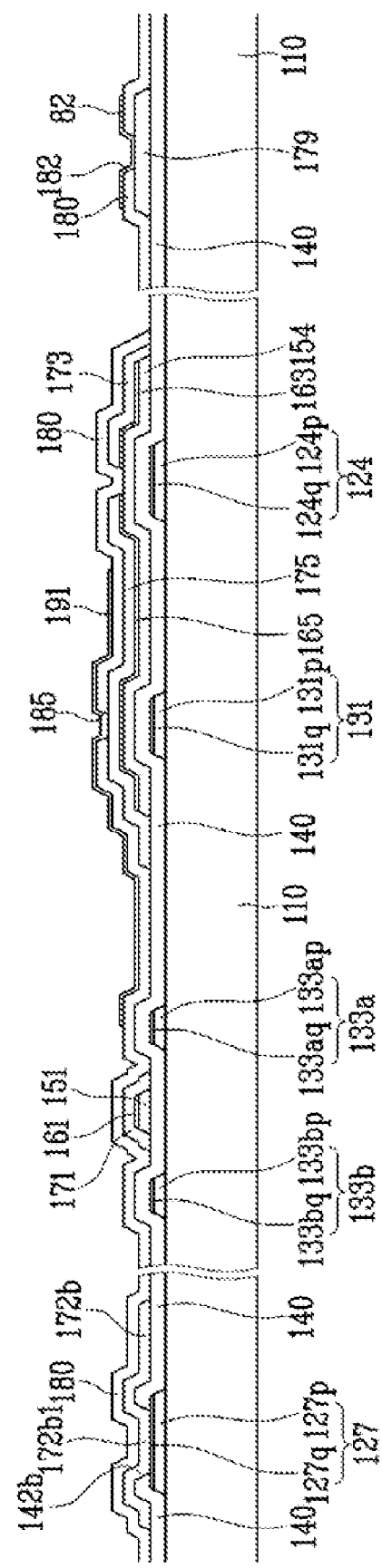
FIG. 31 is a sectional view of the TFT array panel shown in FIG. 29 and FIG. 30 taken along the line XXXI-XXXI'-XXXI"-XXXI'"

FIG. 29 is a layout view representing a portion of a display area of the LCD shown in FIG. 28, FIG. 30 is a layout view representing a portion of a driving area of the LCD shown in FIG. 28, and FIG. 31 is a sectional view of the TFT array panel shown in FIG. 29 and FIG. 30 taken along the line XXXI-XXXI'-XXXI"-XXXI'''.

The layered structure of the display unit DA is substantially similar to that shown in FIG. 1 and FIG. 2, and therefore the control region CA is primarily described.

Referring to FIG. 30, the control region CA includes a plurality of circuit portions 610 corresponding to one stage of a shift register and generating gate signals, and a plurality of signal transmission lines transmitting all kinds of signals. The circuit portion 610 includes a plurality of TFTs and a plurality of connecting lines. The TFTs are connected to each other through the connecting lines, and the TFTs are connected to the signal transmitting lines through the connecting lines.

Now, the layered structure of the TFT array panel will be described.

A plurality of gate lines 121 and a plurality of storage electrode lines 131 in the display area DA, and a plurality of gate-layer signal transmission lines in the control region CA, are formed on an insulation substrate 110.

Each gate line 121 includes a plurality of gate electrodes 124, and extends to the control region CA to be directly connected thereto, and therefore there is no gate pad.

The gate-layer signal transmission lines 125-128 transmit signals such as voltages, that are required for controlling the circuit portion 610 and are inputted from the outside, and extend substantially in the longitudinal direction.

As shown in FIG. 1 and FIG. 2, the gate lines 121, the storage electrode lines 131 and the gate-layer signal transmission lines 125-128 have a double-layered structure including a lower layer and an upper layer disposed on the lower layer.

In FIG. 31, each lower film and each upper film are denoted by additional characters p and q, respectively.

A gate-insulating layer 140 is formed on the gate lines 121, the storage electrode lines 131, and the gate-layer signal transmission lines 125-128. The gate-insulating layer 140 has a plurality of contact hole 142a, 142b, and 142c exposing portions of the gate-layer signal transmission lines 125, 127, and 128, respectively.

On the gate insulating layer 140, a plurality of semiconductor stripes 151 are formed, and a plurality of ohmic contact stripes 161 including projections 163 and a plurality of ohmic contact islands 165 are formed thereon in the display area DA.

On the ohmic contacts 161 and 165 and gate insulating layer 140, a plurality of data lines 171 and a plurality of drain electrodes 175 are formed in the display area DA and a plurality of data-layer signal transmission lines 172a, 172b, and 172c are formed in the control region CA.

Each data line 171 includes a plurality of source electrodes 173 and a data pad 179.

Like the gate-layer signal transmission lines 125-128 the data-layer signal transmission lines 172a-172c transmit signals such as voltages, that are required for controlling the circuit portion 610 and are inputted from the outside, and extend substantially in the longitudinal direction. The data-layer signal transmission lines 172a-172c include a plurality of projections 172a1, 172b1, and 172c1 extending to the contact holes 142a-142c to be connected to the gate-layer signal transmission lines 125, 127, and 128 through the contact holes 142a-142c. A portion of the data-layer signal transmission lines 172a and 172b include a plurality of extensions 172a2 and 172b2 extending toward the circuit portion 610 to be connected to the circuit portion 610.

A passivation layer 180 is formed on the data lines 171, the drain electrodes 175 the data-layer signal transmission lines 172a-172c, and the exposed portions of the semiconductor stripes 151. The passivation layer 180 includes a plurality of contact holes 182 and 185 exposing the data pads 179 and the drain electrodes 175, respectively. The passivation layer 180 and the gate insulating layer 140 have a plurality of contact holes 183a exposing portions of the lower films 133ap of the storage electrode lines 131 near the fixed end portions of the first storage electrodes 133a, and a plurality of contact holes 183b exposing the lower film 133bp of the linear branches of the free end portions of the first storage electrodes 133a.

A plurality of pixel electrodes 191, a plurality of overpasses 83, and a plurality of contact assistants 81 and 82 are formed on the passivation layer 180.

As described above, TFTs and connecting lines are formed in the circuit portion 610, the TFTs have substantially the same layered structure as TFTs formed in the display area DA, and the connecting lines are made of the same layer as the gate lines 121 or the data lines 171. The gate-layer connecting lines and the data-layer connecting lines may be connected to each other through contact holes formed in the gate insulating layer 140.

Accordingly, the gate-layer signal transmission lines 125, 127, and 128 and the data-layer signal transmission lines 172a-177c are directly connected to each other, without additional connecting members made of the same material as the pixel electrodes 191, through the contact holes 181a, 181b, and 181c. Therefore, oxidation and corrosion of an Al-containing metal that occur by direct contact of ITO or IZO and Al or an Al alloy may be prevented.

Many characteristics of the TFT array panel shown in FIG. 1 and FIG. 2 can be applied to the TFT array panel shown in FIG. 29 to FIG. 31.

Now, a manufacturing method of the TFT array panel shown in FIG. 29 to FIG. 31 according to the another exemplary embodiment of the present invention will be described in detail with reference to FIG. 32 to FIG. 36 along with FIG. 29 to FIG. 31.

Figure 32:
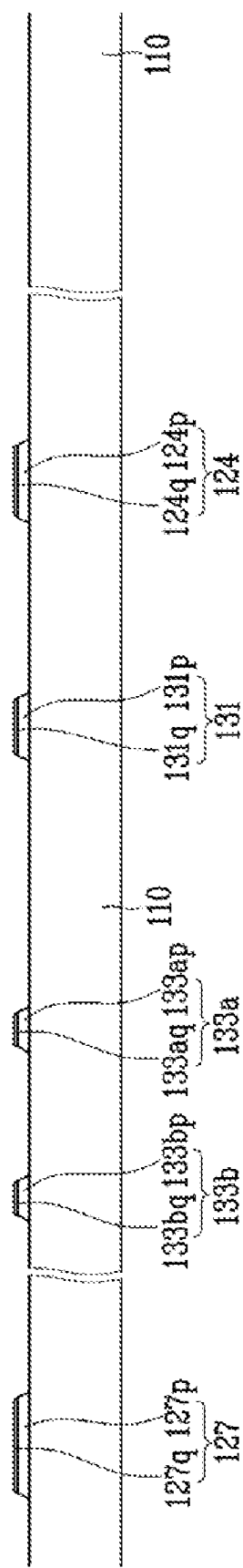
FIG. 32, FIG. 33, FIG. 35, and FIG. 36 are layout views of the TFT array panel shown in FIG. 31 in intermediate steps of a manufacturing method thereof according to an exemplary embodiment of the present invention.
Figure 33:
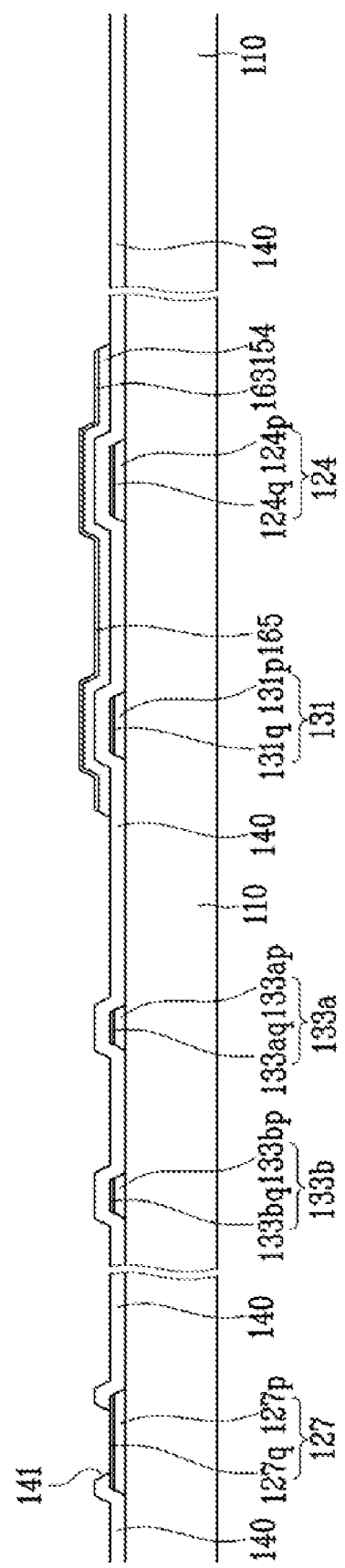

FIG. 32, FIG. 33, FIG. 35, and FIG. 36 are layout views of the TFT array panel shown in FIG. 31 in intermediate steps of a manufacturing method thereof according to another exemplary embodiment of the present invention, and FIG. 34A to FIG. 34F are sectional views of the TFT array panel shown in FIG. 33 in intermediate steps of a manufacturing method thereof.

Referring to FIG. 32, a plurality of gate lines 121 including a plurality of gate electrodes 124 and gate pads 129, a plurality of storage electrode lines 131 including storage electrodes 133a and 133b, and a plurality of gate-layer signal transmission lines 125, 126, 127, and 128 are formed on an insulation substrate 110. The gate line 121, the storage electrode lines 131, and the gate-layer signal transmission lines 125-128 have a dual-layered structure including a lower layer, and the upper layer and the lower layer are denoted by additional characters p and q, respectively in the drawings.

Next, a gate insulating layer 140 having a plurality of contact holes 141, a plurality of (intrinsic) semiconductor stripes 151 including projections 154, and a plurality of extrinsic semiconductor stripes 161 including projections 164 are formed as shown in FIG. 33.

Now, the formation of the TFT array panel shown in FIG. 33 will be described in more detail with reference to FIG. 34A to FIG. 34F.

Figure 34A:
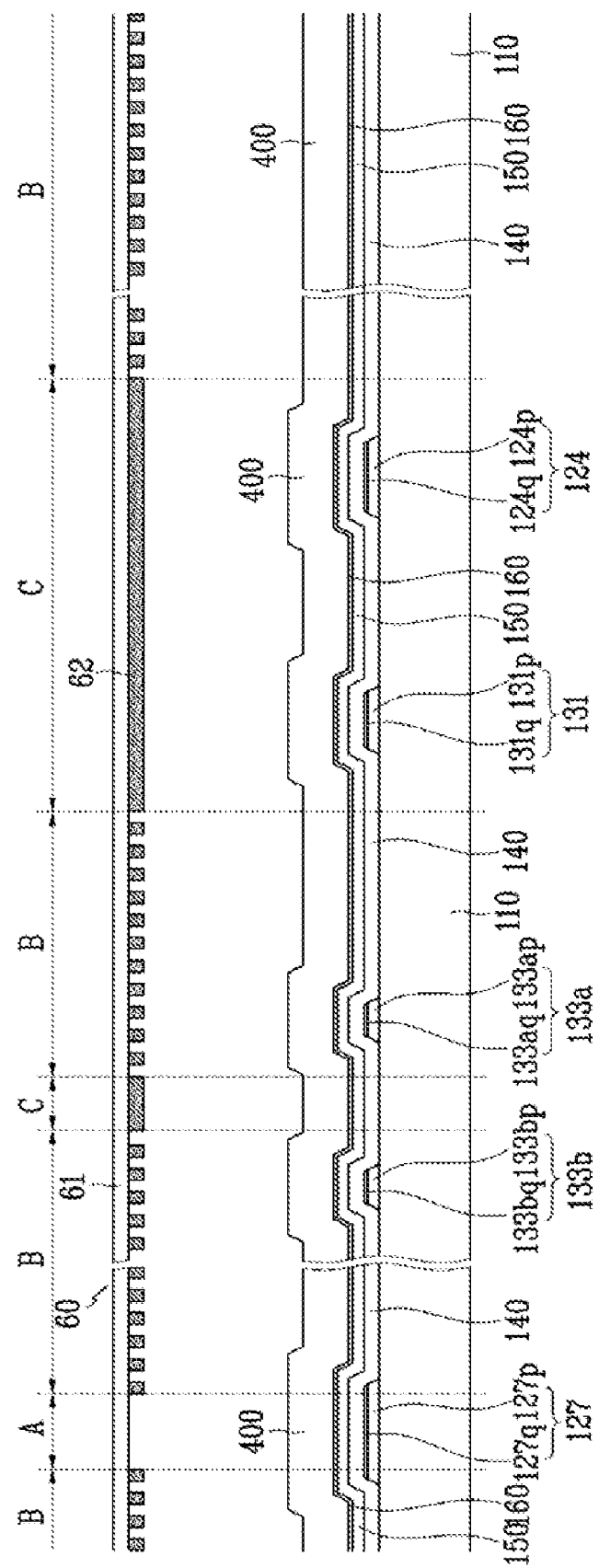
FIG. 34A to FIG. 34F are sectional views of the TFT array panel shown in FIG. 33 in intermediate steps of a manufacturing method thereof.

Referring to FIG. 34A, the gate insulating layer 140, an intrinsic a-Si layer 150, and an extrinsic a-Si layer 160 are sequentially deposited on the substrate by, for example, plasma enhanced chemical vapor deposition (PECVD), and then a photoresist film 400 is coated thereon.

Figure 34B:
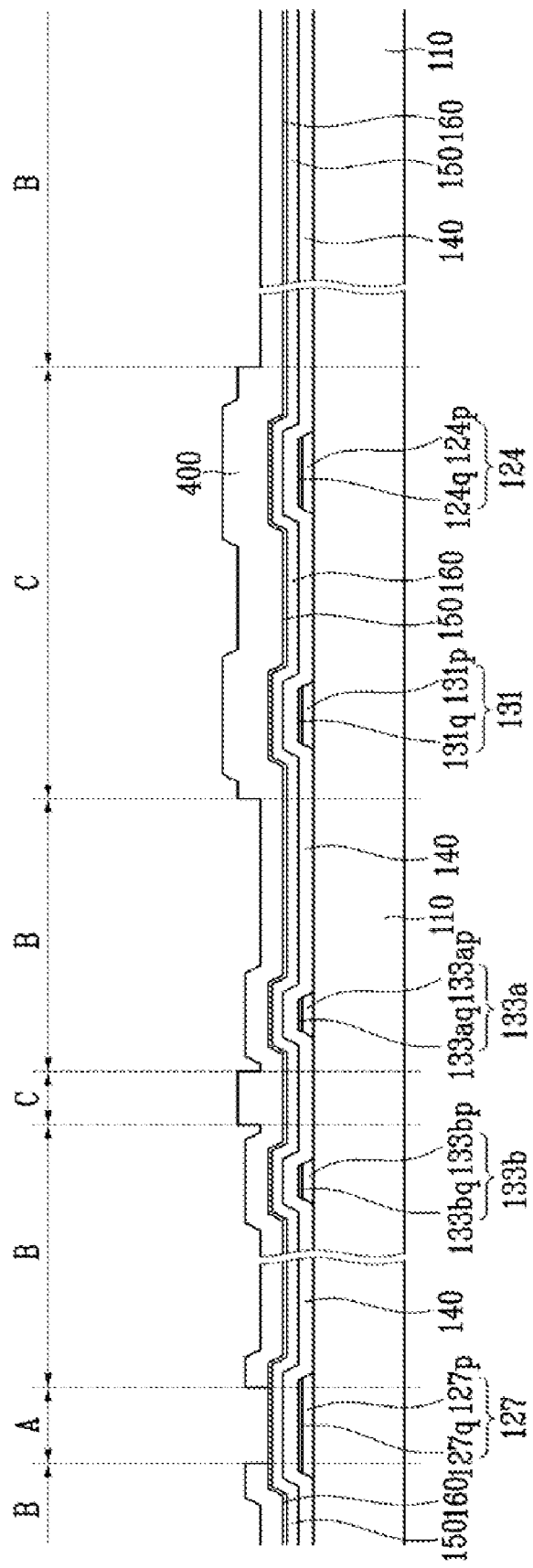

Next, the photoresist film 400 is exposed through an exposure mask 60 and the exposed photoresist film 400 is developed. The exposed and developed photoresist film 400 has a position-dependent thickness as shown in FIG. 34B. The photoresist film 400 includes light transmitting transparent area A, translucent areas B, and light blocking opaque areas C.

Figure 34C:
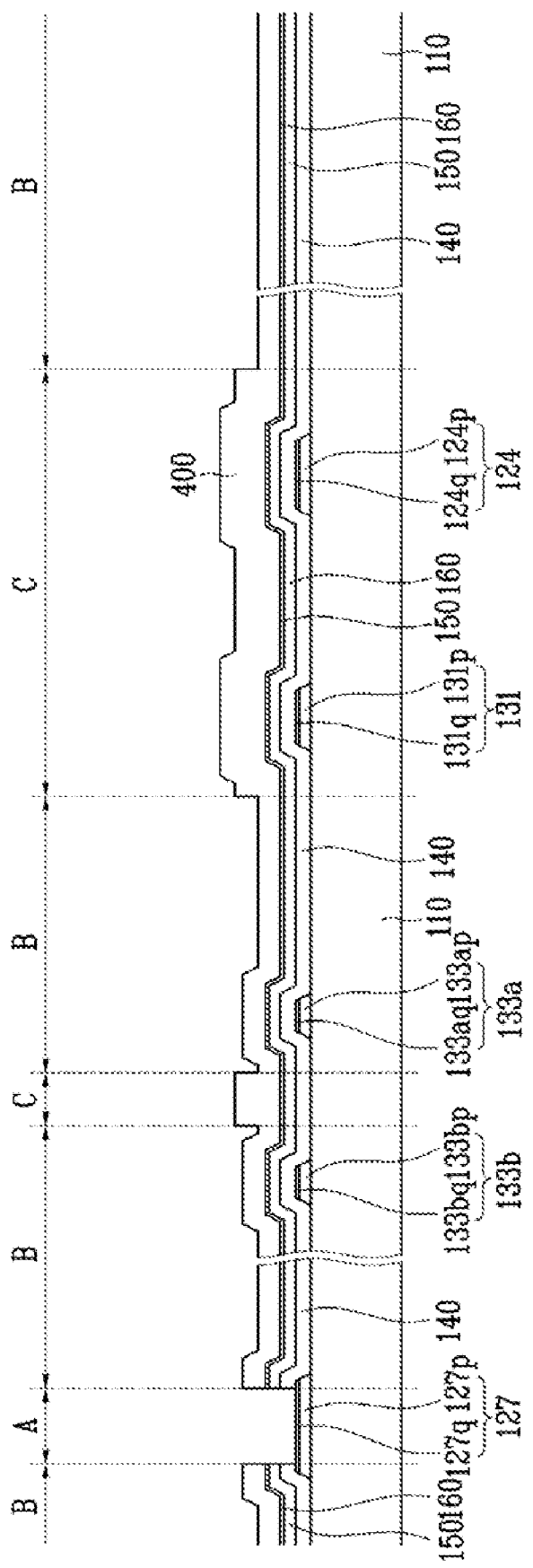

Next, the extrinsic a-Si layer 160, the intrinsic a-Si layer 150, and the gate insulating layer 140 are etched using the photoresist film 400 as a mask to form contact holes 142a-142c exposing portions of the gate-layer signal transmission lines 125, 127, and 128 as shown in FIG. 34C.

Figure 34D:
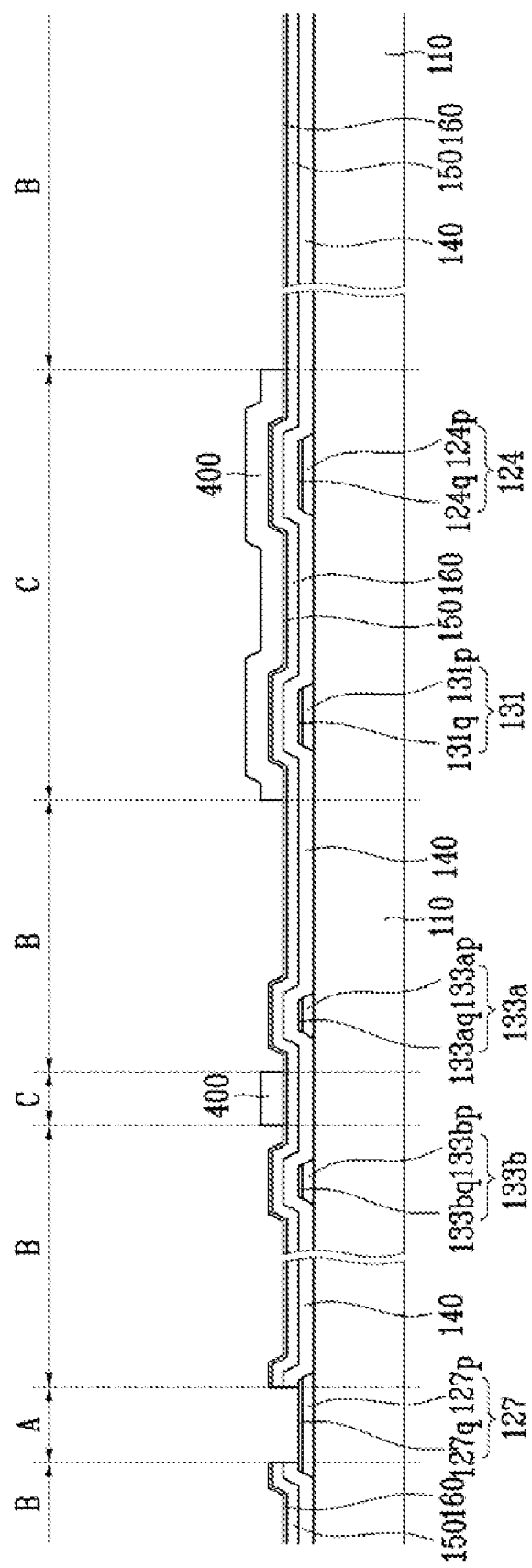

Referring to FIG. 34D, ashing is performed on the photoresist film 400 such that the photoresist film 400 disposed in the translucent areas B is all eliminated and the thickness of the photoresist film 400 disposed in light blocking opaque areas C becomes thin.

Figure 34E:
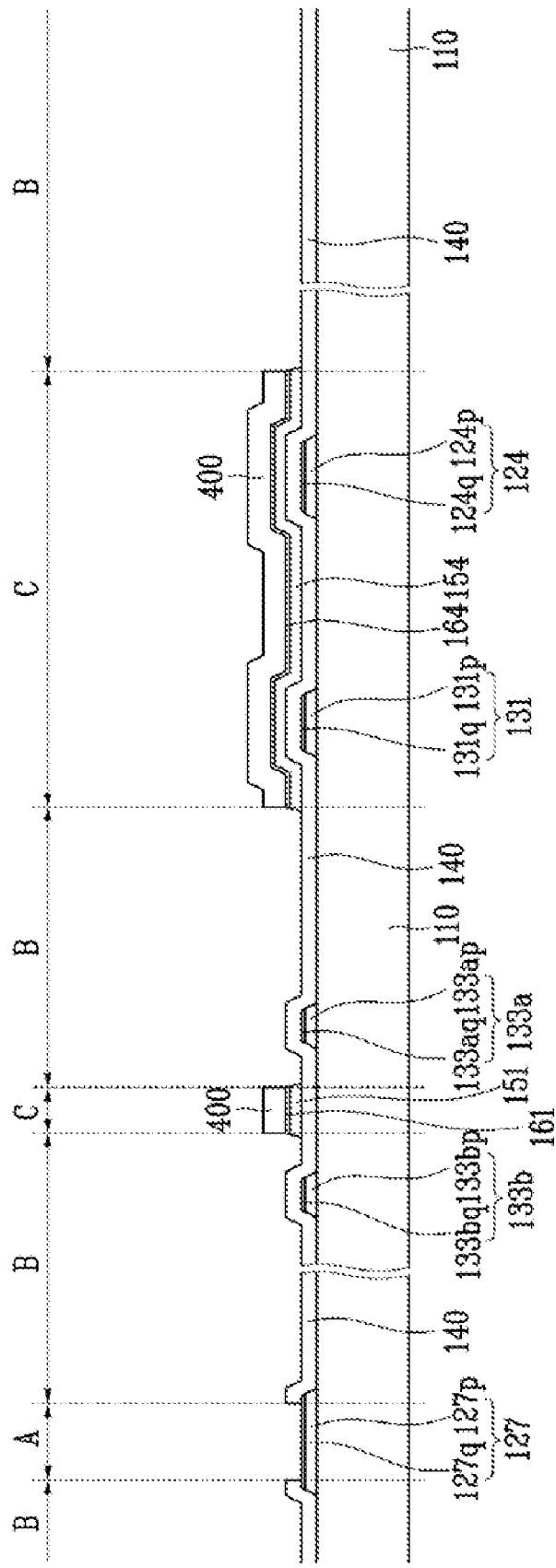

Next, the extrinsic a-Si layer 160 and the intrinsic a-Si layer 150 are etched using the remaining photoresist film 400 located in the light blocking opaque areas C as a mask to form the extrinsic semiconductor stripes 161 including projections 164 and the intrinsic semiconductor stripes 151 including projections 154 as shown in FIG. 34E.

Figure 34F:
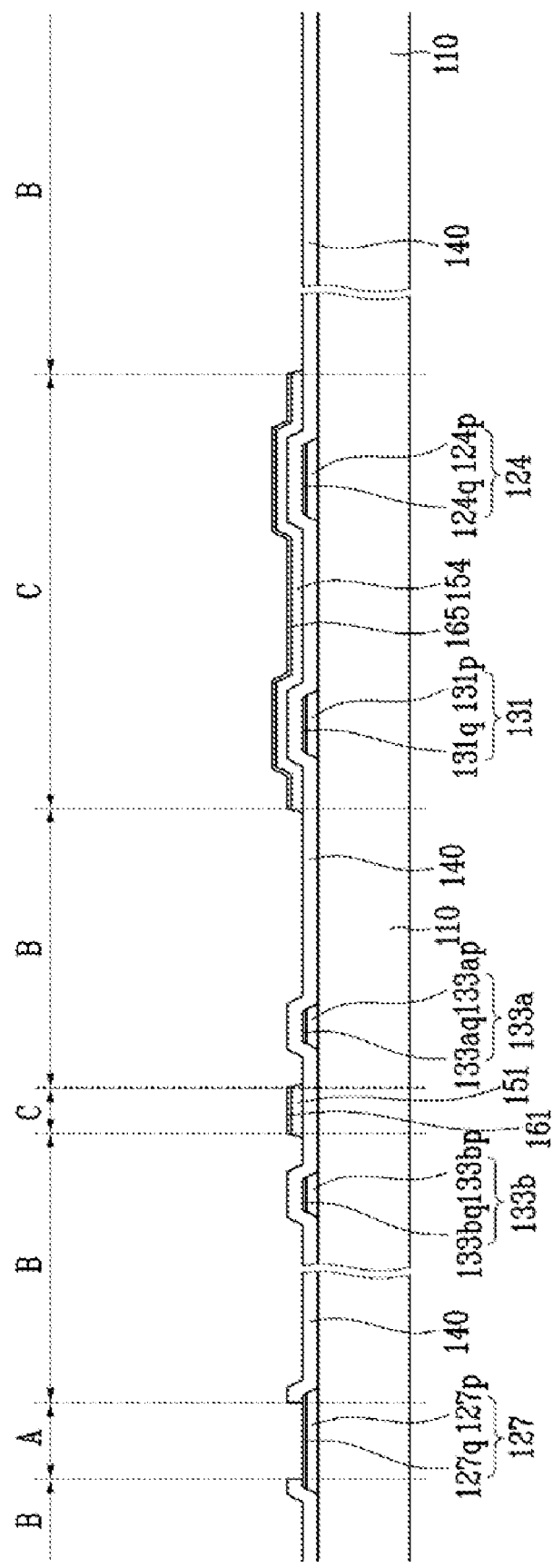

Finally, the remaining photoresist film 400 located in the light blocking opaque areas C is eliminated by, for example, ashing, as shown in FIG. 34F.

Figure 35:
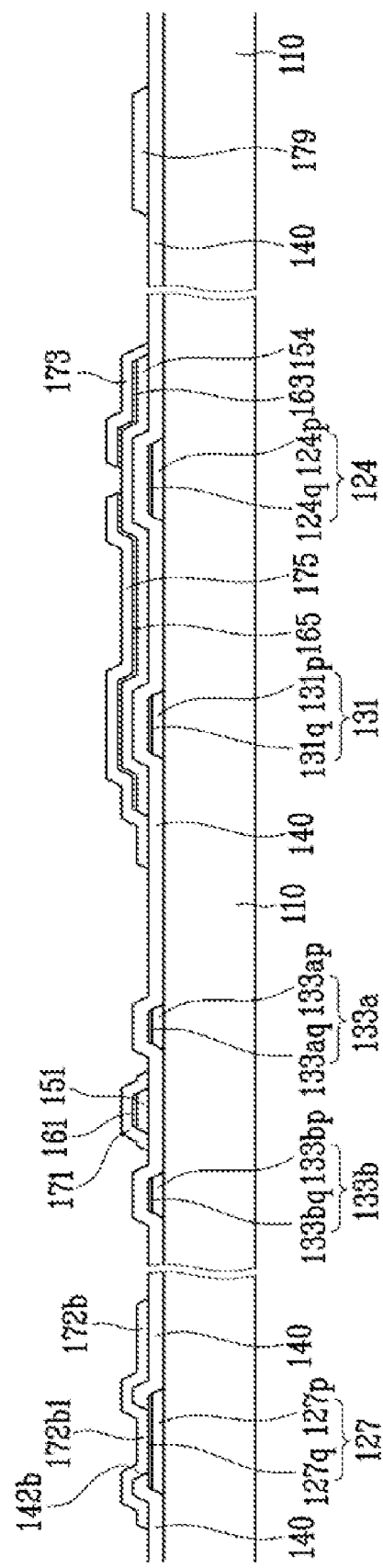

Referring to FIG. 35, a plurality of data lines 171 including a plurality of source electrodes 173 and data pads 179, a plurality of drain electrodes 175, and a plurality of data-layer signal transmission lines 172a, 172b, and 172c of the gate driver 600 are formed. Here, projections 172a1, 172b1, and 172c1 of the data lines 171 are connected to the exposed gate-layer signal transmission lines 125, 127, and 128 through the contact holes 142a-142c.

Thereafter, exposed portions of the extrinsic semiconductor stripes 164, which are not covered with the data lines 171 and the drain electrodes 175, are removed to complete a plurality of ohmic contact stripes 161 including projections 163 and a plurality of ohmic contact islands 165 and to expose portions of the intrinsic semiconductor stripes 151.

Figure 36:
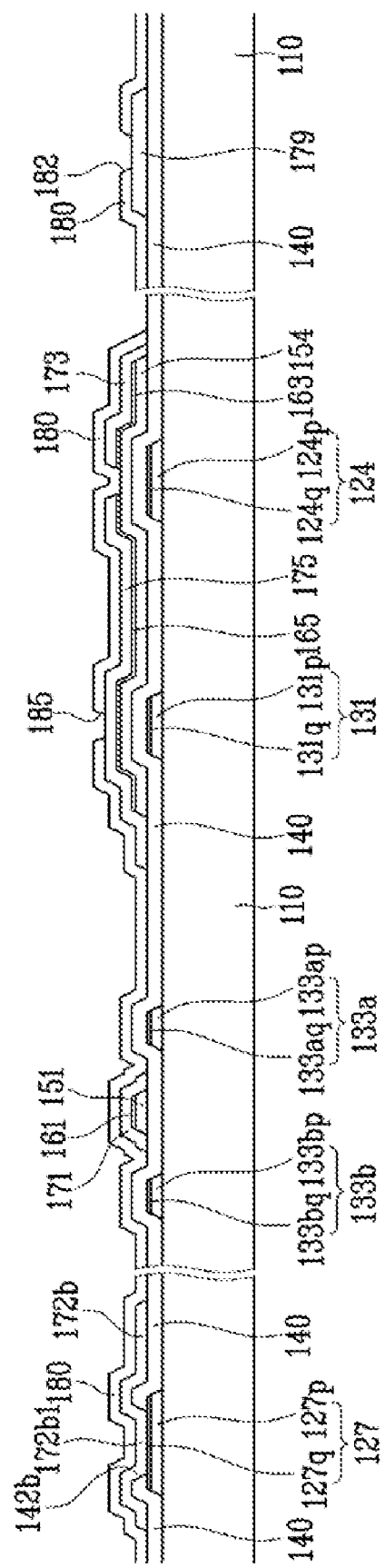

Next, a passivation layer 180 is deposited and patterned by photolithography (and etching) along with the gate insulating layer 140 to form a plurality of contact holes 182, 183a, 183b, and 185 exposing the data pads 179 of the data lines 171, portions of the storage electrode lines 131 near the fixed end portions of the first storage electrodes 133a, portions of the linear branches of the free end portions of the first storage electrodes 133a, and the drain electrodes 175, respectively, as shown in FIG. 36.

Finally, a plurality of pixel electrodes 191, a plurality of contact assistants 81 and 82, and a plurality of overpasses 83 are formed on the passivation layer 180 as shown in FIG. 29 and FIG. 31.

Now, a TFT array panel of the LCD shown in FIG. 28 according to another exemplary embodiment of the present invention will be described in detail with reference to FIG. 37 to FIG. 39.

Figure 37:
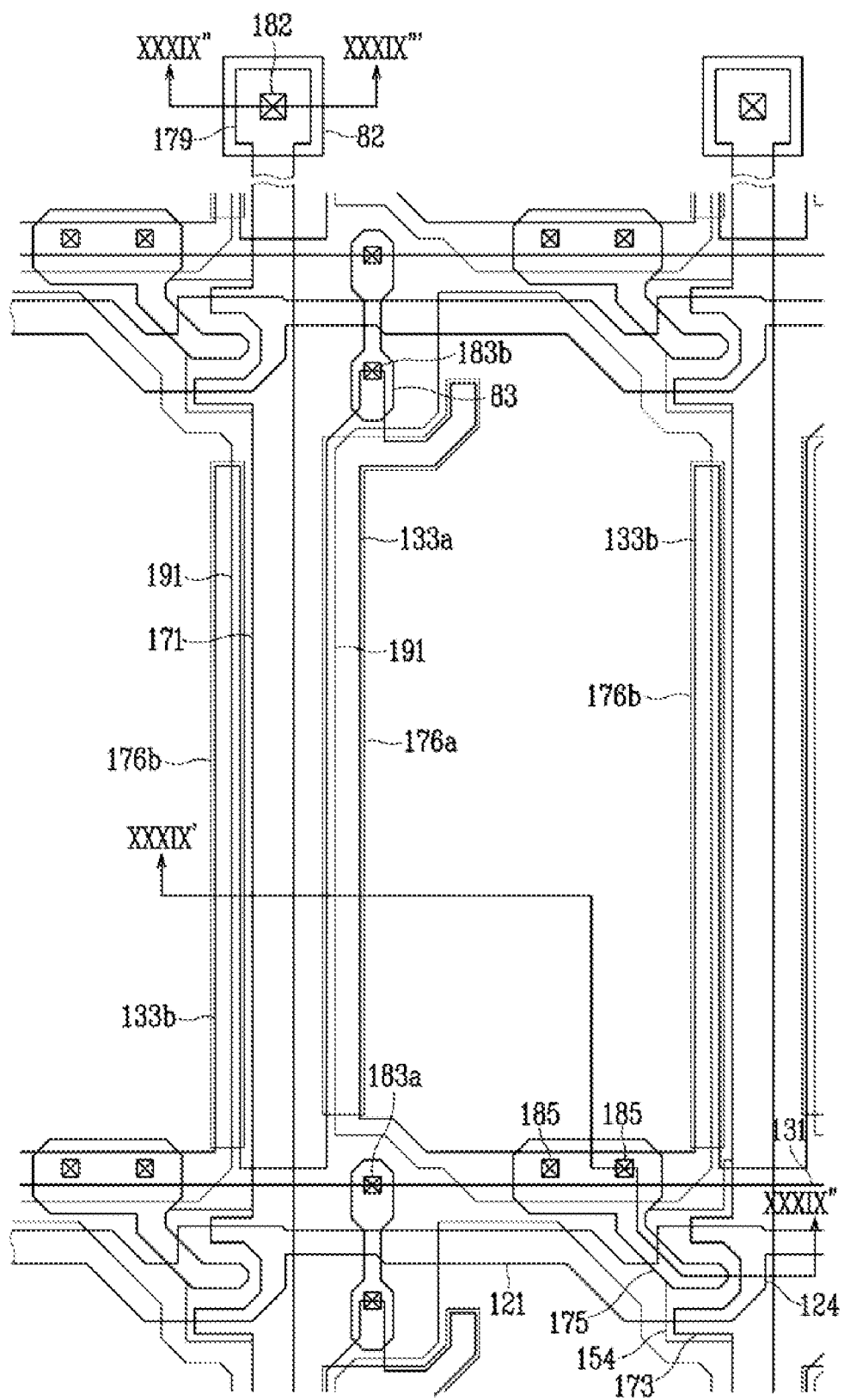
FIG. 37 is another layout view representing a portion of display area of the LCD shown in FIG. 28.
Figure 38:
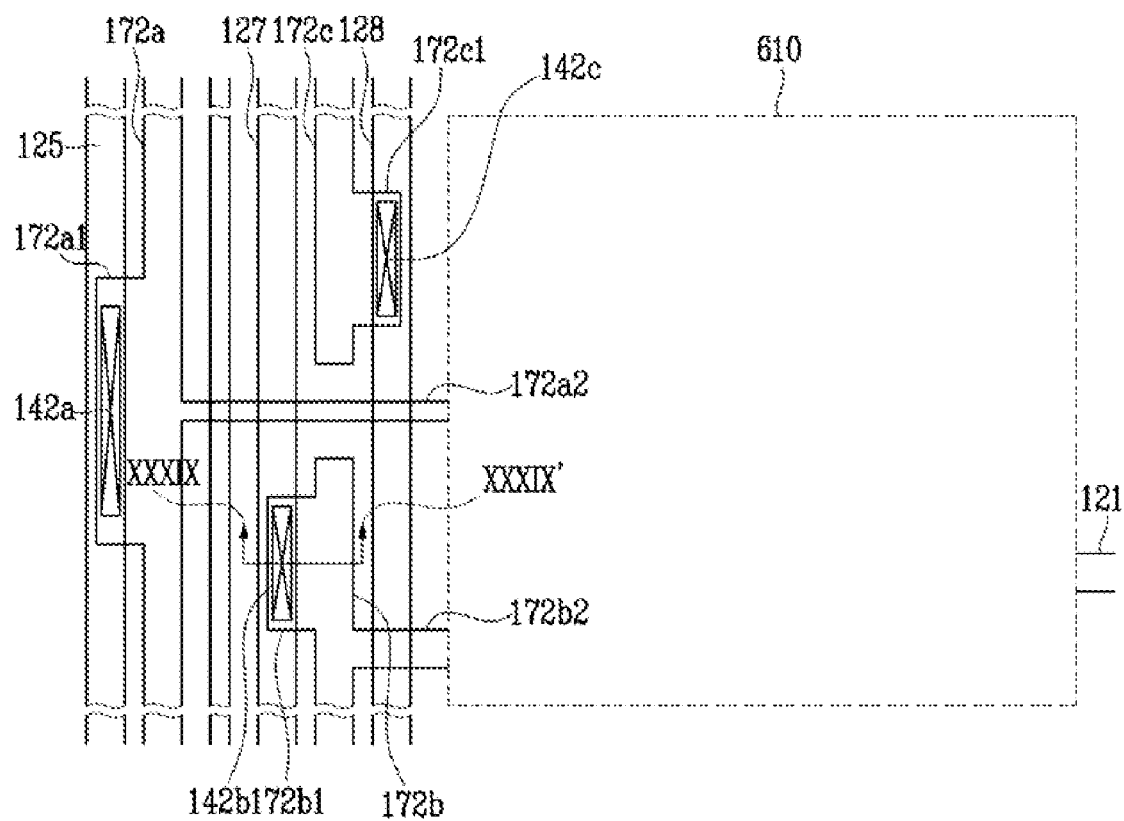
FIG. 38 is another layout view representing a portion of display area of the LCD shown in FIG. 28.
Figure 39:
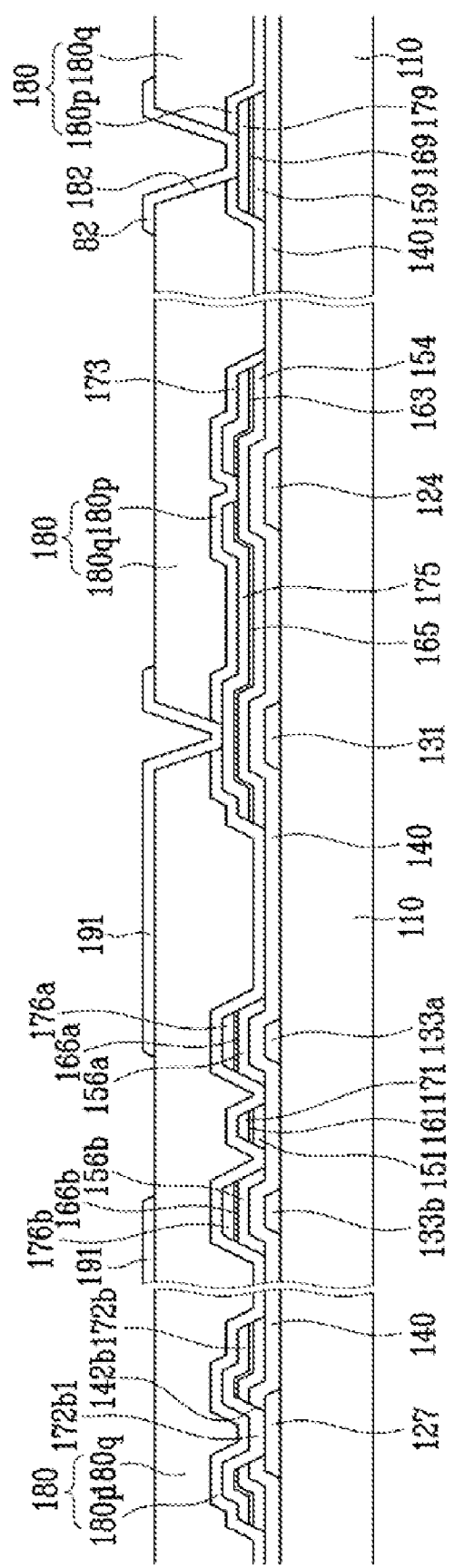
FIG. 39 is a sectional view of the TFT array panel shown in FIG. 37 and FIG. 38 taken along the line XXXIX-XXXIX'-XXXIX"-XXXIX'".

FIG. 37 is another layout view representing a portion of a display area of the LCD shown in FIG. 28, FIG. 38 is another layout view representing a portion of a display area of the LCD shown in FIG. 28, and FIG. 39 is a sectional view of the TFT array panel shown in FIG. 37 and FIG. 38 taken along the line XXXIX-XXXIX'-XXXIX"-XXXIX"'.

As shown in FIG. 37 to FIG. 39, a layered structure of a TFT array panel according to the present exemplary embodiment is substantially the same as that shown in FIG. 29 to FIG. 31.

The control region CA includes a plurality of circuit portions 610 generating gate signals and a plurality of signal transmission lines transmitting all kinds of signals.

A plurality of gate lines 121 and a plurality of storage electrode lines 131 in the display area DA, and a plurality of gate-layer signal transmission lines in the control region CA, are formed on an insulation substrate 110.

For example, the gate lines 121 and the storage electrode lines 131 have a single layered structure made of an Al-containing metal such as Al or an Al alloy such as AlNd for reducing signal delay or voltage drop.

A gate-insulating layer 140 having a plurality of contact holes 141 exposing portions of the gate-layer signal transmission lines 125, 127, and 128 is formed on the gate lines 121, the storage electrode lines 131, and the gate-layer signal transmission lines 125-128. A plurality of semiconductor stripes 151 and a plurality of ohmic contact stripes 161 including projections 163 and a plurality of ohmic contact islands 165 are formed thereon in the display area DA.

A plurality of data lines 171 and a plurality of drain electrodes 175 are formed in the display area DA, and a plurality of data-layer signal transmission lines 172a, 172b, and 172c are formed in the control region CA on the ohmic contacts 161 and 165 and the gate insulating layer 140.

Each data line 171 includes a plurality of source electrodes 173 and a data pad 179, and the data-layer signal transmission lines 172a-172c include a plurality of projections 172a1, 172b1, and 172c1 extending to the contact holes 142a-142c to be connected to the gate-layer signal transmission lines 125, 127, and 128 through the contact holes 142a-142c.

A passivation layer 180 is formed on the data lines 171, the drain electrodes 175, the data-layer signal transmission lines 172a-172c, and the exposed portions of the semiconductor stripes 151. The passivation layer 180 includes a plurality of contact holes 182 and 185 exposing the data pads 179 and the drain electrodes 175, respectively. The passivation layer 180 and the gate insulating layer 140 have a plurality of contact holes 183a and 183b exposing portions of the storage electrode lines 131 near the fixed end portions of the first storage electrodes 133a, portions of the linear branches of the free end portions of the first storage electrodes 133a, and the drain electrodes 175, respectively.

The passivation layer 180 has a double-layered structure including a tower inorganic layer 180p and an upper organic layer 180q. The upper organic layer 180q has a substantially flat surface. However, the passivation layer 180 may have a single-layered structure.

A plurality of pixel electrodes 191, a plurality of overpasses 83, and a plurality of contact assistants 82 are formed on the passivation layer 180.

However, unlike the TFT array panel shown in FIG. 29 to FIG. 31, the TFT array panel shown in FIG. 37 to FIG. 39 includes a plurality of reinforcement members 176a and 176b located on the storage electrodes 133a and 133b and made of the same layer as the data lines 171, a plurality of ohmic contact islands 166a and 166b and a plurality of semiconductor islands 156a and 156b disposed under the reinforcement members 176a and 176b and having substantially the same planar shapes as the reinforcement members 176a and 176b. The semiconductor stripes 151 also have substantially the same planar shapes as the data lines 171 and the drain electrodes 175 as well as the ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175.

Many characteristics of the TFT array panel shown in FIG. 29 to FIG. 31 can be applied to the TFT array panel shown in FIG. 37 to FIG. 39.

A manufacturing method of the TFT array panel according to the present exemplary embodiment is substantially similar to that of the TFT array panel shown in FIG. 21 to FIG. 27.

The gate-layer signal transmission lines 125-128 are formed in the same step as that of the gate lines 121, and the data-layer signal transmission lines 172a-172c are formed in the same step as that of the data lines 171. Also, the contact holes 142a-142c are formed as the contact holes 141 shown in FIG. 14 and FIG. 15.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A thin film transistor (TFT) array panel, comprising:
a substrate;
a first signal line formed on the substrate;
a gate insulating layer formed on the first signal line, the gate insulating layer having a first contact hole exposing a portion of the first signal line;
a first semiconductor formed on the gate insulating layer;
a second signal line formed on the first semiconductor and the gate insulating layer;
a drain electrode formed on the first semiconductor and separated from the second signal line;

a conductor formed on the gate insulating layer and connected to the first signal line through the first contact hole;

a passivation layer formed on the second signal line, the drain electrode, and the conductor, the passivation layer having a second contact hole exposing the drain electrode; and a pixel electrode formed on the passivation layer and connected to the drain electrode through the second contact hole.

2. The TFT array panel of claim 1, wherein the passivation layer further includes a third contact hole exposing a portion of the conductor, the TFT array panel further comprises contact assistants connected to the conductor through the third contact hole, and the first signal line includes a gate electrode located under the first semiconductor.

3. The TFT array panel of claim 1, further comprising:

a third signal line formed under the gate insulating layer and including a gate electrode located under the first semiconductor; and a gate driving circuit connected to the conductor and the third signal line.

4. The TFT array panel of claim 2, further comprising a second semiconductor formed between the exposed portion of the first signal line and the conductor, wherein, the second semiconductor has a fourth contact hole aligned with the first contact hole, the conductor is connected to the first signal line through the first contact hole and the fourth contact hole, and the second semiconductor has substantially the same planer shape as the conductor except the fourth contact hole.

5. The TFT array panel of claim 3, further comprising a second semiconductor formed between the exposed portion of the first signal line and the conductor, wherein, the second semiconductor has a fourth contact hole aligned with the first contact hole, the conductor is connected to the first signal line through the first contact hole and the fourth contact hole, and the second semiconductor has substantially the same planer shape as the conductor except the fourth contact hole.

6. The TFT array panel of claim 4, wherein the first semiconductor extends toward the second signal line and the drain electrode and has substantially the same planer shape as the underlying first semiconductor.

7. The TFT array panel of claim 5, wherein the first semiconductor extends toward the second signal line and the drain electrode and has substantially the same planer shape as the underlying first semiconductor.

8. The TFT array panel of claim 6, further comprising:

a storage electrode made of the same layer as the first signal line and overlapping the pixel electrode; and a third semiconductor formed on the storage electrode located on the gate insulating layer.

9. The TFT array panel of claim 7, further comprising:

a storage electrode made of the same layer as the first signal line and overlapping the pixel electrode; and a third semiconductor formed on the storage electrode located on the gate insulating layer.

10. The TFT array panel of claim 2, wherein the first signal line includes a first conductive layer made of a material selected from the group consisting of aluminum (Al) and an aluminum (Al) alloy.

11. The TFT array panel of claim 3, wherein the first signal line includes a first conductive layer made of a material selected from the group consisting of aluminum (Al) and an aluminum (Al) alloy.

12. The TFT array panel of claim 10, wherein the first signal line further includes a second conductive layer located under the first conductive layer, the second conductor layer is made of a material selected from the group consisting of chromium (Cr), molybdenum (Mo), a chromium (Cr) alloy, and a molybdenum (Mo) alloy.

13. The TFT array panel of claim 11, wherein the first signal line further includes a second conductive layer located under the first conductive layer, the second conductive layer is made of a material selected from the group consisting of chromium (Cr), molybdenum (Mo), a chromium (Cr) alloy, and a molybdenum (Mo) alloy.

14. The TFT array panel of claim 12, wherein the first conductive layer is eliminated at the exposed portion of the first signal line through the first contact hole.

15. The TFT array panel of claim 13, wherein the first conductive layer is eliminated at the exposed portion of the first signal line through the first contact hole.

16. The TFT array panel of claim 14, wherein the first contact hole exposes the boundary of the first signal line.

17. The TFT array panel of claim 15, wherein the first contact hole exposes the boundary of the first signal line.

* * * * *